United States Patent [19]

Gotou et al.

[11] Patent Number: 5,748,530
[45] Date of Patent: May 5, 1998

[54] NON-VOLTILE MEMORY DEVICE, NON-VOLATILE MEMORY CELL AND METHOD OF ADJUSTING THE THRESHOLD VALUE OF THE NON-VOLATILE MEMORY CELL AND EACH OF PLURAL TRANSISTORS

[75] Inventors: Hiroshi Gotou; Toshifumi Asakawa, both of Tokyo, Japan

[73] Assignee: NKK Corporation, Tokyo, Japan

[21] Appl. No.: 381,944

[22] PCT Filed: May 11, 1994

[86] PCT No.: PCT/JP94/00759

§ 371 Date: Dec. 20, 1994

§ 102(e) Date: Dec. 20, 1994

[87] PCT Pub. No.: WO94/27295

PCT Pub. Date: Nov. 24, 1994

[30] Foreign Application Priority Data

| | | | |
|---|---|---|---|
| May 11, 1993 | [JP] | Japan | 5-109573 |
| Aug. 25, 1993 | [JP] | Japan | 5-210295 |
| Nov. 29, 1993 | [JP] | Japan | 5-298103 |
| Dec. 24, 1993 | [JP] | Japan | 5-327213 |

[51] Int. Cl.$^6$ ............................ G11C 11/34
[52] U.S. Cl. ............ 365/185.18; 365/185.19; 365/185.29
[58] Field of Search ............ 365/185, 218, 365/189.01, 203, 185.18, 185.19, 185.29

[56] References Cited

U.S. PATENT DOCUMENTS

| | | | |
|---|---|---|---|
| 4,282,446 | 8/1981 | McElroy | 365/185 |
| 4,432,072 | 2/1984 | Chao et al. | 365/149 |
| 4,574,273 | 3/1986 | Atsumi et al. | 307/443 |
| 4,649,520 | 3/1987 | Eitan | 365/184 |
| 4,725,983 | 2/1988 | Terada | 365/185 |
| 4,797,856 | 1/1989 | Lee et al. | 365/185 |
| 4,811,292 | 3/1989 | Watanabe | 365/185 |
| 4,931,997 | 6/1990 | Mitsuishi et al. | 365/218 |
| 4,953,123 | 8/1990 | Takeuchi et al. | 365/52 |
| 4,958,317 | 9/1990 | Terada et al. | 365/104 |
| 5,068,827 | 11/1991 | Yamada et al. | 365/189.01 |

(List continued on next page.)

FOREIGN PATENT DOCUMENTS

| | | |
|---|---|---|
| 0 103 681 A3 | 5/1982 | European Pat. Off. . |
| 53-046621 | 12/1978 | Japan . |
| 62-266793 | 11/1987 | Japan . |
| 2-166764 | 6/1990 | Japan . |
| 4-105368 | 4/1992 | Japan . |
| 5-189988 | 7/1993 | Japan . |

OTHER PUBLICATIONS

Japanese Patent Publication No. 4–155694 (A), in Patents Abstracts of Japan, vol. 16, No. 445 (P–1422), May 28, 1992.

International Electron Devices Meeting, Dec. 8, 1990, Washington, DC, pp. 602–606.

Patent Abstracts of Japan, vol. 16, No. 445 (P–1422), Sep. 17, 1992.

M. Lanzoni et al., "A Novel Approach to Controlled Programming of Tunnel–Based Floating–Gate MOSFET's," *IEEE Journal of Solid–State Circuits*, vol. 29, No. 2, Feb. 1994, pp. 147–150.

H. Gotou, "New Operation Mode for Stacked–Gate Flash Memory Cell," *IEEE Electron Device Letters*, vol. 16, No. 3, Mar. 1995, cover page, pp. 121–123.

*Primary Examiner*—Son T. Dinh
*Attorney, Agent, or Firm*—Burns, Doane, Swecker & Mathis, LLP

[57] ABSTRACT

In a non-volatile semiconductor memory device composed of flating gate type memory cells, after the drain or source is charged, it is placed in an electrically floating state and a signal with alternately changing positive and negative potentials is applied to the control gates of the memory cells so as to reduce the charges stored in the floating gates, thereby converging the threshold volatages of the memory cells into a predetermined voltage. Thus, a write/erase operation in the memory device can be carriied out surely in a short time.

61 Claims, 45 Drawing Sheets

U.S. PATENT DOCUMENTS

| | | | |
|---|---|---|---|
| 5,075,888 | 12/1991 | Yamauchi et al. | 365/228 |
| 5,126,808 | 6/1992 | Montalvo et al. | 357/23.5 |
| 5,126,969 | 6/1992 | Kawana | 365/185 |
| 5,132,935 | 7/1992 | Ashmore, Jr. | 365/185 |
| 5,179,536 | 1/1993 | Kasa et al. | 365/200 |
| 5,278,794 | 1/1994 | Tanaka et al. | 365/200 |
| 5,282,161 | 1/1994 | Villa | 365/185 |
| 5,283,758 | 2/1994 | Nakayama et al. | 365/185 |
| 5,307,312 | 4/1994 | Maurelli et al. | 365/182 |
| 5,327,385 | 7/1994 | Oyama | 365/185 X |
| 5,402,373 | 3/1995 | Aritome et al. | 365/185 |
| 5,406,521 | 4/1995 | Hara | 365/218 |
| 5,491,656 | 2/1996 | Sawada | 365/185.29 |

WHERE CELL THRESHOLD VOLTAGE IS HIGH

WHERE CELL THRESHOLD VOLTAGE IS LOW

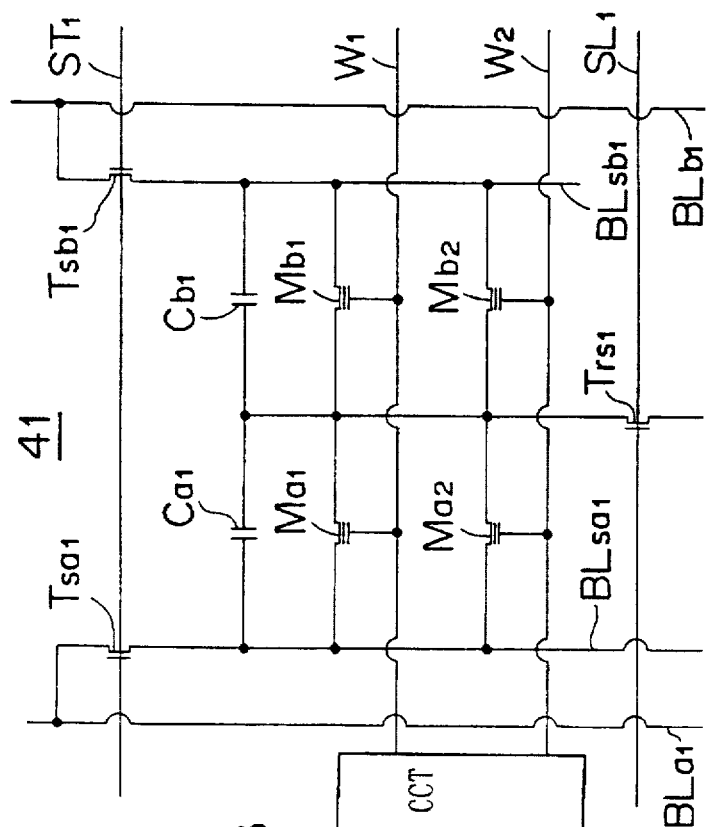
FIG. 17A
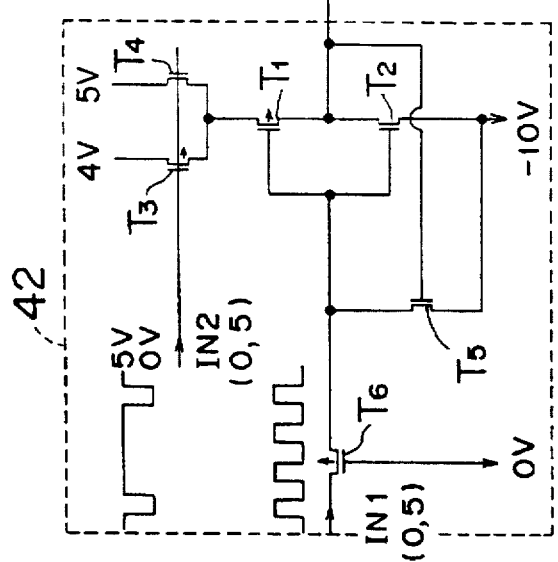
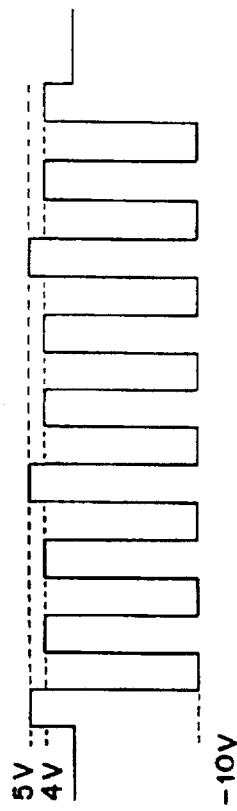
FIG. 17B

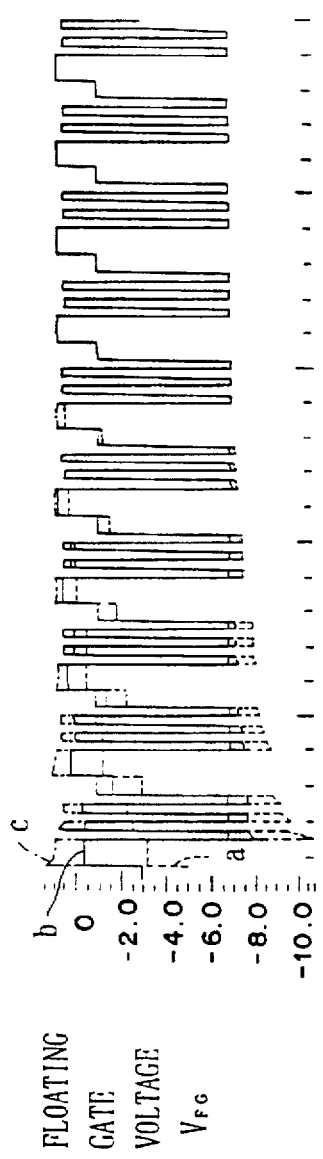
F I G. 19A
F I G. 19B
F I G. 19C

POTENTIAL FOR EXTRACTING CHARGES FROM FLOATING GATE OF EACH CELL

|  | CELL 1 | CELL 2 | CELL 3 |
|---|---|---|---|
| SELECT LINE 1 | H | H | H |
| WORD LINE 1 | PULSE | H | H |
| WORD LINE 2 | H | PULSE | H |
| WORD LINE 3 | H | H | PULSE |
| SELECT LINE 2 | H | H | H |

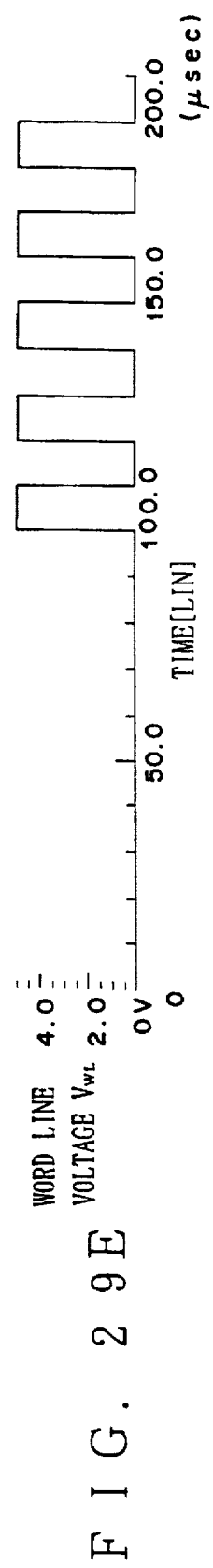
FIG. 29A  BIT LINE VOLTAGE $V_{BL}$
FIG. 29B  VOLTAGE $V_C$ AT POINT C
FIG. 29C  VOLTAGE $V_B$ AT POINT B
FIG. 29D  VOLTAGE $V_A$ AT POINT A
FIG. 29E  WORD LINE VOLTAGE $V_{WL}$

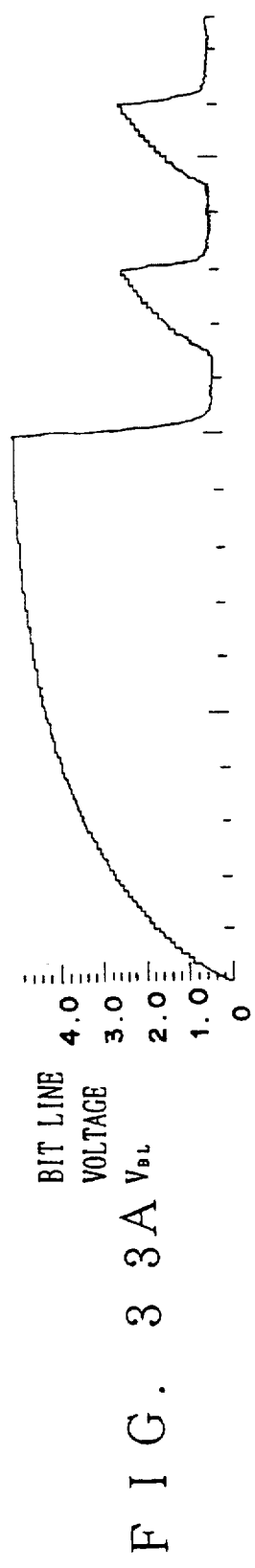
FIG. 33A BIT LINE VOLTAGE $V_{BL}$
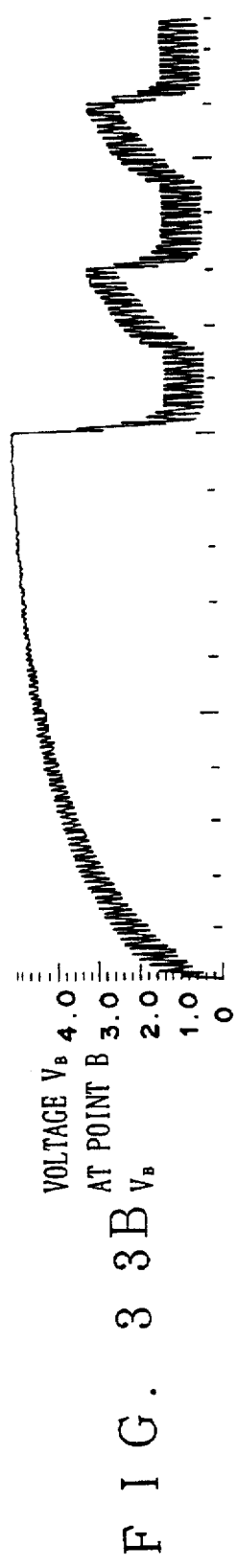
FIG. 33B VOLTAGE $V_B$ AT POINT B $V_B$
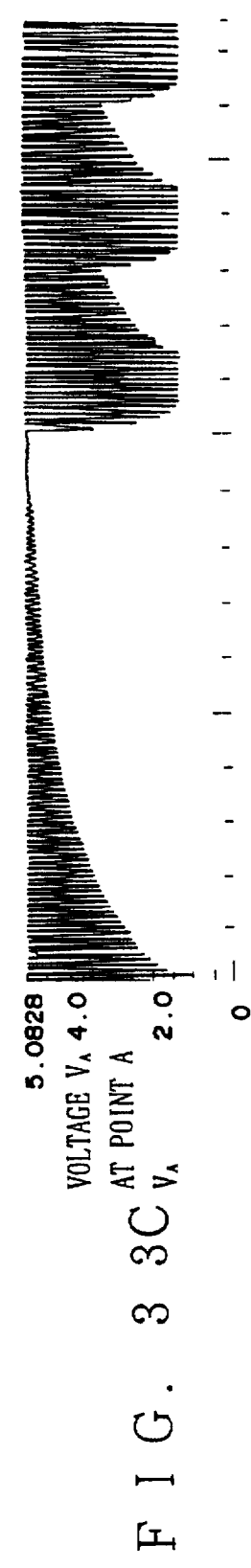
FIG. 33C VOLTAGE $V_A$ AT POINT A $V_A$
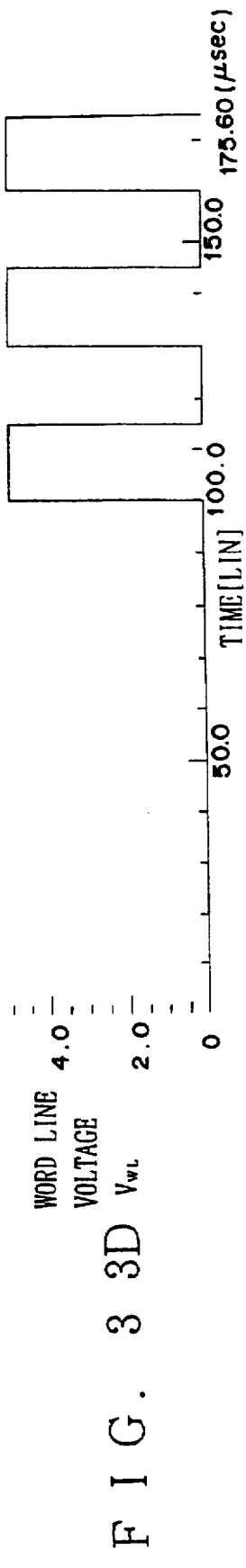
FIG. 33D WORD LINE VOLTAGE $V_{WL}$

PRIOR ART PRIOR ART PRIOR ART PRIOR ART

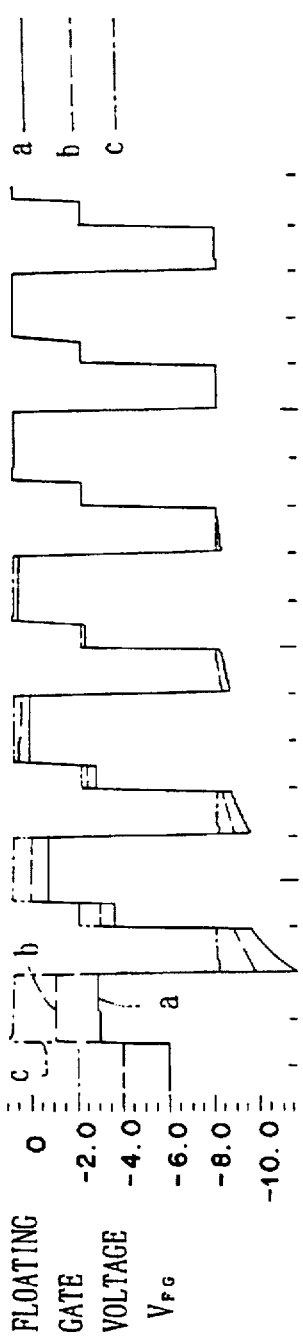
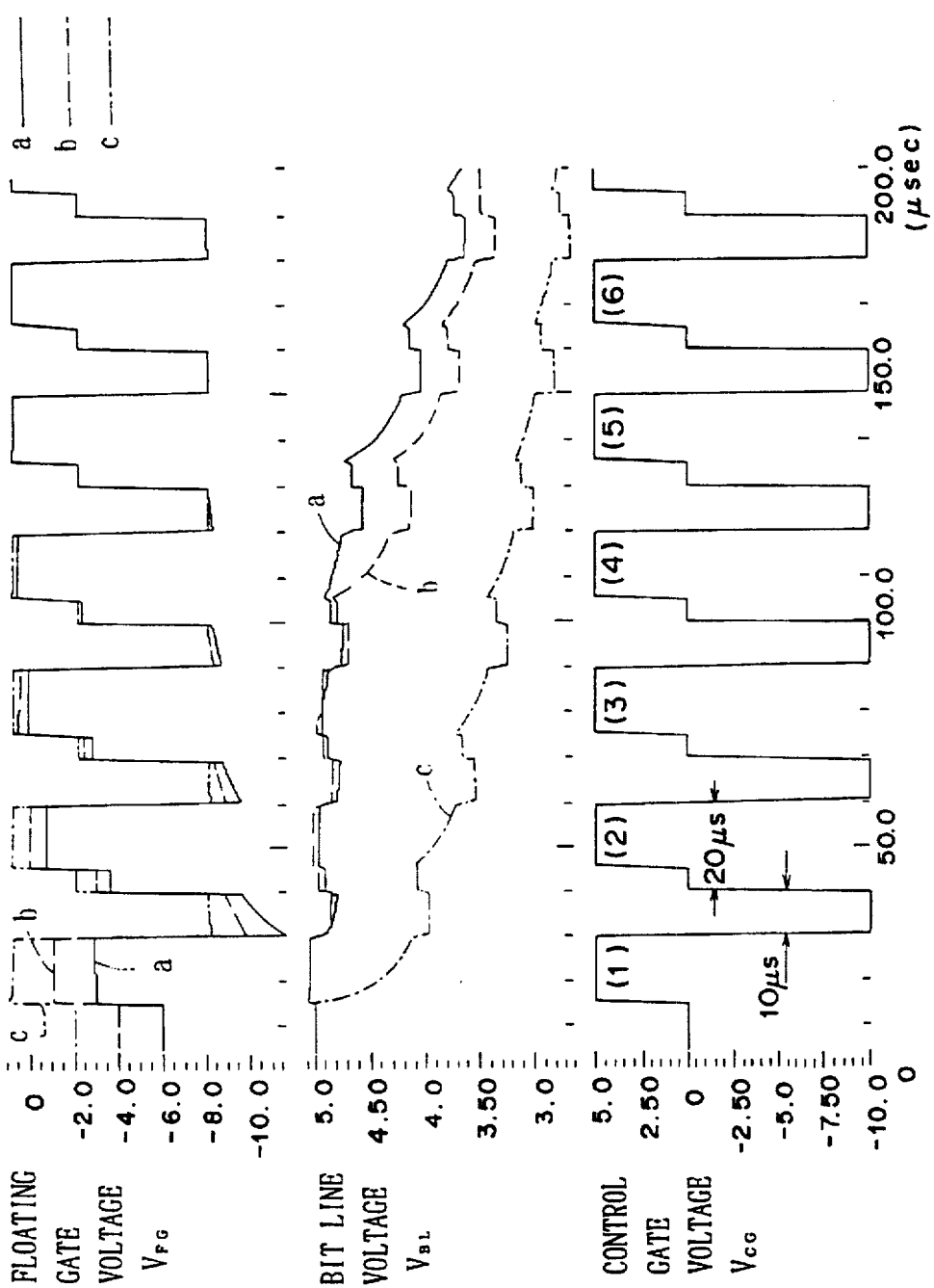
F I G. 4 2A  FLOATING GATE VOLTAGE $V_{FG}$
F I G. 4 2B  BIT LINE VOLTAGE $V_{BL}$
F I G. 4 2C  CONTROL GATE VOLTAGE $V_{CG}$

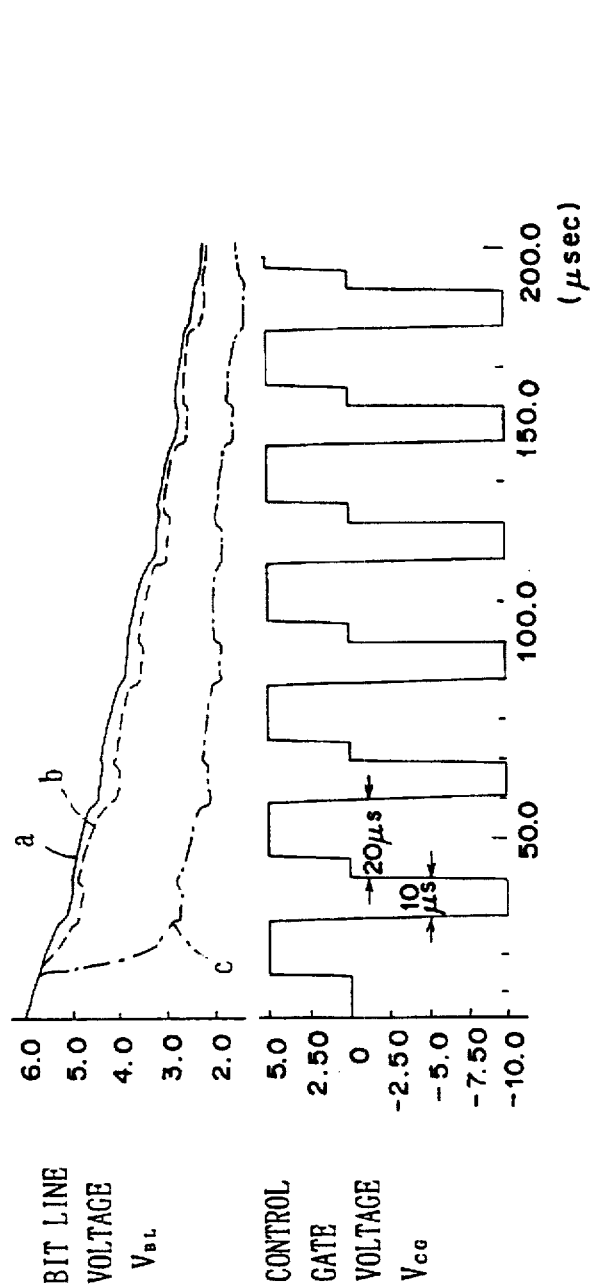
FIG. 43A FLOATING GATE VOLTAGE $V_{FG}$
FIG. 43B BIT LINE VOLTAGE $V_{BL}$
FIG. 43C CONTROL GATE VOLTAGE $V_{CG}$

NON-VOLTILE MEMORY DEVICE, NON-VOLATILE MEMORY CELL AND METHOD OF ADJUSTING THE THRESHOLD VALUE OF THE NON-VOLATILE MEMORY CELL AND EACH OF PLURAL TRANSISTORS

BACKGROUND OF THE INVENTION

1. Field of the Invention

The present invention relates to a non-volatile semiconductor memory device which can electrically rewrite information or data, and more particularly to a non-volatile semiconductor memory device which can simply and surely perform write and erase operations.

2. Description of the Prior Art

In conventional non-volatile semiconductor memory devices, the operation of rewriting stored data can be classified into (1) a system of write by hot-electrons and erase by tunnelling currents and (2) a system of write and erase by tunnelling currents.

The former rewrite system is directed to an electrical erasing type flash EEPROM. The write operation is made as follows. A write voltage Vpp is applied to both control gate and drain of a memory cell to inject hot electrons into the floating gate. Therefore, the threshold voltage Vth for in the memory cell depends on the channel length, the thickness of a tunnelling insulating film and a source-drain voltage. This results in a wide distribution of the threshold voltages Vth after write in memory cells as shown in FIGS. 38A and 38B.

The erase operation is made as follows. With the control gate connected to ground, an erase voltage Vpp is applied to a source (or drain) electrode of the memory cell to extract the electrons trapped in the floating gate into the source (or drain) electrode. As in the write operation, in the erase operation also, the threshold voltage depends on the voltage on a word line, the drain voltage and the tunnelling insulating film thickness. This results in a wide distribution of the threshold voltages Vth after erase in memory cells as shown in FIGS. 38A and 38B.

The latter rewrite system is directed to an NAND type EEPROM. In this non-volatile memory, the write and erase operations are performed using the tunnelling current from the entire floating gate. As in the above erase operation, the threshold value Vth depends on the voltage on a word line, the drain voltage and the tunnelling insulating film thickness. This results in a wide distribution of the threshold voltages Vth after write and erase in memory cells as shown in FIG. 38C.

Incidentally, FIG. 38D shows the distribution of threshold voltages Vth in an ultra-violet erasing type UVEPROM. The write operation is performed in such a manner that a write voltage Vpp is applied to both control gate and drain electrode of a memory cell to inject hot-electrons into the floating gate. This results in a wide distribution of the threshold voltages Vth after write in the memory cells as in the flash EEPROM. On the other hand, the erase operation is performed in such a manner that the electrons trapped in the floating gate are extracted by irradiation of ultra-violet rays. This results in a sharp distribution of the threshold voltages Vth in the neighborhood of 0.8 V after erase in the memory cells. In FIGS. 38A to 38D showing the distributions of threshold voltages, it should be noted that the ordinate denotes a threshold voltage Vth in a memory cell and the abscissa denotes its frequency thereof, and noted that the state with charges stored in a floating gate is referred to as "0" data whereas the state with no charges stored in the floating gate is referred as to "1" data.

As described above, the conventional non-volatile semiconductor memories are characterized by a relatively wide distribution of threshold voltages Vth. Therefore, the write and erase operations cannot be executed with the same threshold voltage Vth set. The threshold voltages fluctuate in the same memory chip also. So, generally, the write time is changed for each bit so that the threshold volatges are placed in a predetermined range. This takes a relatively long write time.

Further, the conventional non-volatile semiconductor memories are provided with a logic circuit for detecting the write state or erasure state of a memory cell and modifying it. The logic circuit occupies a larger area in a semiconductor memory device. In many cases, the logic circuit detects the write or erase state from the drain current flowing through a memory cell.

For example, JP-A(Laid-open)-64-46297 filed by Intel Corporation (Inventor: Winston K. M. Lee) proposes logic circuits as shown in FIGS. 39A and 39B. The erasing for a non-volatile memory cell as shown can be executed by a specific circuit which controls the final potential of the floating gate.

As shown in FIG. 39A, a non-volatile memory cell 1 is provided with a control gate 2 and a floating gate 3. An erasing voltage source 7 is provided to supply an erasing voltage to the source S of the memory cell. A feedback amplifying circuit 4 is connected between the drain D and control gate 2. In operation, when a drain voltage increases, the potential at the control gate 2 also increases. Then, electrons are discharged from the floating gate. As a result, a further increased feedback voltage is supplied to the control gate 2 to cancel the erase voltage. Thus, the final potential of the floating gate can be controlled by controlling the feedback amount of the feedback amplifying circuit 4.

As shown in FIG. 39A, the non-volatile memory cell 1 is provided with the control gate 2 and the floating gate 3. A comparator 5 connected with a reference voltage source 6 is connected between the drain and the control gate 2 of the non-volatile memory cell 1. Its output terminal is connected to the erasing voltage source 7. In operation, when the drain voltage increases to exceed a reference voltage VR, the output from the comparator 5 is inverted to stop the operation of the erasing voltage source 7. This prevents the non-volatile memory cell 1 from being excessively erased to generate a negative threshold value. As described above, the conventional non-volatile memories, which have predetermined distributions of threshold voltages in an initial state, require a circuit for reducing the fluctuation of the threshold voltages in write to realize the stabilized operation, and a feedback or logic circuit for modifying the erasing state to prevent a memory cell from being excessively erased to generate the negative threshold value, thus reducing the fluctuation of threshold voltages in the initial state of the memory cell. Thus, the conventional non-volatile memories have a more complicated circuit configuration, and are excessively bulky because of the presence of more circuits other than the memory cells.

Further, in the conventional non-volatile memory device, when the threshold voltages in memory cells fluctuates in an initial state, the write time is changed so that the threshold voltages are in a predetermined range. The non-volatile memory device has a defect that it requires a relatively long write time.

Generally, the write/erase operation for a flash EEPROM is executed in such a manner that charges are once previously stored in the floating gate to write "0 data and the stored charges are erased. The flash EEPROM, therefore, has a defect that the erasing operation is complicate.

For this reason, in the flash EEPROM, the erasing operation is performed in such a manner that charges are once stored in the floating gate and the stored charges are extracted. Further, in order to save the write time, data are once stored in an RAM and thereafter written in a non-volatile memory cell.

This requires a large scale peripheral circuit. In order to obviate such a defect, it has been proposed to build a DRAM (dynamic RAM) into the peripheral region of the non-volatile memory device while preserving the write/erase function, in which data are written in the RAM and thereafter successively the data are written in non-volatile memory cells.

Where floating charges stored in a subsidiary bit line have a large leak (leakage current), the potential abruptly lowers, thereby giving insufficient precharging of the sub-bit line. This is an obstacle in reading the stored data.

Further, where data are to be erased by storing charges in the floating gate of a non-volatile memory cell, if the charges stored on the pre-charged sub-bit line are discharged due to the leakage current, the drain voltage (charging voltage) of the non-volatile memory cell lowers. This may make it impossible to perform the erasing operation. If the drain voltage, which is desired to be constant, varies greatly, the write/erasing operation cannot be efficiently carried out.

SUMMARY OF THE INVENTION

The first object of the present invention is to provide a non-volatile semiconductor memory device which can easily perform an erasing operation.

The second object of the present invention is to provide a non-volatile semiconductor memory device which can surely perform a write/erase operation for a floating gate type memory cell while holding the charges stored on a bit line.

The third object of the present invention is to provide a non-volatile semiconductor memory device which can stably perform a write/erase operation for a short time.

The fourth object of the present invention is to provide a non-volatile semiconductor memory device which can surely perform a write/erase operation and also reduce power consumption.

In accordance with the first aspect of the present invention, there is provided a non-volatile semiconductor memory device comprising: a plurality of word lines, a plurality of bit lines and a plurality of source lines intersecting said word lines; a plurality of memory cells, each composed of a source, a drain, a floating gate, and a control gate, provided at the intersections between said word lines and said bit lines and source lines, each of the control gates, drains and sources of said memory cells being connected to each of said word lines, each of said bit lines and each of said source lines, respectively; means for charging either one of said source and drain of a selected memory cell and placing it in a floating state after a predetermined time, and means for applying a signal varying between a positive potential and a negative potential to the control gate of said selected memory cell whereby its threshold voltage is converged into a predetermined voltage.

Now referring to FIGS. 1A and 1B, an explanation will be given of the non-volatile semiconductor memory device according to the first aspect of the non-volatile memory device.

In FIG. 1A which is a view for explaining the principle of the present invention, a non-volatile memory cell 1 has source/drain diffused layers in a semiconductor substrate and first and second insulating films (tunnelling oxide layers) formed their main surfaces. The memory cell 1 has also a first electrode (floating gate) encircled by the first and second insulating films and a second electrode (control gate) formed on the first insulating film. The memory cell 1 is connected to a switch MOS transistor 8 and the drain electrode thereof is connected to a capacitor 9. The capacitor 9 has the total Co of the parasitic capacitance of the bit line connected to plural memory cells and the portions electrically connected to the bit line connected to the bit lines. Examples of the portions connected to the bit lines are a selective switch element 8, and a memory cell. Other transistors or wirings may be included depending on the circuit structure. Although the selective switching element 8 and memory cell has at least one transistor, the parasitic capracitance of the impurity diffused layer on the side where the transistor is connected to the bit line mainly or substantially contributes to the parasitic capacitance C0. Longer bit lines or larger number of non-volatile memory cells increase the parasitic capacitance C0. Where a larger number of non-voltile memory cells connected to the bit line, the bit line generally becomes long, thus increasing the parasitic capacitance C0. If the parasitic capacitance C0 is not so large, another capacitor element may be supplementarily connected to the bit line so that an insufficient amount of parasitic capacitance can be supplemented.

Now it is assumed that charges are injected into the floating gate 2 so that data is written in the cell, and the floating gate 2 is sufficiently charged to a negative potential so that the threshold value of the memory cell is sufficiently high.

First, as shown in FIG. 1B, the drain electrode of the memory cell 1 is charged to a positive potential (5 V) and thereafter placed in a floating state.

Subsequently, a positive pulse is applied to the control gate 2 so that the potential of the control gate 2 is positive (3 V) for a short time and thereafter a negative pulse is applied to the control gate 2 so that the potential of the control gate is negative (−10 V) for a short time. Thus, the potential at the floating gate 3 is slightly changed so as to lower the drain potential. Such an operation is repeated to decrease the charges stored in the floating gate 3, thus erasing the data stored in the memory cell.

As described above, in the non-volatile semiconductor memory device according to the first aspect of the present invention, the erase operation is performed as follows. A pulse wave (signal) with alternating positive and negative potentials is applied to the control gate so that the charges stored in the floating gate are discharged, and when the threshold value of the memory cell becomes sufficiently low, the charges in the drain are discharged into the source through the channel so as to lower the potential at the drain.

The potential at the drain lowers when the pulse wave is applied to the control gate. For this reason, even when a negative pulse is applied to the control gate, a tunnelling current does not flow between the floating gate and the drain so that the potential at the floating gate does not vary further. Thus, the potential at the floating gate can be controlled by the potential of the voltage applied to the control gate.

In accordance with the second aspect of the present invention, there is provided a non-volatile semiconductor memory device comprising a plurality of word lines, a plurality of bit lines, for instance, main bit lines and subsidiary bit lines intersecting said word lines, each of main bit lines being connected to each of said subsidiary bit lines through a select transistor, a plurality of memory cells, each composed of a source, a drain, a floating gate and a control gate, provided at the intersections between said word lines, and said subsidiary bit lines and source lines, each of the control gates, drains and sources of said memory cells being connected to each of said word lines, each of said subsidiary bit lines and each of said source lines, respectively, means for precharging one of the subsidiary bit lines and placing it in a floating state after a predetermined time, means for applying a signal composed of pulses each having a positive peak potential and a negative peak potential through said word lines to the control gate of said selected memory cell whereby its threshold voltage is converted into a predetermined voltage or range, and means for supplying a current for compensating for a leakage current from said subsidiary bit lines to said subsidiary bit lines.

In the non-volatile semiconductor memory device according to the second aspect of the present invention, a signal varying between positive and negative potentials is applied to the control gate of the memory cell to extact charges stored in the floating gate so that the floating gate volatge is converged into a predetermined voltage. Where the precharged charges leak greatly, a current for supplementing the leak is supplied to a subsidiary bit line so that the charging potential on the subsidiary bit line is prevented from being lowered abruptly. Thus, the write/erase operation is performed while the charging potential at the subsidiary is held.

In accordance with the third aspect of the present invention, there is provided a non-volatile semiconductor memory device according to the second aspect in which said signal includes pulses each varying between another positive peak potential lower than said positive peak potential and said negative peak potential, and superposed between said positive peak potentials, otherwise said signal includes pulses each varying between another negative peak potential higher than said negative peak potential and said negative peak potential, superposed between said positive peak potentials.

Referring to FIG. 2A, a brief explanation will be given of the operation of the non-volatile semiconductor device according to the third aspect of the present invention. In FIG. 2A, symbol Ts denotes a selection transistor and symbol M1 denotes a non-volatile memory transistor having a floating gate. The drain of the memory transistor M1 is connected to the source of the selection transistor Ts. To the junction point thereof a capacitor C0 and an equivalent resistor R0 corresponding to a leakage current are connected. A signal is applied to the control gates to extract charges so that different threshold voltages of the non-volatile memory cells are converged into a predetermined value.

Where there is a large leakage current, changes in the drain voltage can be decreased by means for supplementing the current corresponding to the leakage current to detect the threshold voltage easily. The capacitor C0 may be canceled if there is a large in-line capacitance.

With a voltage of 5 V applied to the drain of the selection transistor Ts, a voltage of 5 V is applied to the control gate to turn 'on' the selection transistor Ts so that the capacitor C0 is charged. Then, the selection transistor Ts is turned 'off' to place the memory transistor M1 in a floating state. To the control gate of the memory transistor M1 pulses as shown in FIGS. 2C and 2D are applied.

The signal shown in FIG. 2C includes pulses oscillating between positive and negative. The positive pulses A and B have different peak values (3 V and 2.5 V) and the negative pulse C has a fixed peak value (−10 V). The pulse signal shown in FIG. 2D also includes pulses oscillating between positive and negative potentials. As seen, the negative pulses having peak values of −10 V and −5 V are alternately repeated between the positive pulses A each having a fixed peak value.

In this way, the memory transistor M1 can be set for a predetermined voltage by the positive pulses A and power consumption is reduced by lowering the peak values of the pulses B between the positive pulses A.

In accordance with the fourth aspect of the present invention, there is provided a non-volatile semiconductor memory device comprising a plurality of word lines, a plurality of subsidiary bit lines intersecting said word lines, each of main bit lines being connected to each of said subsidiary bit lines through a select transistor, a plurality of memory cells, each composed of a source, a drain, a floating gate and a control gate, provided at the intersections between said word lines, and said subsidiary bit lines and source lines, each of the control gates, drains and sources of said memory cells being connected to each of said word lines, each of said subsidiary bit lines and each of said source lines, respectively, means for either one of said source and drain of each of said memory cells, means for applying a signal composed of pulses each having a positive peak potential and a negative peak potential through said word lines to the control gate of said selected memory cell whereby its threshold voltage is converged into a predetermined voltage, and means for supplying a minute current to the source or drain of each of said memory cells.

In the non-volatile semiconductor memory device according to the fourth aspect of the present invention, a pulse signal is applied to the control gate of the memory transistor (cell) through a word line to execute an erase/write operation. With the means of supplying a very minute current corresponding to a leakage current provided to a main bit line or a sub bit line, a minute current is supplied to a predetermined bit line in accordance with the operation of a column decoder circuit during an erase or write operation. Thus, the threshold values of a large number of memory cells can be controlled to a predetermined value simultaneously and precisely.

Incidentally, the "signal" to be applied to the control gate of the memory cell in the present invention can be defined as a signal which can vary between a positive potential and a negative potential and may be any signal which can attain the operation intended by the present invention.

The above and other objects and features of the present invention will be more apparent from the following description taken in conjunction with the accompanying drawings.

BRIEF DESCRIPTION OF THE DRAWINGS

FIG. 17A is a circuit diagram of an embodiment of the non-volatile memory according to the third aspect of the present invention;

FIG. 17B is a waveform chart of pulses applied to the control gate during an erase/write operation;

FIGS. 19A, 19B and 19C are waveform charts of a floating gate voltage, a bit line voltage and a control gate voltage in the memory device shown in FIG. 18, respectively;

FIGS. 29A to 29E is a waveform chart of operation waveforms based on the charging pump shown in FIG. 29;

FIGS. 33A to 33D is a waveform chart of operation waveforms based on the switched capacitor shown in FIG. 32;

FIGS. 42A to 42C is a waveform chart for explaining the operation of a non-volatile semiconductor device; and FIGS. 43A to 43C are waveforms for explaining the problem to be solved by the present invention.

DESCRIPTION OF THE PREFERRED EMBODIMENTS

Method of the threshold voltages of non-volatile memory cells

First, a detailed explanation will be given of the method of unifying the threshold voltages of floating-gate type non-volatile memory cells M1-Mn.

Figure 1A:
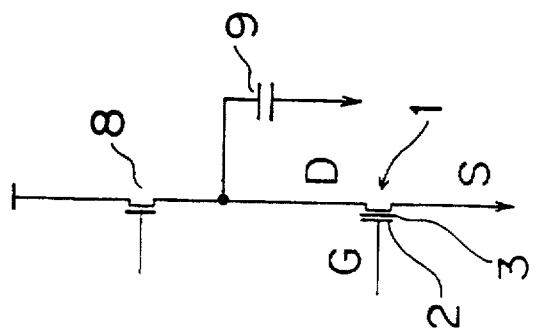
FIGS. 1A is a theoretical circuit diagram of the non-volatile semiconductor memory (cell) according to the first aspect of the present invention.

In this explanation, the transistors constituting memory cells M1-Mn are referred to as "memory transistors". For easy understanding, a more concrete explanation will be given. But the present invention should not be limited to the concrete explanation. The electrode of a memory transistor on the side where a storage node N (junction point of a transistor and a capacitor in FIG. 1A) is located is referred to as a drain electrode whereas the electrode of the memory transistor on the opposite side is referred to as a source electrode. The above definition of the source electrode and drain electrode is only for convenience of explanation. In some cases, in accordance with the operation mode of an actual non-volatile memory device, the electrode of the memory transistor where the storage node is located is preferably defined as a source electrode. For example, in a well-known virtual ground line system, the bit line to which the drain electrodes of the memory transistors are commonly connected and the source line to which the source electrodes thereof are commonly connected are alternately switched a ground potential. The present invention also includes such a mode.

Further, in a certain structure of a memory cell and application condition of a voltage (distribution of an electric field strength), a tunnelling current may flow between the floating gate and channel of the memory transistor. In the following explanation, however, considering the fact that the electrons extracted from the floating gate are finally shifted to the drain electrode in order to place the drain electrode in a relatively high voltages, it is assumed that the tunnelling current flows between the floating gate and drain electrode irrespectively of the memory structure and electric field distribution.

Figure 1B:
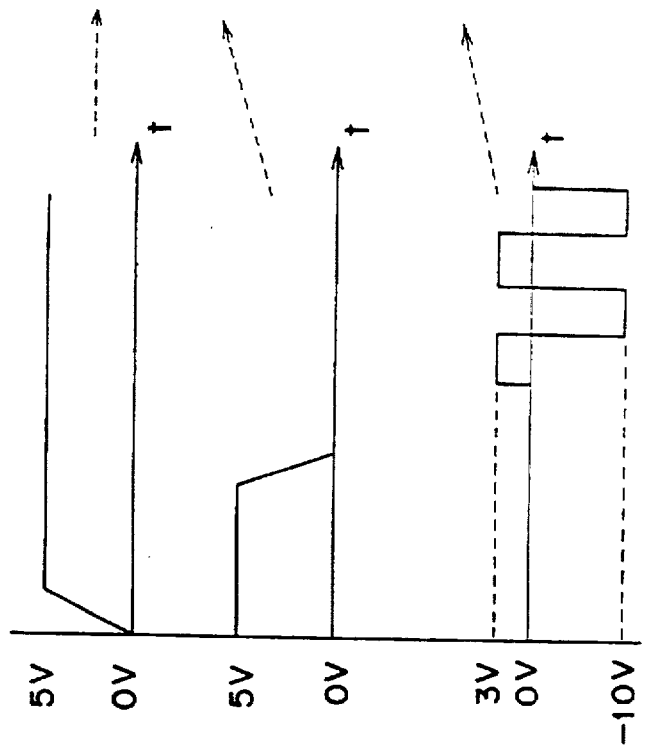
FIG. 1B is a waveform chart for showing the operation of the memory shown in FIG. 1A.
Figures 2A, 2B:
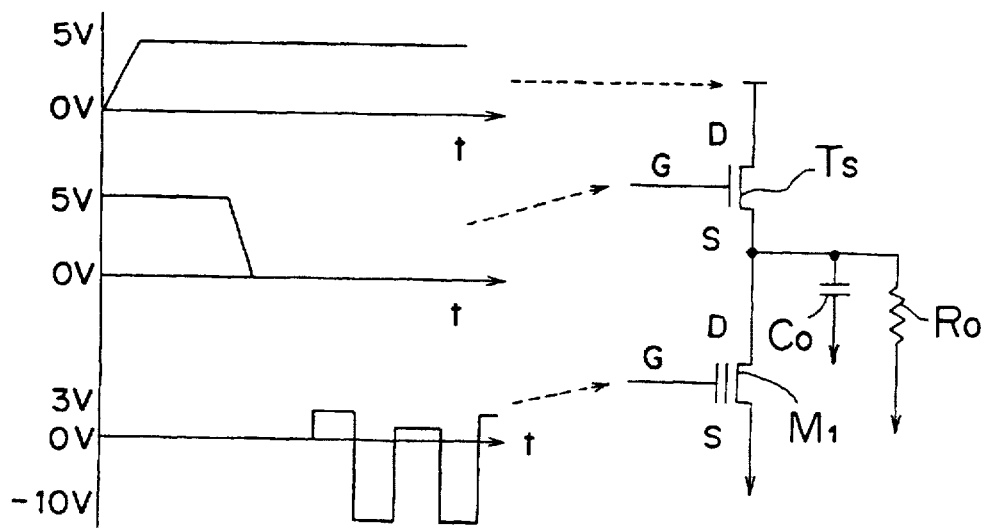
FIGS. 2A is a theoretical circuit diagram of the non-volatile semiconductor memory (cell) according to the second aspect of the present invention.
FIG. 2B is a waveform chart for showing the operation of the memory shown in FIG. 2A.
Figure 2C:
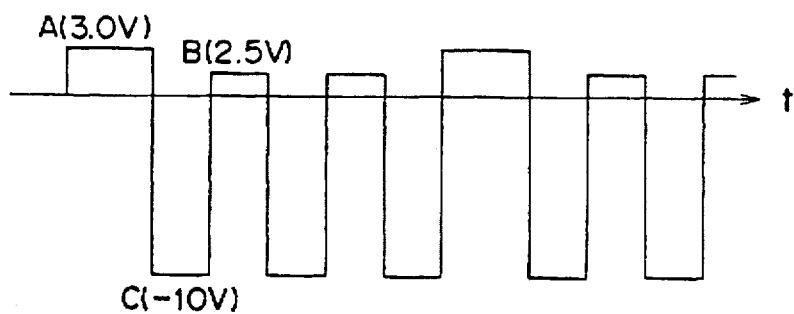
FIGS. 2C and 2D are waveform charts of pulses applied to the gate of the memory shown in FIG. 2A during its erase/write operation.
Figure 2D:
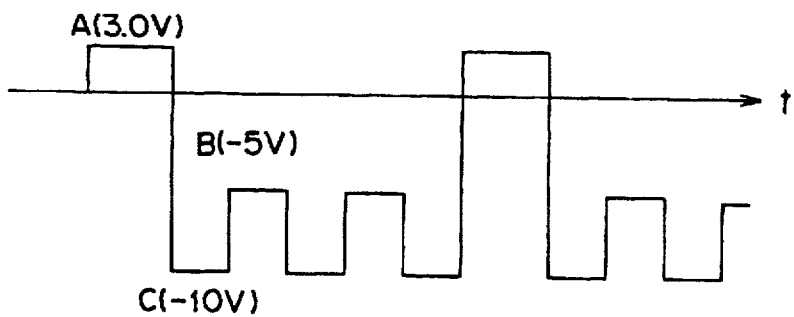

FIG. 1B is a timing chart for explaining the method of adjusting the threshold value of a non-volatile memory cell according to the present invention. In this adjusting method, an AC voltage having a certain amplitude, e.g., an AC voltage or AC pulse signal oscillating between positive and negative potentials is applied by a limited number of times to the control gate of the memory cell.

In this method, the drain of the memory transistor is previously maintained at a higher potential than that at the source electrode. In order to maintain the drain electrode at a high potential, the drain electrode and the parasitic capacitance of a bit line connected to the drain electrode are preferably used as a capacitor element for charge storage, or otherwise a specific capacitor element may be connected to the drain electrode so that charges are stored in the capacitor element.

Next, the AC pulse signal oscillating between positive and negative potentials is applied to the control gate. When a positive voltage is applied to the control gate, a memory transistor having a threshold value lower than a certain value defined in relation to the applied voltage or a range in its neighborhood (hereinafter referred to as an expected value) turns on. Then, charges shift from the drain electrode of the non-volatile memory cell to its source electrode. As a result, the drain voltage lowers sufficiently so that subsequent application of a negative voltage does not permit the tunnelling current to flow. Namely, the extraction of electrons from the floating gate ceases so that the threshold value of the non-volatile memory cell does not vary thereafter.

On the other hand, when a negative voltage is applied to the control gate, the charges stored in the memory transistor are extracted to the drain electrode, and the threshold voltage of the non-volatile memory cell falls by the extracted amount. When the positive voltage is successively applied to the control gate, the memory transistor having a lower threshold value than the expected value turns on so that the charges shift from the drain electrode to the source electrode. As a result, the drain voltage falls sufficiently so that subsequent application of a negative voltage does not permit the extraction of electrons from the floating gate. Accordingly, the threshold value of the non-volatile memory cell does not vary thereafter.

When the above operation is repeated, the threshold values of all the non-volatile memory cells will be converged into the expected value. Further, if the number of times of repeating the above operation is small, threshold values of the non-volatile memory cells will not be strictly converged into a predetermined value, but may have a desired range. In this case also, it is apparent that the threshold value of the non-volatile memory cell has been suitably adjusted. Whether the threshold value has been strictly converged into a fixed value or a desired range means only the degree of convergence.

Although apparent from the principle of the above method, the waveform of the AC pulse signal applied to the control gate of the non-volatile memory cell should not be limited. The waveform may be a rectangular wave, sinusoidal wave, triangle wave, etc.

A further concrete explanation will follow. Now it is assumed that 10 (ten) pulses of the AC pulse signal oscillating e.g. between 3 V and 10 V are applied to the control gate of the non-volatile memory cell.

First, 5 V is applied to the drain electrode of a selected transistor Tr1 and 5 V is also applied to the gate electrode thereof so that the selected transistor turns on. Then, the capacitor element constituted by a bit line BL and the parasitic capacitance of the portion electrically connected to the bit line is charged. This charging operation enhances the drain potential of the memory transistor of a certain non-volatile memory Mk. Thereafter, with the selected transistor Tr1 turned off (gate voltage=0 V), the AC pulse voltage is applied to the control gate of the memory transistor relative to the non-volatile memory cell Mk. When a positive voltage of 3 V is applied to the control gate of the memory transistor, the memory transistor having a threshold value lower than the expected value turns on. Then, a channel current flows from the drain electrode to the source electrode. This means reduction of the drain voltage of the memory transistor due to discharging of charges stored in the capacitor element. In such a memory transistor, subsequent application of the negative voltage does not permit the tunnelling current to flow.

Next, when a negative voltage of −10 V is applied to the control gate of the memory transistor, the potential of the floating gate becomes negative, normally about half as large as the potential of the control gate. Then, a small amount of electrons are extracted from the floating gate to the drain electrode. The corresponding tunnelling current flows between the floating gate and drain electrode. As a result, the threshold voltage is lowered by the value corresponding to the electrons extracted from the floating gate. When a positive voltage of 3 V is successively applied to the control gate of the memory transistor, the memory transistor having the threshold value lower than the expected value turns on. As a result, the drain voltage of the memory transistor lowers owing to discharging of the charges stored in the capacitor element. Thereafter, the application of the AC pulse signal is repeated. Thus, the threshold values of all the non-volatile memory cells are adjusted so as to be converged into the expected value.

FIGS. 42A to 42C show the cyclical changes in the floating gate potential $V_{FG}$ (FIG. 42A) and in the bit line potential $V_{BL}$ (FIG. 42B) when a pulsative control gate voltage $V_{CG}$ (FIG. 42C) is applied to the control gate of a floating gate type memory transistor.

The control gate voltage $V_{CG}$ shown in FIG. 42C is an AC voltage of continuous combination of plural pulses((1), (2), . . . (6), . . .) oscillating between 5 V and −10 V. As shown in (a), (b) and (c) in FIG. 42A, the different floating gate potentials $V_{FG}$ of −6 V, −4 V and 2 V in an initial state are converged into a predetermined potential (about −2 V) after about 100 μsec. Since the threshold value of the memory cell can be regarded about half as large as the absolute value of the floating gate potential $V_{FG}$, it can be understood that the application of the AC voltage to the control gate converges the distributed threshold values of 12 V, 8 V and 4 V into about 4 V. Then, as shown by (c) in FIG. 42B, in the memory cell having a relatively low threshold value, immediately after the first pulse ((1) in FIG. 42O) is applied, the bit line potential $V_{BL}$ abruptly falls and then gradually approaches a fixed value. On the other hand, as shown by (a) and (b) in FIG. 42B, in the memory cell having a relatively high threshold value, the bit line potential $V_{BL}$ does not fall until the fourth pulse ((4) in FIG. 42C) is applied. The bit line potential $V_{BL}$ of the memory cell having a higher threshold value abruptly falls at a later time. In any way, however, the respective bit line potentials approach fixed values. Thus, it can be understood from FIGS. 42A to 42C that when the AC voltage is applied to the control gate of the floating-gate type memory transistor, the threshold values of its memory cell can be adjusted.

Figure 44:
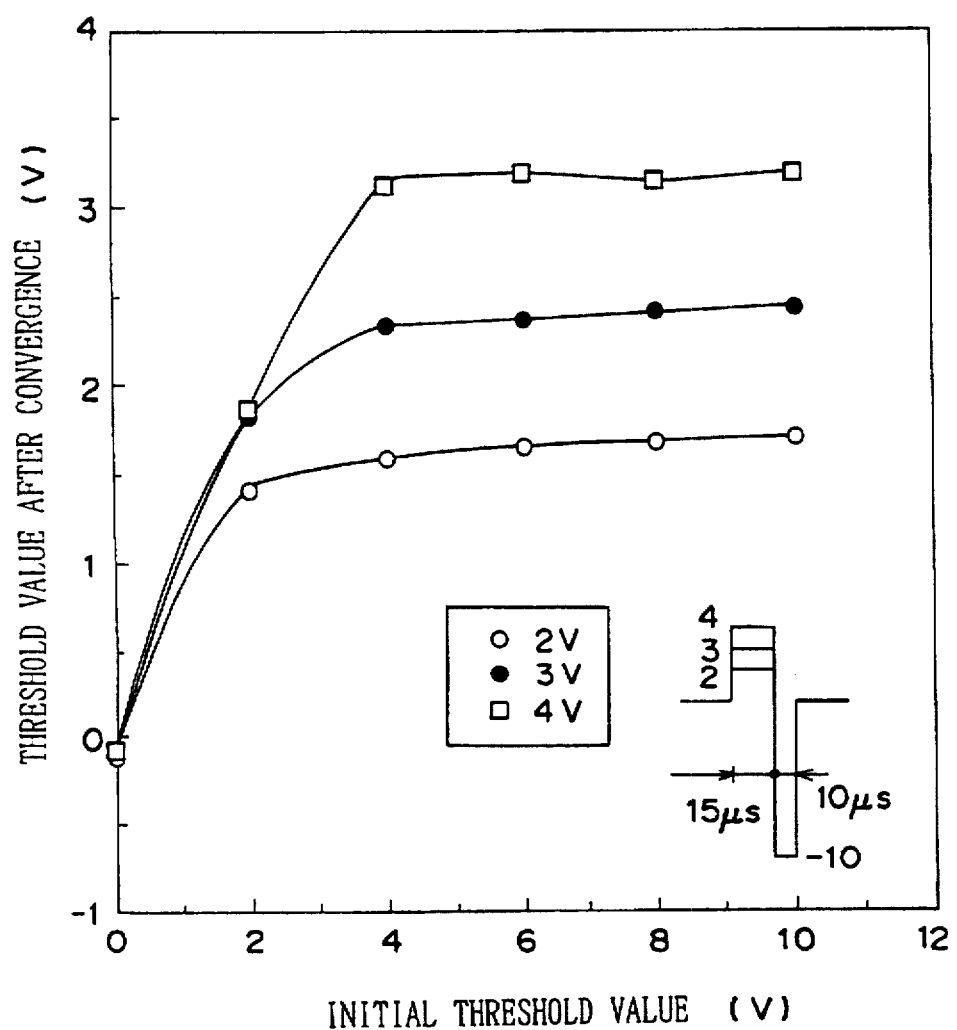
FIGS. 44 and 45 are graphs showing the effects of adjustment of the threshold values according to the present invention.
Figure 45:
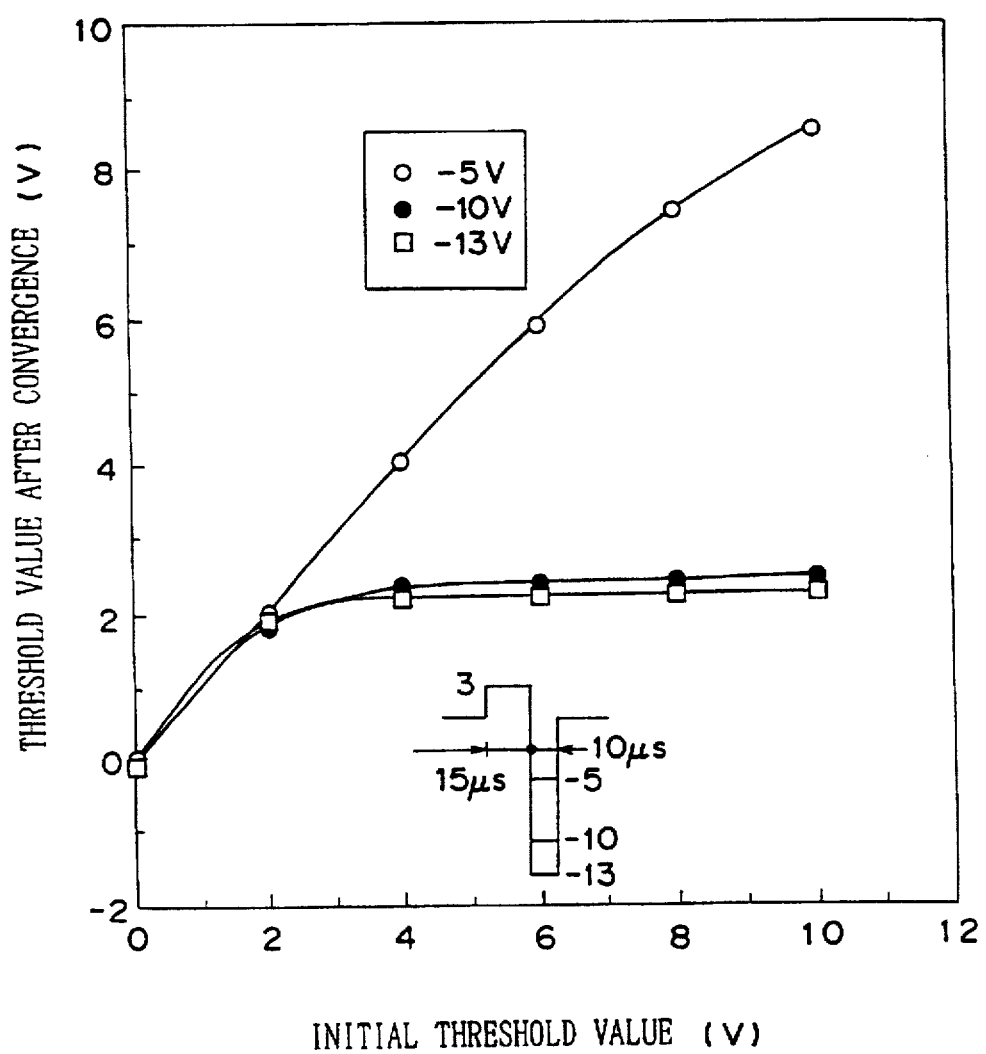

Such an effect is more clearly shown in FIGS. 44 and 45. In these figures, the abscissa represents the initial threshold voltage in a memory cell and the ordinate represents the threshold voltage converged when the AC voltage composed of ten pulses is applied. The pulse constituting the AC voltage in FIG. 44 is a square wave oscillating between 4 V, 3 V or 2 V (duration of 15 μsec) and −10 V (duration of 10μsec). The pulse constituting the AC voltage in FIG. 45 is a square wave oscillating between 3 V (duration of 15 μsec) and −13 V, −10 V or −5 V (duration of 10 μsec). As seen from these figures, the converged value or range can be expected from the initial threshold value and a parameter of the AC voltage applied to the control gate. Further, it can be understood that (1) where the initial threshold value (Vth0) is 4 V or more, the estimated value is substantially fixed irrespectively of the initial threshold voltage; (2) where the initial threshold value of the memory cell is larger than the positive peak voltage of the AC voltage applied to the control gate, the estimated value is substantially fixed irrespectively of the initial threshold value; (3) the negative peak voltage of the AC voltage applied to the control gate is lower than −10 V, the expected value is substantially fixed irrespectively of the initial threshold value; and (4) where the initial threshold value (Vth0) is not smaller than 4 V and the positive voltage applied to the control gate is V+, the threshold value after convergence is 0.7+to 0.8+( if Vth0=2 V, about 0.70 V+; if Vth0=3 V, about 0.73 V+; and Vth=4 V, about 0.80 V+).

The above method of adjusting the threshold value serves to reduce the threshold value of the memory cell by application of a lower voltage (negative potential in the case of the AC voltage oscillating between a positive potential and a negative potential) and verify and select the threshold value of the memory cell by application of a higher voltage (positive potential in the case of the AC voltage oscillating between a positive potential and a negative potential). The verifying of the threshold value of the memory cell means to compare the actual threshold value of a memory cell as an object with the expected value which is the converged value or range determined in relation to the higher voltage. The selection of the memory cell is to discriminate whether the memory cell at issue is a memory cell having the threshold value lower than the expected value. When the memory cell is selected on the basis of the higher voltage, in the memory cell having the threshold value lower than the expected value, the drain voltage of the memory transistor of the memory cell falls so that subsequent application of the lower voltage does not provide the tunnelling current. Therefore, such a memory cell will not be served for the verification of the threshold value of the memory cell. On the other hand, in the memory cell still having the threshold value lower than the expected value, application of the lower voltage provides the tunnelling current so that such a memory will be served for the verification of its threshold value and subsequent selection thereof.

In this case, the estimated value into which the threshold value of the memory cell is to be converged can be determined optionally. Since application of the lower voltage for a shorter time can make small the tunnelling current flowing for the time, i.e. extract electrons from the floating gate by a smaller degree, the precision of convergence of the threshold value of the memory cell into the expected value can be enhanced. On the other hand, application of the higher voltage for a short time results in start of the application of low voltage before the termination of the reduction of the drain voltage, and hence does not permit the convergence of the threshold value of the memory cell to be suitably controlled. For this reason, as long as no hindrance occurs for the operation speed of the non-volatile memory device itself, the higher voltage is preferably applied for a longer time.

In the case of the AC voltage varying between positive and negative voltages, the absolute value of the positive voltage is preferably smaller than that of the negative voltage. Although depending on the distribution in the electric field strength in a gate oxide film, assuming that the possibility of injection of electrons when the positive voltage is applied to the control gate is approximately equal to that of extraction of electrons from the floating gate when the negative voltage is applied to the control gate, when the absolute value of the positive voltage is larger than that of the negative voltage, the degree of injection of electrons into the floating gate exceeds that of extraction of electrons from the floating gate so that the threshold value of the memory cell may result. Although there is a condition permitting the injection of electrons into the floating gate to be disregarded, the method of adjusting the threshold value is sufficiently effective as long as the effect of application of the positive voltage influencing changes in the threshold value of the memory cell is lower than that of the lower voltage.

The voltage to be applied to the control gate of the memory transistor is preferably sufficiently lower than the drain voltage of the memory transistor. The application of the lower voltage extracts the electrons from the floating gate. When the drain voltage gradually falls during the application of the AC voltage, correspondingly, it becomes difficult to extract the electrons from the floating gate. In order to obviate such an inconvenience, the lower voltage to be applied to the control gate is made much lower than the drain voltage of the memory transistor so that the electrons are easily extracted and the tunnelling current easily flows. Therefore, the amplitude of the lower voltage to be applied to the control gate is preferably vary in accordance with a change in the drain voltage.

In the above method of adjusting the threshold value, it is preferable that the higher voltage (positive voltage in the AC voltage varying between the positive voltage and negative voltage) is applied precedingly to the lower voltage (negative voltage in the above AC voltage). The reason is as follows. In the case where the memory cell at issue is an EPROM, if the negative voltage is applied precedingly, the threshold value of the memory cell having the sufficiently low threshold value will be further reduced so that the memory cell will be placed in a kind of excessive erasure state. Thus, the source and drain electrodes will be short-circuited so that the drain voltage cannot be applied. This leads to difficulties such as poor reading of the data and impossibility of charging of the bit line.

However, the lower voltage may be applied precedingly. For example, if the lower voltage is not a low voltage of −10 V, but a relatively high voltage of −1 V, in many cases, the above problem of excess erasure will not occur. Therefore, the lower voltage may be applied initially. In this case, for example, after −1 V is initially applied and then −3 V is applied, e.g. −10 V which is much lower than the drain voltage of the memory transistor is preferably applied so that the tunnelling current can easily flow.

It can be understood that the above method of adjusting the threshold value is a new method of reducing the threshold value of the floating gate type non-volatile memory cell to converge it into a desired value or range, and also a new method of erasing (or write in another definition) the floating gate type non-volatile memory cell. As the case may be, in the following explanation for the embodiments of the present invention, this method will be referred to "AC pulse method" for convenience of explanation.

Explanation of the basic structure of a memory to which the AC pulse method is to be applied.

Now referring to FIG. 46, an explanation will be given of the basic structure of a non-volatile memory device to which the above AC pulse method is to be applied.

Figure 46:
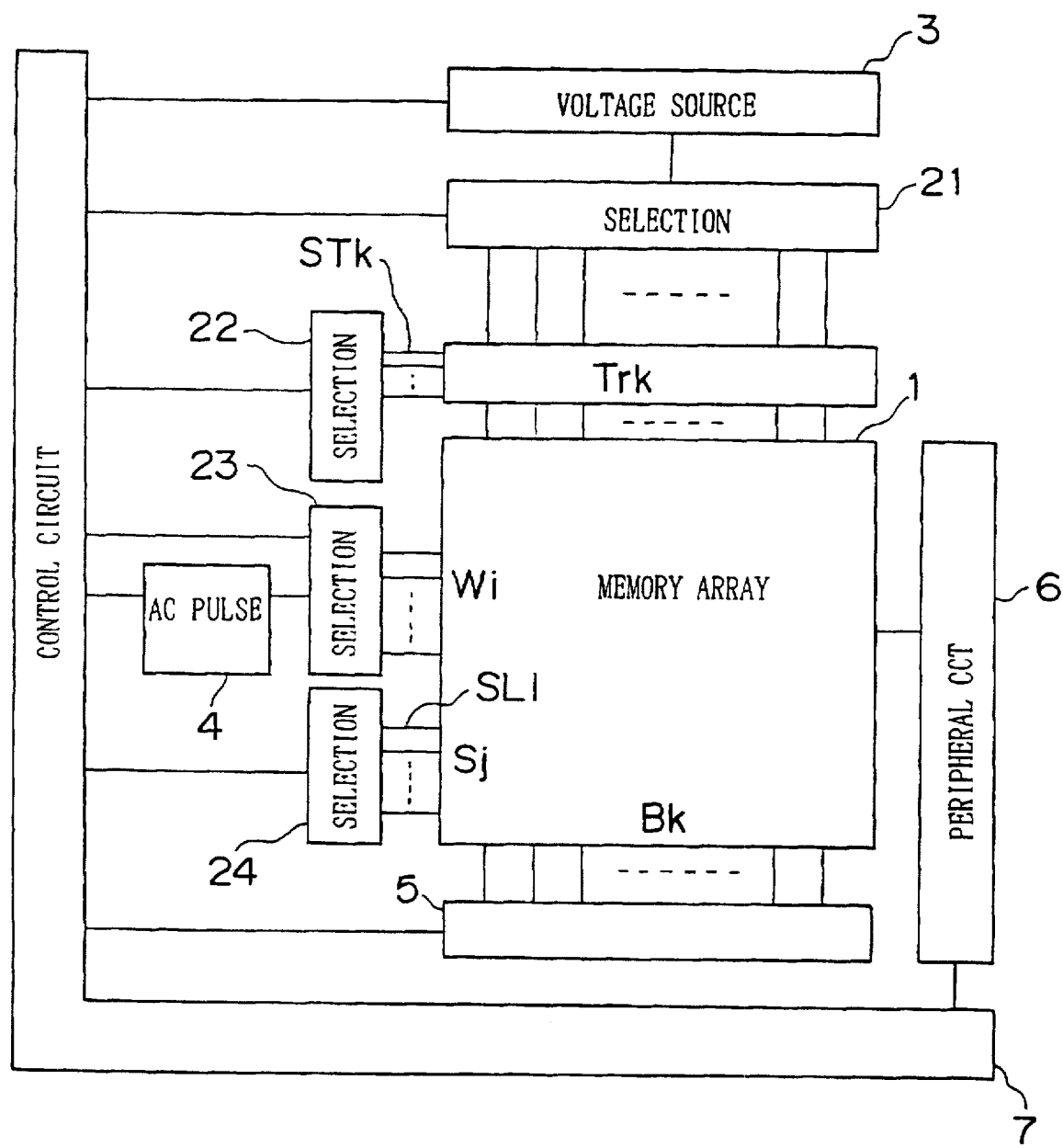
FIG. 46 is a block diagram of the basic structure of the memory to which the "AC pulse method" is to be applied.

In FIG. 46, reference numeral 1 denotes a memory array; 2 (21-24) selection circuits represented by multiplexers; 3 a voltage source; 4 an AC voltage generating circuit; 5 a voltage detection circuit; 6 other peripheral circuits; and 7 a control circuit. Symbol Wi or WLi denotes a word line; Sj a source line; Bk or BLk a bit line; Stk a gate selection line; SL1 a source selection circuit; and Trk a selection transistor. Suffixes i, j, k and l are integers corresponding to the number of word lines and source lines and of selection transistors.

The memory array 1 is composed of a plurality of non-volatile memory cells M1 to Mn regularly arranged. Any non-volatile memory cell Mk which includes a transistor having a control gate and a floating gate (hereinafter referred to as "memory transistor" is located at the crossing point of a word line Wi and a bit line Bk. The gate electrode, drain electrode and source electrode of the memory transistor are connected to the word line Wi, bit line Bk and source line Sj. The selection circuit 2 selects the word line, bit line and source line corresponding to a specific address by a control signal from the control circuit 7. In this meaning, the selection circuit 2 can be regarded as incorporating an address decoder. The selection circuit 21 applies a voltage to only a specific bit line to be selected, thereby contributing energy saving. The selection circuit 22 selects a specific gate selection line to permit the on-off operation of the selected transistor corresponding to the gate selection line. These selection circuits 21 and 22 permit charging of the bit line necessary for the AC pulse method or a capacitor element supplementarily added. The selection circuits 23 and 24 select a specific word line and a specific source line. The AC voltage generating circuit 4 supplies a predetermined AC pulse signal to the selected word line through the selection circuit 23. The circuit 4 may be a circuit capable of generating a DC voltage signal that is a selection signal for selecting a word line, i.e. a word line driving circuit, or a portion thereof. The voltage detection circuit 5 serves to detect the reduced potential at the bit line while and after the AC pulse method is applied. The circuit 5 may be used as a sense circuit for reading memory information. The peripheral circuit 6 which is not necessarily required for the AC pulse method is illustrated generally.

The control circuit 7 generally controls the selection circuits 2 (21-24), voltage source 3, AC voltage generating circuit 4 and peripheral circuits 6. Namely, the control circuit 7 performs all the control operations inclusive of the control of the operating timings of each circuit which is required for the operation of the AC pulse method. Entity or part of the control circuit 7 may be formed on a chip on which the memory array 1 is arranged, otherwise control signals may be supplied externally from the chip to perform the AC pulse method. Examples of the control operation effected by the control circuit 7 for the operation of the AC pulse method are as follows.

1 The selection circuit 2 is controlled to
  (1) select a specific memory cell, a specific bit line or a specific word line, or select plural memory cells, word lines or bit lines simultaneously; and
  (2) set the source potential, drain potential and substrate potential of the selected memory cell(s) at a predetermined value. Thus, the potential of the selected bit line is relatively enhanced so that the subsequent floating state can be maintained and a potential condition can be set to permit the tunnelling current or channel current to flow easily in the memory transistor.

2. The AC voltage circuit 4 is controlled. Thus,
  (1) a predetermined AC pulse signal can be set. The pulse width, kind, number, peak value, waveform, etc. of pulses constituting an AC voltage can be set optionally. Further, it can be decided whether a positive voltage or negative voltage should be applied. Particularly, for example, the control circuit 7 can increase the absolute value of the absolute value of the peak value of the negative voltage on the basis of the signal from the voltage detection circuit 5 which has detected that the potential at the specific word line has been reduced. Likewise, the control circuit 7 can change the pulse width or kind of the pulses constituting the AC pulse signal on the basis of the signal from the voltage detection circuit 5.

(2) A predetermined AC pulse signal can be applied to a specific word line through the selection circuit 2.

(3) The application of the AC pulse signal to a specific word line by the AC voltage generating circuit 4 can be stopped. Particularly, on the basis of the voltage detection circuit which has detected that the potential at a specific word line has been sufficiently reduced, the control circuit 7 stops the application of the AC voltage to the word line. This contributes to energy saving.

3. The voltage source 3 is controlled to enable the on-off control of the voltage source which is necessary for the operation of a switched capacitor.

In the respective embodiments which will be hereinafter explained, the basic structure of the non-volatile memory device as shown in FIG. 46 is basically common except for the case particularly noted. Therefore, in each embodiment, the main part of the memory array 1 has only to be explained.

Aspect I

Figure 3:
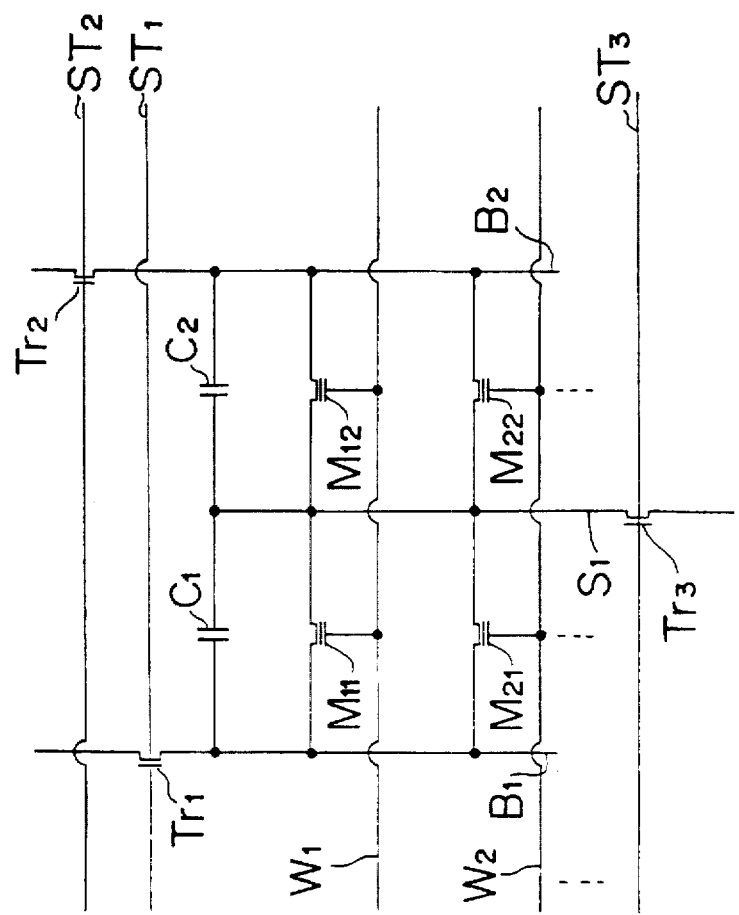
FIG. 3 is a circuit diagram of a non-volatile semiconductor memory device according to the first aspect of the present invention.

Now referring to FIG. 3, an explanation will be given of the non-volatile semiconductor memory device according to the the first aspect of the present invention. In FIG. 3 non-volatile memory cells are arranged in a matrix shape to form a non-volatile semiconductor memory device. Each of memory cells M11, M12, M21 and M22, . . . , is composed of source/drain diffused layers formed in a semiconductor substrate, a floating gate covered with a gate oxide film about 100Å and an ONO (silicon oxide film-silicon nitride film-silicon oxide film) formed between the source drain layers and a control gate formed on the floating gate.

The control gates of the memory cells M11, M12 are connected to a word line W1 and those of the memory cells M21, M22 are connected to a word line W2. A bit line B1 is connected to the one electrodes of the memory cells M11, M21, . . . and to the source of a select transistor Tr1, and a bit line B2 is connected to the one electrodes of the memory cells M12, M22, . . . and to the source of a select transistor Tr2. The junction points of the memory cells M11 and M12 and the memory cells M12 and M22 which are commonly connected to the source of a select transistor Tr3 through a source line S1. The drains of the select transistors Tr1 and Tr2 are connected to pull-up circuits 10 (not shown), respectively. The gates of these select transistors are connected to gate select lines ST1 and ST2, respectively. A capacitor C1 is connected between the bit line B1 and the source line S1 and a capacitor C2 is connected between the bit line source line S1 and the bit line B2. The capacitors C1 and C2 may be connected through a transistor.

Although not being limited, in each memory cell, the floating gate which is formed between the gate oxide film has a size of 3 μm×1 μm, and a channel region and a part of the source/drain diffused layers. The channel region has a size of 1 μm×1 μm. In order to adopt the AC pulse method, the capacitances of the capacitor elements 9 and C0 must be determined under the following conditions.

(1) (capacitance of the floating gate in a memory cell)<< (capacitance between a bit line and a source line)

(2) (time constant determined by the leakage current of the bit line in a floating state and the capacitance of the bit line)>>(width of a pulse applied to a word line)

Further, where the AC pulse method in which an AC voltage is applied to the control gate of the memory transistor is adopted, it is desired that the potential at the bit line while the AC voltage is applied falls within 5%

Empirically, it has been found that the capitances of the capacitor elements 9 and C0 which satisfy the above conditions (1) and (2) are about 100 to 300 fF.

If the parasitic capacitance generated in the bit line and the portion electrically connected thereto is larger than the capacitance of C1 and C2, auxiliary capacitor elements C1 and C2 can be omitted.

Figure 4A:
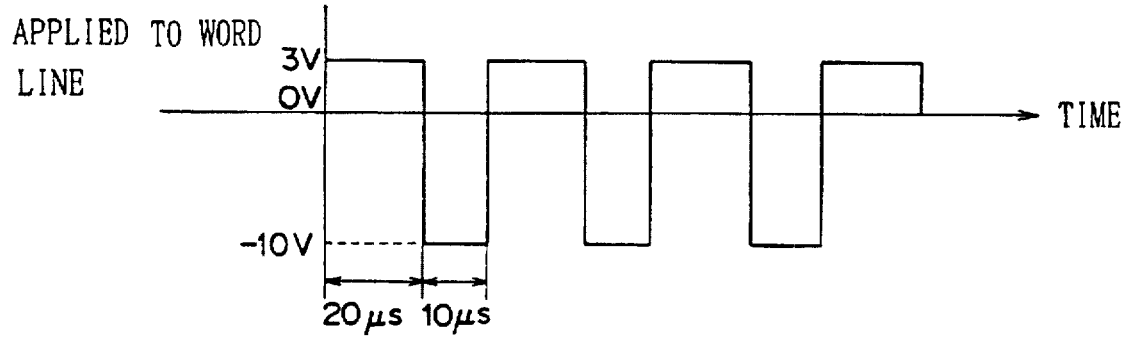
FIG. 4A is waveform chart of pulses applied to a word line of the memory device shown in FIG. 3.
Figure 4B:
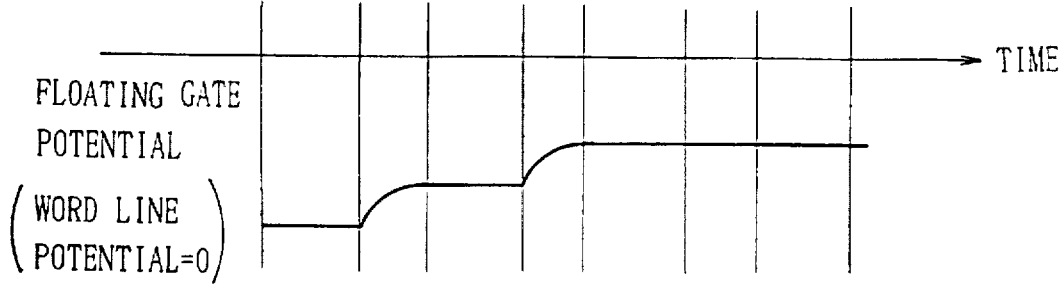
FIG. 4B is a view showing the potential at the floating gate in the memory device shown in FIG. 3.
Figure 4C:
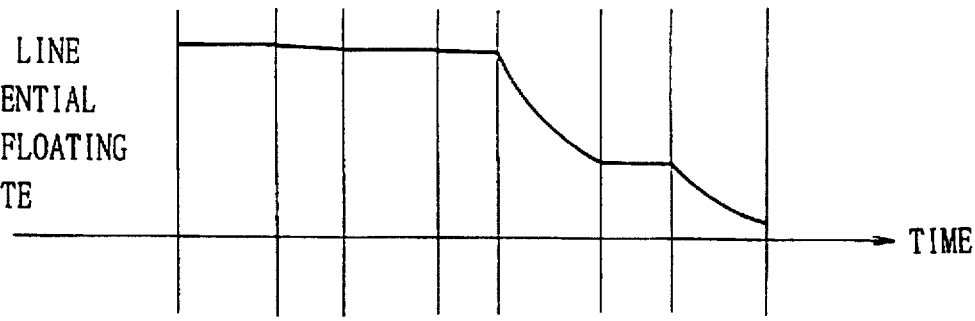
FIG. 4C is a view showing the potential at a bit line in the memory device shown in FIG. 3.

Now referring to the waveform charts of FIGS. 4A to 4C, an explanation will be given of the erasing method for the memory device described above.

First, an explanation will be given of the case where the memory cells has a high threshold voltage of 7 V or more.

It is assumed that the bit line B1 is at the potential of 5 V, the bit line B2 is at the ground potential and the source line S1 is also at the ground potential.

The select transistors Tr1 and Tr2 are turned off to place the bit lines B1 and B2 in a floating state. Then, the capacitors C1 and C2 are placed in a charged state. Subsequently, with the word line W2 with its potential reduced to ground, a pulse wave (signal) as shown in FIG. 4A is applied to the word line W1 and the control gates of the memory cells M1 and M12. The potential at the floating gates connected to the word line W1, as shown in FIG. 4B, is gradually lowered when a negative potential is applied to the control gates. As shown in FIG. 4C, the voltage at the drain connected to the bit line B1 is lowered when a positive potential is applied to the control gates with a predetermined threshold potential at the floating gates.

The pulse wave applied to the control gates through the bit line has a first pulse having a positive peak potential of 3 V and a pulse width of 20 μs and a subsequent pulse having a negative peak potential of −10 V and a pulse width of 10 μs. These positive and negative pulses are applied to the control gates alternately and repeatedly thereby to lower the potentials at the floating gate and drain electrode. In this case, the absolute value of the positive potential is preferably required to be smaller than that of the negative potential. Further, it is preferably required that after the pulse with the positive potential is applied, the pulse with the negative potential is applied. Incidentally, the pulse signal is supplied from a pulse generating circuit 12 through a switch 13.

In the above operation, when the negative pulse is applied to the word line W1 connected to the control gate of the memory cell M11, a tunnelling current flows between the floating gate and drain diffused layer. As a result, the charges stored in the floating gate are decreased. When the threshold value is gradually lowered, a channel current starts to flow between the source and drain. Because of this channel current, the drain voltage is reduced and eventually the tunnelling current will not flow between the floating gate and drain. Thus, the memory cell M11 comes to have tha conveged threshold voltage.

On the other hand, in the memory cell M12, because the bit line B2 is at the ground potential, no tunnelling current flows between the floating gate and the drain (or source) thereof so that the threshold voltage of the memory cell M12 is maintained at a high voltage.

In the memory cells M21 and M22, because the word line W2 is at the ground potential, the potential at their floating gates does not vary and so their threshold voltage does not vary.

Next, an explanation will be given of the case where the memory cells has a low threshold voltage of 2 V.

In the same manner as in the case where the threshold voltage is high, signals are applied to the bit lines, source line, word lines and select transistors.

It is assumed that the bit line B1 is at the potential of 5 V, the bit line B2 is at the ground potential and the source line S1 is also at the ground potential.

The select transistors Tr1 and Tr2 are turned off to place the bit lines B1 and B2 in a floating state. Then, the capacitors C1 and C2 are placed in a charged state.

Figure 5A:
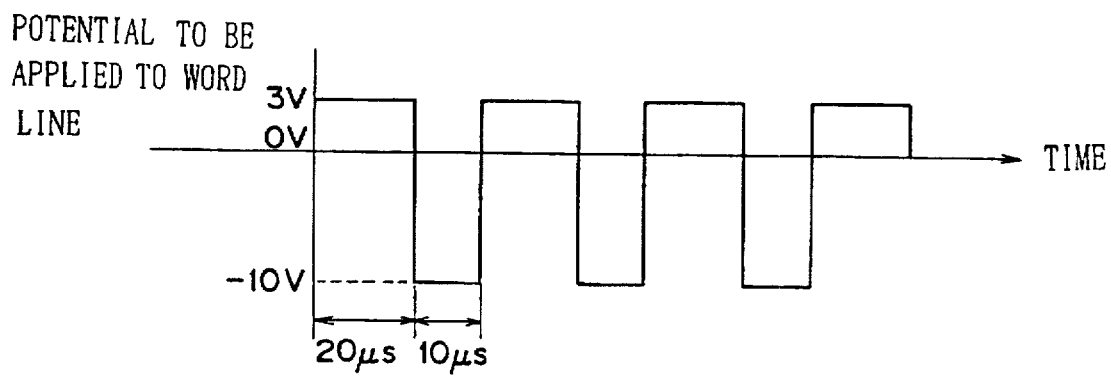
FIG. 5A is waveform chart of pulses applied to a word line of the memory device shown in FIG. 3.
Figure 5B:
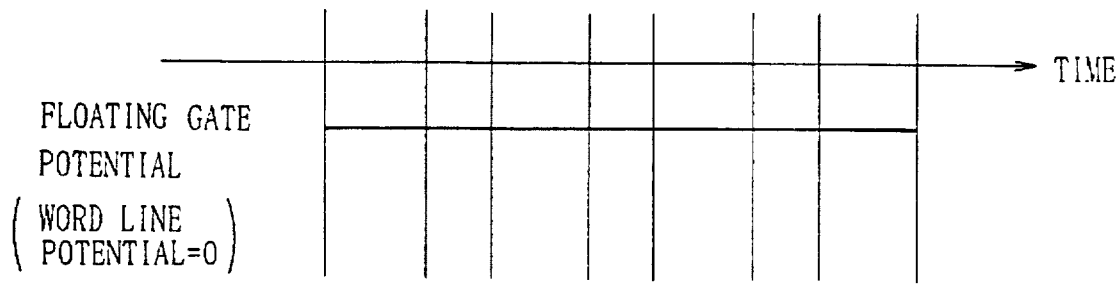
FIG. 5B is a view showing the potential at the floating gate in the memory device shown in FIG. 3.
Figure 5C:
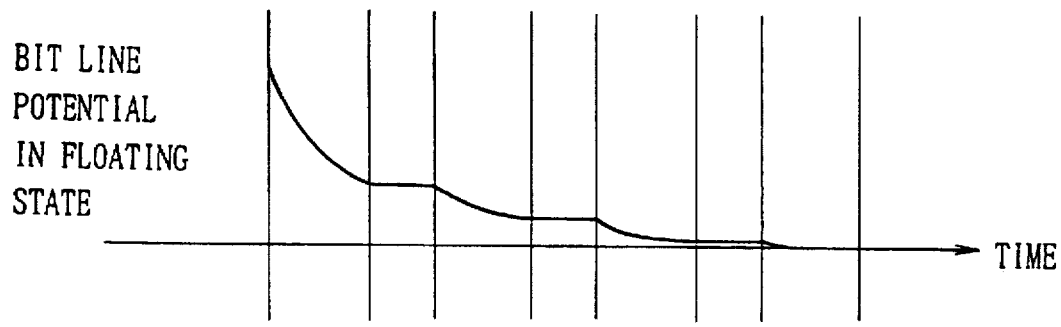
FIG. 5C is a view showing the potential at a bit line in the memory device shown in FIG. 3.

Subsequently, with the word line W2 with its potential reduced to ground, a pulse wave (signal) as shown in FIG. 5A is applied to the word line W1, i.e. the control gates of the memory cells M11 and M12.

In the above operation, when the positive pulse is applied to the word line W1 connected to the control gate of the memory cell M11, a channel current flows between its source and drain so that the drain voltage is lowered. As a result, even when the subsequent negative pulse is applied, the tunnelling current does not flow between the floating gate and the drain. In this way, since the positive pulse is first applied, charges are not further extracted from the floating gate with the threshold value already reduced. Thus, excess erase does not occur. Therefore, the write operation before erasing which has been carried out is not required. In order to lower the drain voltage sufficiently, it is desired that the positive duration of the pulse is increased.

On the other hand, in the memory cell M12, because the bit line B2 is at the ground potential, no tunnelling current flows between the floating gate and the drain (or source) thereof so that the threshold voltage of the memory cell M12 is maintained at a high voltage.

In the memory cells M21 and M22, because the word line W2 is at the ground potential, the potential at their floating gates does not vary and so their threshold voltage does not vary.

Further, if the erase operation is completed when all the potentials at the bit lines relative to the word line W1 have been lowered, parallel erase operation can be carried out for a large number of memory cells, gates of which are connected to the word line W1. Since the erase operation is completed within ten periods, if at most 128 or so memory cells are connected in parallel, the time required for the erasing can be shortened in total.

The potential at the bit line is gradually reduced with time by the source current. If the pulse having a width in consideration of such a reduction is applied to the word line, the erase operation can be realized in a more stabilized manner at a higher speed. A more narrow pulse width permits the accuracy of control to be enhanced.

The non-volatile semiconductor memory device according to the first aspect of the present invention should not be limited to the memory as shown in FIG. 3. The same erasing method as described above can be applied to the non-volatile semiconductor memory device as shown in FIG. 6.

Figure 6:
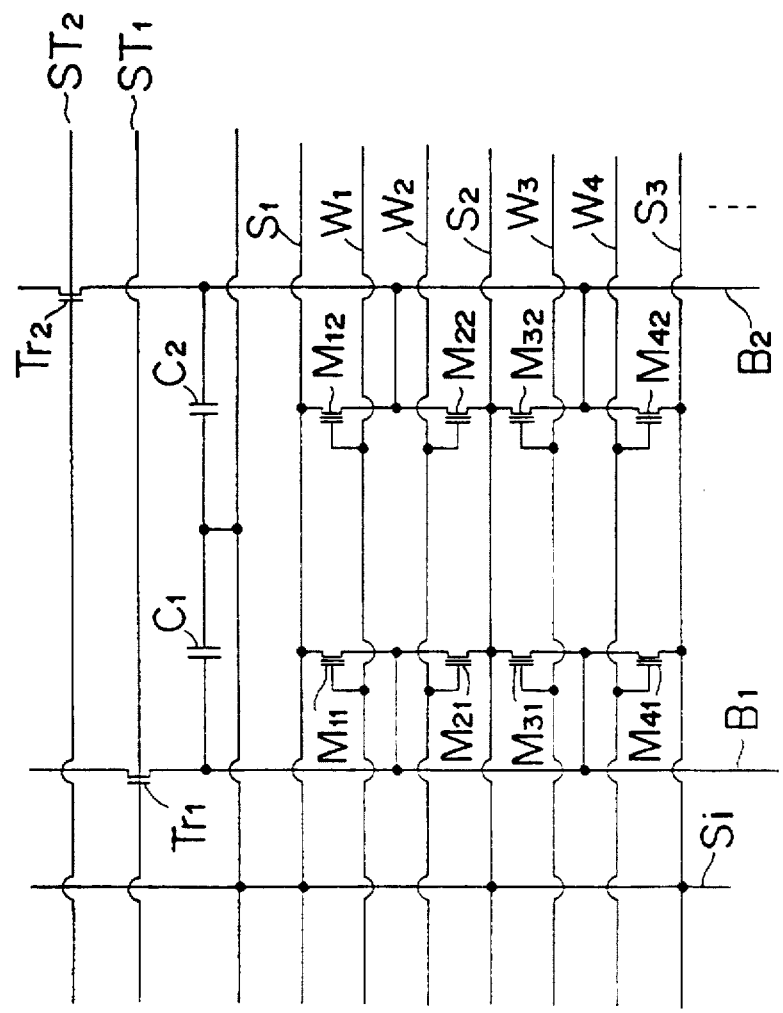
FIG. 6 is a circuit diagram of another non-volatile semiconductor memory device according to the first aspect of the present invention.

In the memory device shown in FIG. 6, word lines W1 to W4 are made orthogonal to the channels of select transistors Tr1 and Tr2, and the source lines S1 to S3 of memory cells M11, M12; M21, M22; M31, M32 and M41 and M42 are connected to a wide area source line Si.

Further, since the erase operation can be controlled for the threshold voltages of a large number of memory cells connected to a common word line, assuming that the memory cell has the size described above, the number of memory cells which can be arranged in parallel can be enhanced from only 64 to 1000 or so and also the time required for the erasing can be greatly shortened.

The non-volatile semiconductor memory device according to the first aspect of the present invention intends to apply a pulse wave (signal) to the control gate of a non-volatile memory cell so as to erase the charges stored in the floating gate, thereby placing the memory cell in an initial state. Therefore, the erasing method is simple. Also, the write operation before erase which has been conventionally executed is not required so that the erasing time can be greatly shortened.

It is possible to perform simultaneously the erase operation for a large number of memory cells connected to a common word line in parallel. By controlling the pulse width of a pulse wave (signal) applied to the control gate, the threshold voltage of the memory cell can be precisely set. This makes it unnecessary to use any specific feedback circuit or logic circuit for preventing the false operation due to the fluctuation in the threshold voltages of the non-volatile memory cells. For this reason, with the same storage amount, a more compact non-volatile memory semiconductor memory device than before can be provided. The production cost can also be reduced.

It is needless to say that the operation similar to that described above can shorten the processing time for write.

Aspect II

An explanation will be given of a non-volatile semiconductor memory device according to the second aspect of the present invention.

Figure 7:
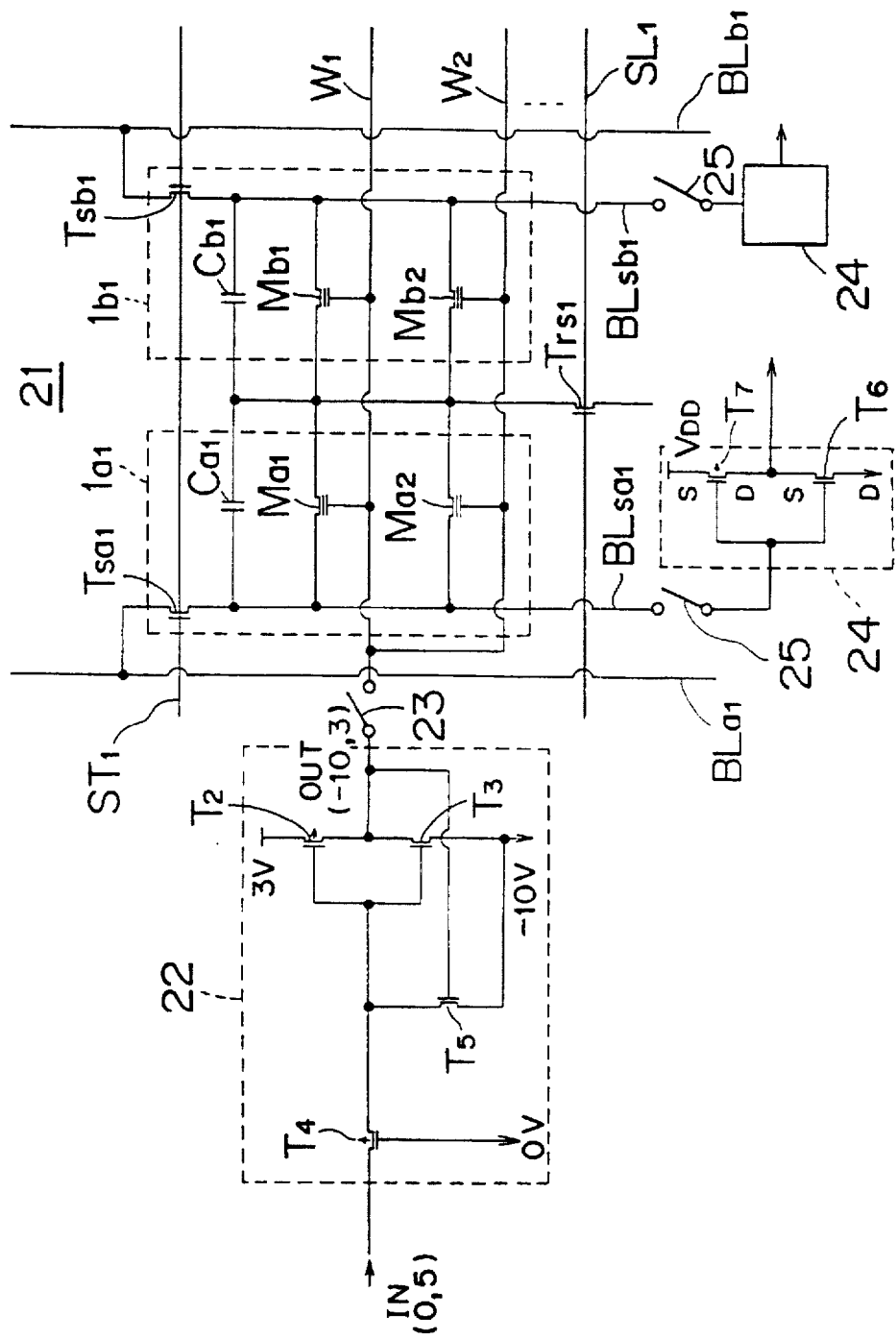
FIG. 7 is a circuit diagram of a non-volatile semiconductor memory device according to the second aspect of the present invention.

FIG. 7 is a circuit diagram of one embodiment of the non-volatile semiconductor memory device according to the second aspect of the present invention.

As shown in FIG. 7, the non-volatile semiconductor memory device includes an array 21 composed of non-volatile memory cells, a level shifter circuit 22, threshold voltage detector circuits 24 for detecting the threshold voltages of the non-volatile memory cells, switches 3, row/column decoder circuits (not shown), and a sense amplifier (not shown).

In the memory cell array 21, the drain of a select transistor Tsa1 is connected to a main bit line BLa1, and the source of the select transistor Tsa1 is connected to a subsidiary bit line BLsa1. The drains of memory elements Ma1 and Ma2 are connected to the subsidiary bit line Blsa1 and the sources thereof commonly connected are connected to the drain of a source side select transistor Trs1 through a source line. A source side select line SL1 is connected to the control gate of the source side select transistor Trs1. A capacitor Ca1 is connected between the source and drain of each of the memory elements Ma1 and Ma2.

On the other hand, the drain of a select transistor Tsb1 is connected to a main bit line BLb1 and the source thereof is connected to a sub-bit line BLsb1. A capacitor Cb1 is connected to the source and drain of each of the memory cells Mb1 and Mb2.

A word line W1 is connected to the control gates of the memory elements Ma1 and Ma2. A word line W2 is connected to the control gates of the memory cells Ma2 and Mb2. A block 1a1, which is composed of the select transistor Tsa1, capacitor Ca1 and memory elements Ma1, Ma2 connected as described above, is connected to the main bit line Bla1. A block 1b1, which is composed of the select transistor Tsb1, capacitor Cb1 and memory elements Mb1 and Mb2 as described above, is connected to the main bit line Blb1.

The word lines W1, W2 . . . , which are commonly connected are connected to the level shifter circuit 2 through the switch 3. The switch 3 may be a multiplexer. In this case, each block is connected to the level shifter circuit 2 through the multiplexer.

The subsidiary bit line Blsa1 is connected to the threshold voltage detector circuit 4 through the switch 5, and the sub-lit line Blsb1 is also connected to the threshold voltage detector 4 through the switch 5.

The threshold voltage detector 4 may be a CMOS inverter composed of transistors (MOSFETs) T6 and T7.

The level shifter circuit 22 includes a CMOS inverter composed of transistors (MOSFETs) T2 and T3, a transistor (MOSFET) T4 with its input always set for "ON" and a transistor (MOSFET) T5 for positive-feedback of the output from the CMOS inverter to its input.

Figure 8A:
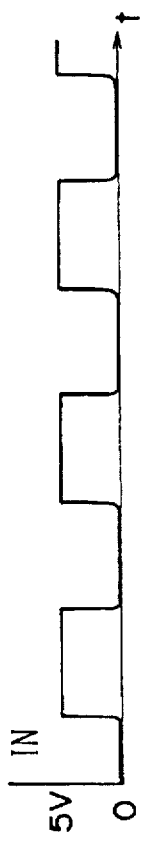
FIGS. 8A and 8B are waveform charts of an input pulse applied to a level shifter and an output pulse thereof.
Figure 8B:
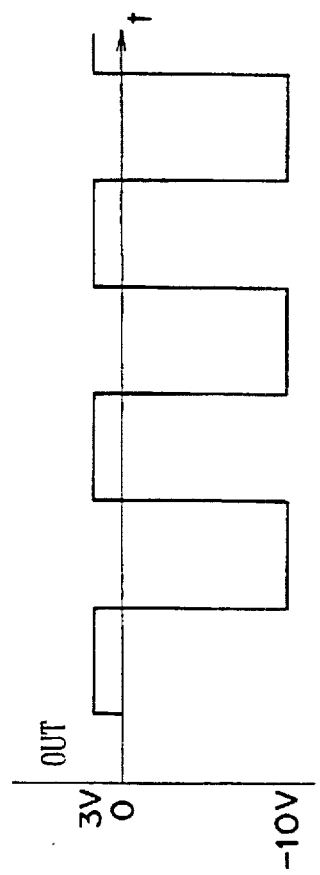

In operation, an input pulse wave having a peak value of 5V as shown in FIG. 8A is applied to the input stage of the level shifter 22. An output pulse wave varying between positive (3 V) and negative (−10 V) potentials is outputted from the output stage of the level shifter 22.

Specifically, a pulse signal having an "H" (high) level (5 V) and an "L" (low) level (0 V) is supplied at a predetermined period. The "L" level input leads to the "L" level output (−10 V) which will be applied to the word lines W1 and W2. The "H" level input leads to the "H" level output (3 V) which will be applied to the word lines W1 and W2.

In the threshold detector circuit 24, the voltage source Vdd applied to the source of the transistor T7 is set for the voltage twice as large as the floating gate voltage of each of the memory cells Ma1, Ma2, . . . during erasing.

Each of the blocks 1a1, 1b1, . . . constitutes a DRAM cell basically composed of a capacitor and a transistor connected thereto in series. For example, the block 1a1 substatially constitutes a DRAM cell composed of the select transistor Tsa1 using the select gate line ST1 as a word line and the capacitor Co comprising the supplementary capacitor Ca1 and the parasitic capacitane of the sub-bit line BLsa1, the non-voltatile memory elements Ma1, Ma2, . . . , etc.

Write/erase or refresh operations are made for the DRAM in an ordinary manner. The data once stored in the DRAM are transferred to predetermined memory elements or cells on a non-volatile semiconductor memory device.

Incidentally, if the parasitic capacitance based on the subsidiary bit line BLsa1 and non-volatile memory elements is relatively small, provision of the capacitor Ca1 is necessarily required. Though the parasitic capacitance, which has become smaller with miniaturization of memory elements, the capacitor Ca1 may be omitted, where the parasitic capacitance is 100 fF or more.

Figures 9A, 9B:
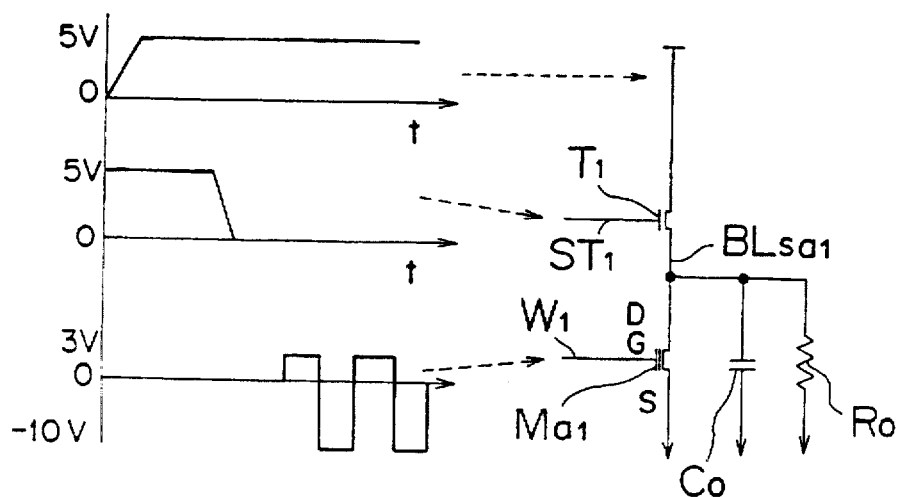
FIGS. 9A and 9B are an equivalent circuit diagram showing the main part of the memory shown in FIG. 7 and a waveform chart showing the voltage applied to it, respectively.

Referring to FIGS. 9A and 9B, an explanation will be given of the write/erase operation for the non-volatile semiconductor memory device shown in FIG. 7.

FIG. 9A is a circuit diagram showing the main part of FIG. 7. FIG. 9B shows the waveforms applied to the respective parts of the circuit. In FIG. 9A, T1 denotes a select transistor, Ma1 denotes a non-volatile memory element, Co denotes a parasitic capacitance and R0 denotes an equivalent resistance corresponding to a leakage current. In the following explanation, it is assumed that the leakage current is negligible.

The write/erase operation will be explained on the case where the non-volatile memory Ma1 has a high threshold voltage of 7 V or more.

With the select transistor T1 turned "on", a voltage of 5 V is applied to the subsidiary bit line BLsa1 to charge (precharge) the subsidiary bit line BLsa1 with the source line at ground potential. Thereafter, the select transistor Tsa1 is turned off to place the subsidiary bit line BLsa1 in a floating state. The capacitor component C0 including the capacitor Ca1 is charged.

Subsequently, a pulse signal as shown in FIG. 9B is applied to the control gate of the non-volatile memory element Ma1 through the word line W1. When a negative pulse (−10 V) is applied to the control gate of the memory element Ma1, a tunnelling current flows between the floating gate and the drain thereof so that the threshold voltage Vth is gradually lowered. When the threshold voltage Vth becomes sufficiently low, a channel current flows between the source and the drain. This channel current reduces the drain voltage (potential at the subsidiary bit line BLsa1) so that the tunnelling current stops to flow between the floating gate and the drain. Thus, the threshold voltage of the memory element Ma1 is lowered to be set for a constant value.

An explanation will be given of the case where the non-volatile memory Ma1 has a low threshold voltage of 2 V.

Like the above case, with the select transistor T1 turned "on", a voltage of 5 V is applied to the sub-bit line BLsa1 to charge (precharge) the subsidiary bit line BLsa1 with the source line at ground potential. Thereafter, the select transistor Tsa1 is turned off to place the sub-bit line BLsa1 in a floating state. The capacitor component C0 including the capacitor Ca1 is charged.

Subsequently, like the above case, a pulse signal as shown in FIG. 9B is applied to the control gate of the memory element Ma1 through the word line W1. When a positive pulse (3 V) is applied, the channel current flows between the source and the drain of the memory element Ma1 so that the drain voltage is lowered. Thus, even when a negative pulse (−10 V) is applied, the tunnelling current stops to flow between the floating gate and the drain. In this way, the positive pulses are applied so that charges are not further extracted from the floating gate of the non-volatile memory element with a low threshold voltage in an initial state. Namely, the excess erasure does not occur.

Thus, even when the erase operation are performed simultaneously for non-volatile memory elements with different threshold voltages, the excess erasure does not occur. Therefore, the operation of unifying the threshold voltages by the write operation before erasure which has been conventionally carried out is not required.

Figure 10:
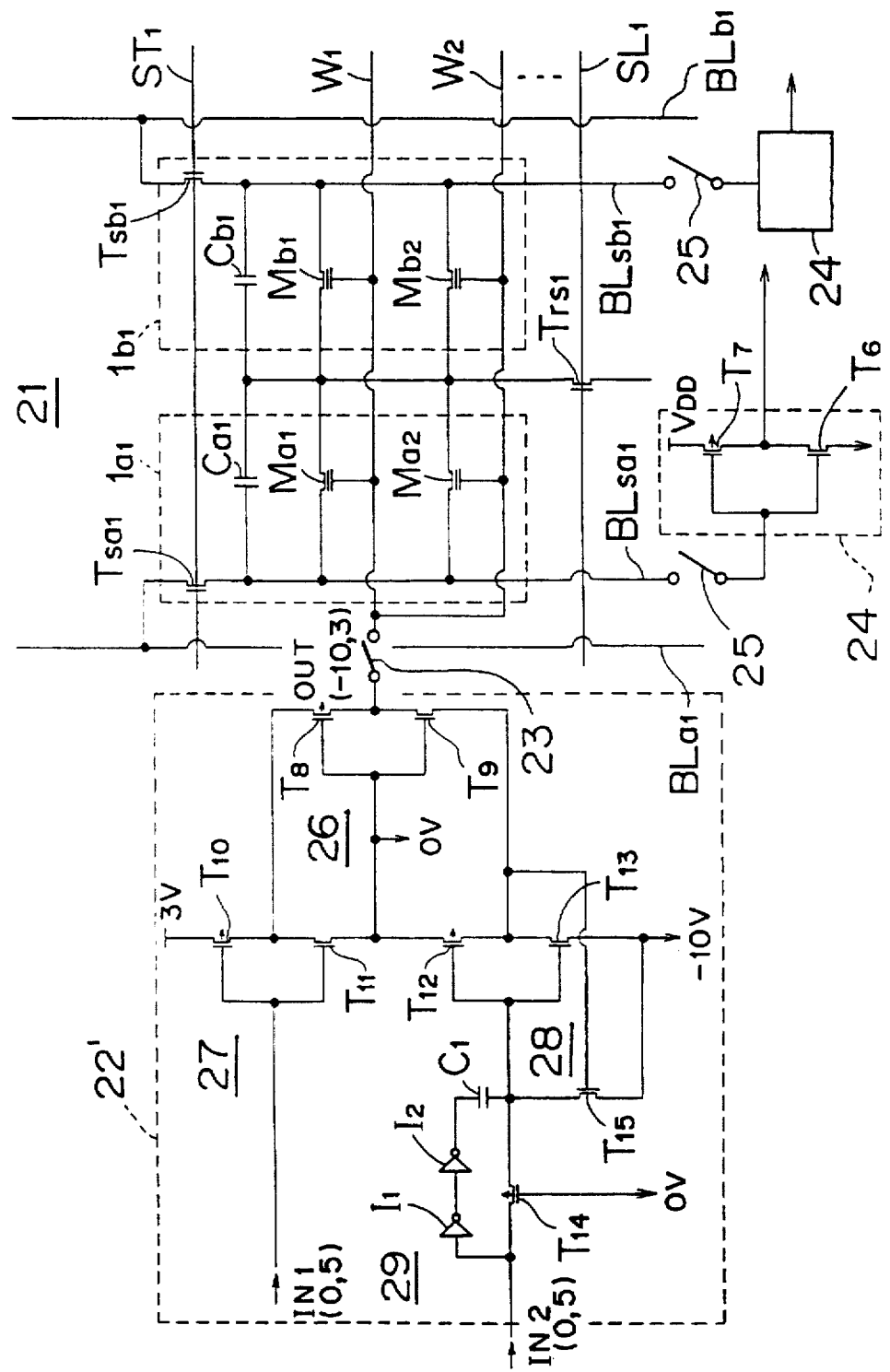
FIG. 10 is a circuit diagram of another non-volatile semiconductor memory device according to the second aspect of the present invention.

Referring to FIG. 10, an explanation will be given of another embodiment of the non-volatile semiconductor memory device according to the second aspect of the present invention.

The embodiment of FIG. 10 is different from that of FIG. 7 in only the construction of the level shifter circuit. So, the remaining circuit configuration will not be explained here.

A level shifter circuit 22' includes a CMOS inverter 26 composed of transistors (MOSFETs) T8 and T9, a CMOS inverter 27 composed of transistors (MOSFETs) T10 and T11, a CMOS inverter 28 composed of transistors (MOSFETs) T12 and T13, and a speed-up 6 circuit 29 composed of inverters I1, I2 and a capacitor C1, and transistors (MOSFETs) T14 and T15. The drains of the transistors T11 and T12 which are connected to each other are connected to the input terminal of the CMOS transistor 26. A voltage of 0 V is applied to the connection point.

The output terminal of the CMOS inverter 27 is connected to the source of the transistor T8. The output terminal of the CMOS inverter 28 is connected to the source of the transistor T8. The speed-up circuit 29 and the drain of the transistor T15 are connected to the input terminal of the CMOS inverter 28, and the gate of the transistor T15 is connected to the output thereof. The source of the transistor T15 is connected to a negative voltage source.

In operation, input pulse signals IN1 and IN2 each having a peak value of 5 V is applied to the input terminals of the CMOS inverters 27 and 28. A positive voltage of 3 V is applied to the source of the transistor T10 and a negative voltage of −10 V is applied to the drain of the transistor T13.

Figure 11A:
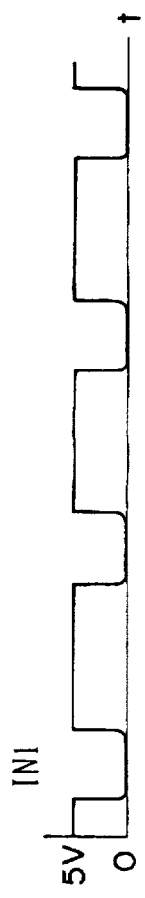
FIGS. 11A and 11B are waveform charts of input pulses applied to a level shifter and FIG. 11C is an output pulse thereof.
Figure 11B:
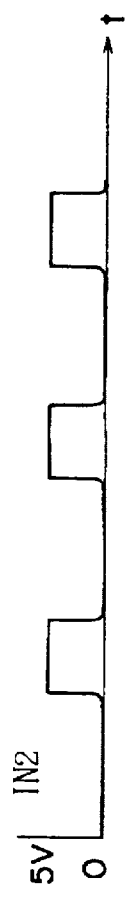
Figure 11C:
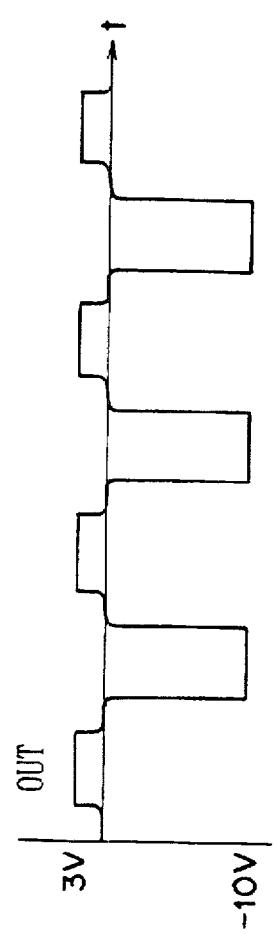

Referring to FIGS. 11A to 11C, an explanation will be given of the operation of the level shifter circuit 22'.

As shown in FIG. 11A, when an "L" level signal is supplied to the input terminal of the CMOS inverter 27, the transistor T10 turns on and the transistor T8 also turns on. On the other hand, an "L" level signal is supplied to the input terminal of the CMOS inverter 28 so that the transistor T12 remains "off" and the transistor T9 also remains "off". Thus, a voltage of 3 V is applied from the output terminal to the word lines W1 and W2.

Subsequently, when an "H" level signal is supplied to the input terminal of the CMOS inverter 27, the transistor T10 turns off. On the other hand, an "H" level signal is supplied to the input terminal of the CMOS inverter 28 so that the transistor T13 turns on. The transistor T9 also turns on. Thus, a voltage of −10 V is applied to the word lines W1 and W2

As a result, the pulse signal as shown in FIG. 11C is applied to the word lines W1, W2, . . . is applied so that the threshold voltages of the non-volatile memory elements are unified.

Figure 12A:
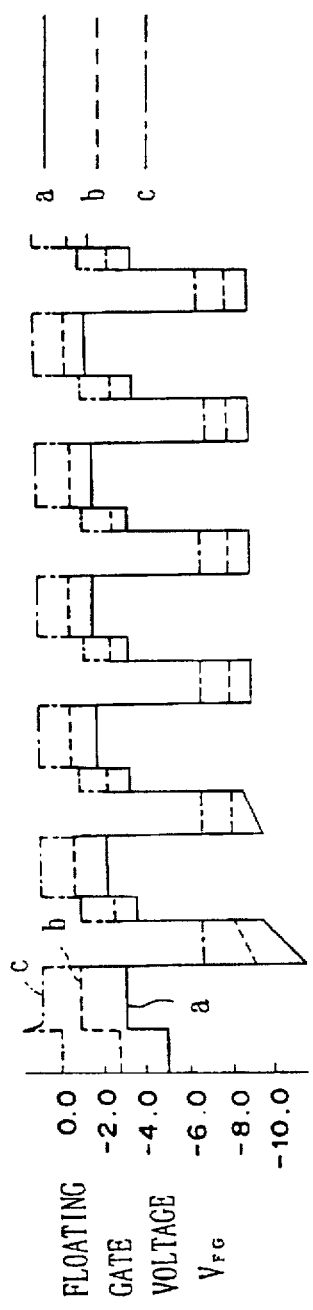
FIGS. 12A, 12B and 12C are waveform charts of a floating gate voltage, a bit line voltage and a control gate voltage in the memory device shown in FIG. 10, respectively.
Figure 12B:
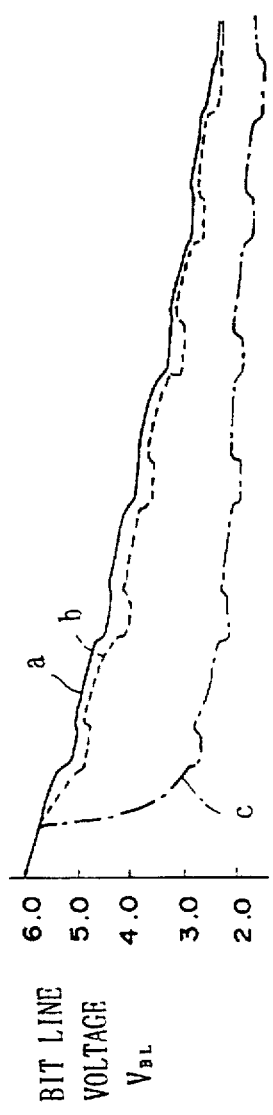
Figure 12C:
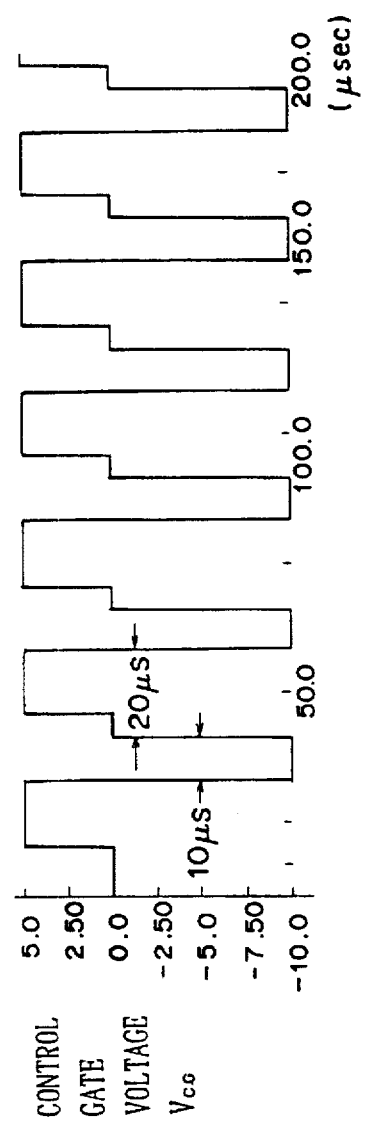

An explanation will be given of the case where there is more leak of the charges stored in the sub-bit line. Where the equivalent resistance R0 in FIG. 9A is small, i.e. the leakage current is large, the floating gate voltage $V_{FG}$ is hard to converge. FIGS. 12A to 12C show the waveforms at the respective portions in the non-volatile memory element for explaining such a case.

For the erasing operation of a non-volatile memory elements when a pulse signal having a peak value varying between 5 V and −10 V as shown in FIG. 12C is applied to the control gate, the floating gate voltage $V_{FG}$ oscillates in accordance with the width applied to the control gate. However, as shown in FIG. 12A, different floating gate voltages $V_{FG}$ of non-volatile memory elements (a), (b) and (c) do not easily converge into a predetermined threshold voltage $V_{TH}$. Further, as shown in FIG. 12C, the bit line voltages $V_{BL}$ of the non-volatile memory elements lower abruptly.

An explanation will be given of still another embodiment of the non-volatile memory device according to the second aspect of the present invention.

The embodiment of FIG. 13 is directed to the case where the leakage current is large, and a current supply circuit for compensating for the leakage current is provided. Specifically, in a memory cell array 21, a resistor Ra1 is connected between a main bit line Bla1 and a subsidiary bit line BLsa1. Where the leakage current is large, the charging voltage in the subsidiary bit line BLsa1 lowers abruptly. In order to obviate such a difficulty, it is intended that a current equal to the leakage current or more is supplied to the sub-bit line BLsa1 to restrain a decrease in the charging voltage. A resistor Rb1 is also connected in a like manner. The memory array 21 has the same configuration as that in FIGS. 7 and 10. The level shifter circuit may have the same configuration as that in FIGS. 7 and 10.

Figure 13A:
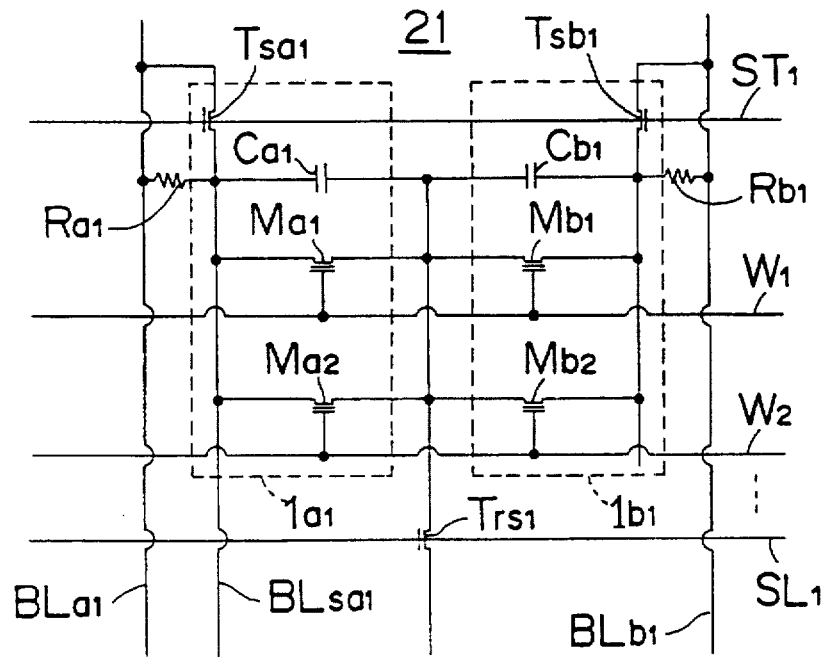
FIG. 13A is a circuit diagram of still another non-volatile semiconductor memory device according to the second aspect of the present invention.
Figures 13B, 13C:
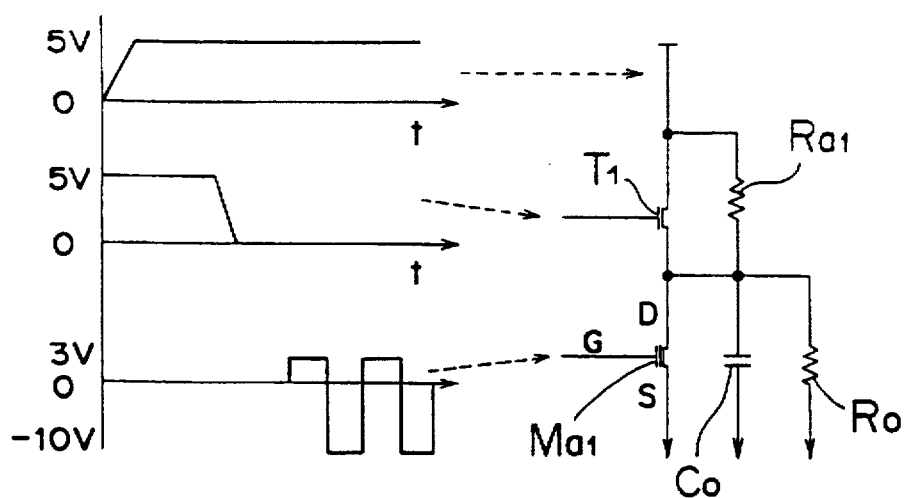
FIGS. 13B and 13C are an equivalent circuit diagram showing the main part of the memory shown in FIG. 13A and a waveform chart showing the voltage applied to it, respectively.

FIG. 13B shows an equivalent circuit of the main part in the circuit of FIG. 13A. FIG. 13C shows the voltage waveforms applied to the respective parts thereof. In FIG. 13B, symbol CO denotes a capacitance component generated in the sub-bit line, symbol R0 denotes an equivalent resistance set by the voltage applied to the sub-line and the leakage current, and symbol Ra1 denotes a resistance for supplying the current equal to the leakage current or more.

Figure 14A:
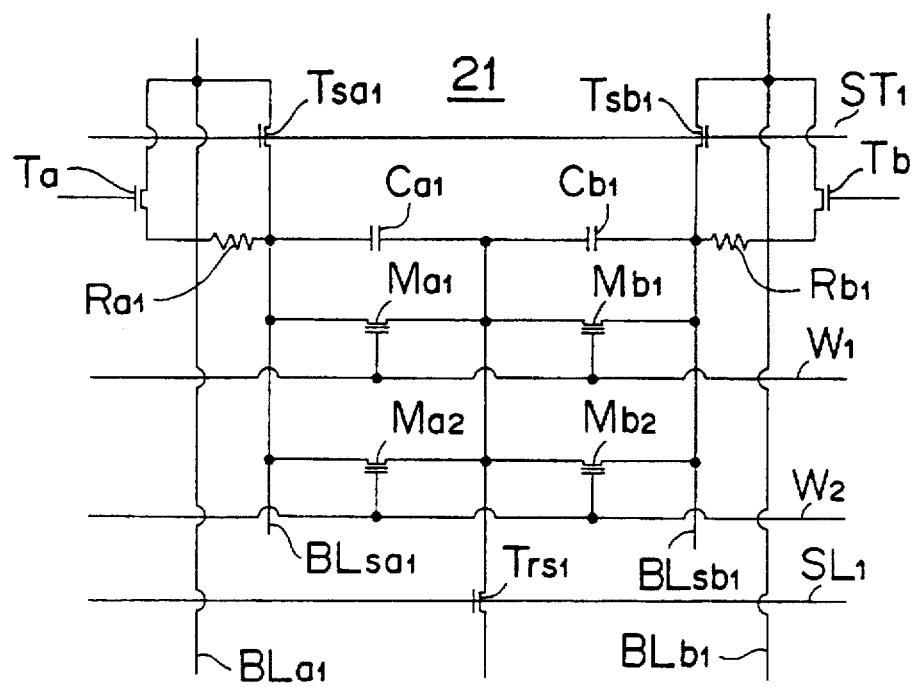
FIG. 14A is a circuit diagram of a further non-volatile semiconductor memory device according to the second aspect of the present invention.
Figures 14B, 14C:
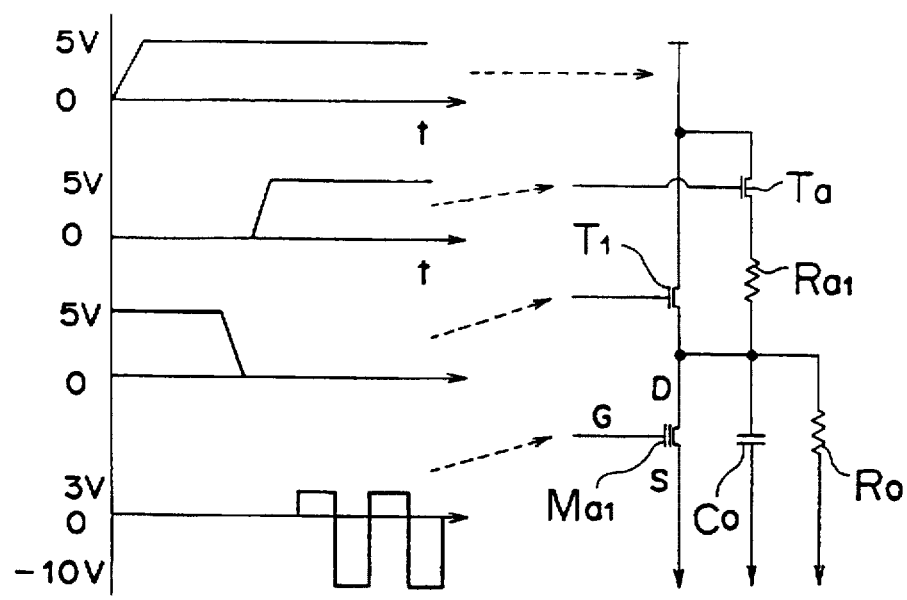
FIGS. 14B and 14C are an equivalent circuit diagram showing the main part of the memory shown in FIG. 14A and a waveform chart showing the voltage applied to it, respectively.

Referring to FIGS. 14A to 14C, an explanation will be given of a further embodiment of the non-volatile semiconductor memory device according to the second aspect of the present invention.

In FIG. 14A, a memory cell array 21 has the same configuration as the above embodiment. A current supply circuit for compensating for a leakage current is composed of a transistor (MOSFET) Ta and a resistor Ra1 connected in series. The drain of the transistor Ta is connected to the main bit line BLa1. The source thereof is connected to one end of the resistor Ra1. The other end of the resistor Ra1 is connected to the subsidiary bit line BLsa1. A transistor Tb and a resistor Rb1 are also connected in a like manner.

In this embodiment, the charges stored in the sub-bit line can be held for a long time by turning on the transistor Ta. Therefore, a select transistor Tsa1 is used as a transfer gate and a subsidiary bit line is used as a capacitor to constitute a DRAM (dynamic RAM). The read operation for the DRAM can be carried out in such a manner that with the transistor Tsa1 turned "on", a low voltage (1 to 2 V) is applied to a memory cell to measure the current therefrom.

The floating gate of the memory element can be charged by the method in which with the select transistor Tsa1 turned "off", a sufficiently high voltage is applied to a word line to inject charges (hot electrons) into the floating gate, and the method in which a sufficiently large potential difference is given between the semiconductor substrate and the word line to charge the floating gate by the tunnelling current flowing the thin oxide film.

The charges can be extracted from the floating gate in such a manner that with the main bit line BLa1 placed at a high potential side, the select transistor turned "on" and the transistor Ta turned "off", the current equal to the leakage current or more is supplied to the subsidiary bit line through a high resistance. It is needless to say that diodes in reverse-bias connection may be used instead of the resistors Ra1 and Ra2.

In the embodiments of FIGS. 13 and 14, the first time constant based on the equivalent resistance R0 and the capacitance component CO is set for a smaller value than the second time constance based on the resistor Ra1 and capacitance component. For example, assuming that the resistance of the resistor Ra1 is 100 MΩ, the second time constant based on it and the capacitance component including the floating capacitance is set for 15 to 50 μsec, and the period of the pulse applied to the floating gate of the non-volatile memory element is set for about 30 μsec.

In this way, the second time constant is made smaller than the first time constant and the second time constant is made not shorter than half the period of the pulse applied to the control gate of the non-volatile memory element. This is for the following reason.

Where the leakage of charges stored in the bit line is great, when a current is supplied to the drain electrode side of the non-volatile memory cell through the resistor Ra1, this supplied current must be larger than the leakge current. However, for the memory cell in which the electrons in the floating gate has been sufficiently extracted, the further extraction of elelctrons must not occur. In other words, current supply for restoring the drain potential is not required for such a memory cell. The time necessary to restore the drain potential is defined by the second time constant. Therefore, the second time constant is preferably smaller than the first time constant and about half as large as the period of the applied pulse.

Figure 15A:
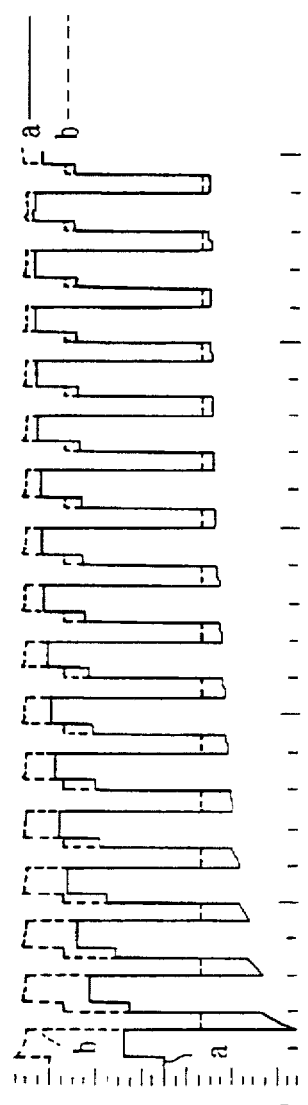
FIGS. 15A, 15B and 15C are waveform charts of a floating gate voltage, a bit line voltage and a control gate voltage in the memory device shown in FIG. 14A, respectively.
Figure 15B:
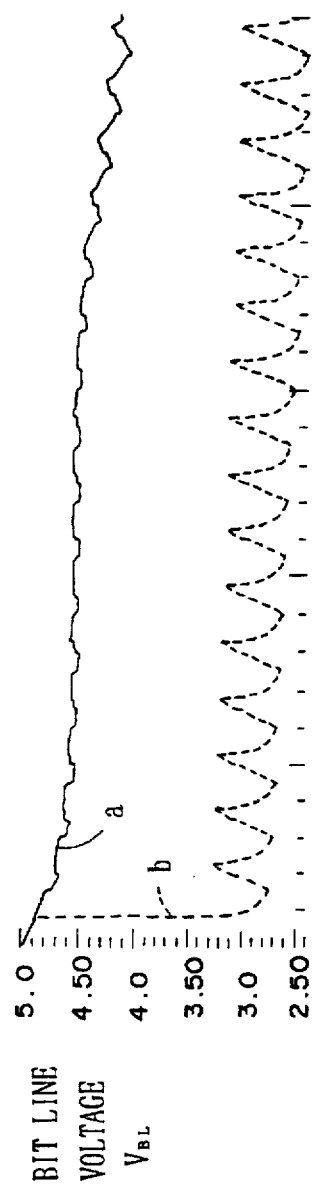
Figure 15C:
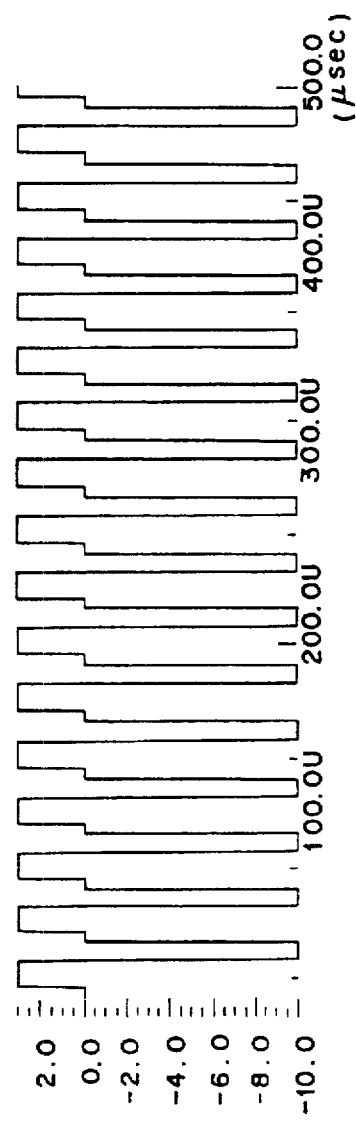

FIGS. 15A to 15C show the operation state of non-volatile memory elements (a) and (b) with different floating gate voltages $V_{FG}$. The pulse signal varying between positive (3 V) and negative (−10 V) potentials and having a period of about 30 μsec is applied to the floating gate. As shown in FIG. 15A, the floating gate voltage $V_{FG}$ varies in accordance with the pulse period. The floating gate voltages $V_{FG}$ of the non-volatile memory elements (a) and (b) gradually converge into a predetermined voltage. On the other hand, as seen from (b) of FIG. 15B, the bit voltage $B_{BL}$ (drain voltage) of the memory element (b) pulsates owing to a fall due to the leakage current and a rise due to the supplied current as the charges stored in the floating gate are extracted. But, as seen from (a) in FIG. 15B, the drain voltage of the memory element (a) has a sufficiently high potential until the charges stored in the floating gate are sufficiently extracted. On completion of the charge extraction, the drain voltage start to pulsate owing to a rise due to the supplied current and a fall due to the leakage current.

Figure 16:
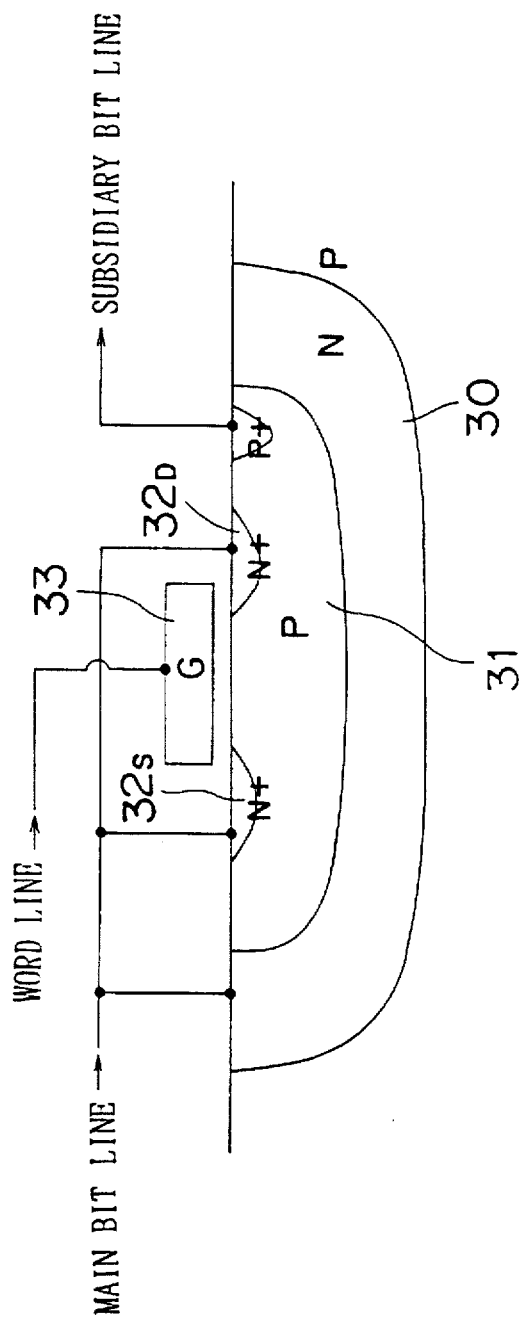
FIG. 16 is a sectional view showing another example of current supply means.

The leakage current can be compensated for by the diode equipped with a gate as shown in FIG. 16. A P-type well region 31 is formed in an N-type semiconductor layer 30, and N-type source/drain regions 32s and 32d are formed in the P-type well region 31. A gate electrode 33 is formed on the channel region.

A main bit line is connected to the N-type source/drain regions 32s and 32d and the N-type semiconductor layer 30. A word line is connected to the gate electrode 33. A sub-bit line is connected to the P-type well 31. In such a structure, if the pulse signal applied to the gate electrode 33 is synchronized with the voltage applied to the word line, a change in the drain voltage can be reduced.

The causes of the leakage current are the tunnelling current flowing between the floating gate and drain which results from a negative gate voltage and lattice defects around the drain diffused layer. The former is the main cause.

In the embodiment, a current is supplied to the drain in synchronism with the leakage current so that a chance in the drain voltage can be reduced.

As described above, the non-volatile semiconductor memory device according to the second aspect of the present invention includes means for supplying a current larger than the leakage current to the subsidiary bit line so as to maintain the potential precharged in the subsidiary bit line or main bit line. Namely, the current source composed of a voltage source and resistor as described in the embodiments is connected to the subsidiary bit line or main bit line. The current source circuit should not be limited to those used in the embodiments, but can be realized by several known circuits.

The memory cell array should not be also limited to those used in the embodiments. For example, where a source line and a subsidiary source line are provided, the leakage current can be compensated for by connecting the current supply circuit to the source line and subsidiary source line. In this case, the drain of the transistor Ta1 is connected to the subsidiary source line and the source thereof is connected to the source line.

The memory cell array may be composed of plural blocks each including plural non-volatile semiconductor memory cells which are connected to the main bit line.

As described above, in accordance with the second aspect of the present invention, with the subsidiary bit line precharged, a pulse signal varying positive and negative potentals is applied to the floating gates of the non-volatile memory elements through a level shifter so that different floating gate voltages can be converged into a predetermined voltage. For this reason, the write/erase operation for the non-volatile semiconductor memory device can be executed very easily.

Even where the charging potential in the sub-bit line is lowered owing to the leakage current, provision of the current supply means for compensating for the leakage current permits the charges stored in the floating gate to be erased with the potential maintained at the sub-bit line. Thus, the non-volatile memory elements with different floating gate voltages can be set for a predetermined threshold voltage.

The non-volatile semiconductor memory device according to the second aspect of the present invention, in which sufficient precharging is made for the subsidiary lines, can operate in a stabilized manner as a DRAM.

Aspect III

Now referring to the drawings, an explanation will be given of several embodiments of the non-volatile memory device according to the third aspect of the present invention.

FIG. 17A is a circuit diagram of one embodiment of the non-volatile semiconductor memory device.

As seen from FIG. 17A, the non-volatile semiconductor memory device includes a memory cell array 41 composed of non-volatile memory elements, a pulse height setting circuit 42, a switch circuit 43 (e.g. multiplexer) and peripheral circuits inclusive of row/column decoder circuits and sense amplifier circuits (not shown).

In the memory cell array 41, the drain of a select transistor Tsa1 is connected to a main bit line BLa1, and the source of the select transistor Tsa1 is connected to a sub-bit line BLsa1. The drains of memory elements Ma1 and Ma2 are connected to the subsidiary bit line BLsa1 and the sources thereof commonly connected are connected to the drain of a source side select transistor Trs1 through a source line. A source side select line SL1 is connected to the control gate of the source side select transistor Trs1. A capacitor Ca1 is connected between the source and drain of each of the memory elements Ma1 and Ma2.

On the other hand, the drain of a select transistor Tsb1 is connected to a main bit line BLb1 and the source thereof is connected to a subsidiary bit line BLsb1. A capacitor Cb1 is connected to the source and drain of each of the memory cells Mb1 and Mb2.

Incidentally, if the parasitic capacitance based on the sub-bit line BLsa1 and non-volatile memory elements Ma1 and Ma2 is relatively small, provision of the capacitor Ca1 is necessarily required. Though the parasitic capacitance, which has become smaller with miniaturization of memory elements, the capacitor Ca1 may be omitted, where the parasitic capacitane is 100 fF or more.

A word line W1 is connected to the control gates of the memory elements Ma1 and Mb1. A word line W2 is connected to the control gates of the memory cells Ma2 and Mb2. The word lines W1, W2, . . . are connected to the switch circuit 43. The switch circuit 43 is connected to the pulse peak value setting circuit 42. The switch circuit 43, which may be a switch, serves to successively apply an output pulse signal from the pulse peak value setting circuit 42 to the word lines W1, W2, . . . through the switch circuit 43.

With a common word line connected to each of the blocks each composed of plural memory elements, charges stored in the memory elements may be successively erased.

The configuration of the pulse peak value setting circuit 42 will be explained. A P-channel transistor (MOSFET) T1 and an N-channel transistor (MOSFET) T2 constitute a CMOS inverter. The source of the transistor T1 is connected to transistors (MOSFETs) T3 and T4. The source of the transistor T2 is connected to a negative voltage source (−10 V). The drains of the transistors T1 and T2 are connected to the gate of a transistor (MOSFET) T5 for speed-up, and the drain of the transistor T5 is connected to the commonly connected gates of the transistors T1 and T2 and a transistor T6 for self-biasing. A first (4 V) and a second (5 V) voltage source are connected to the drains of the transistors T3 and T4 with their gate electrodes commonly connected.

In the pulse peak value setting circuit 42, an input signal IN1 is inputted to the drain of the transistor T6, and an input signal IN2 is inputted to the gates of the transistor T3 and T4. From the output stage of the circuit 42, an output pulse signal composed of 5 V (peak value) positive pulses at a predetermined period, 4 V (peak value) positive pulses superposed between the 5 V positive pulses and −10 V (peak value) negative pulses is applied to the word lines W1 W2, . . . through the switch circuit 3.

The output pulse signal from the pulse peak value setting circuit 42 is applied to the control gates of the memory elements through the switch circuit 43 and the word lines so that the charges stored in the floating gates of the memory elements which are placed in a floating state are extracted to unify the threshold voltages of the memory elements into a predetermined value or range.

Figure 18:
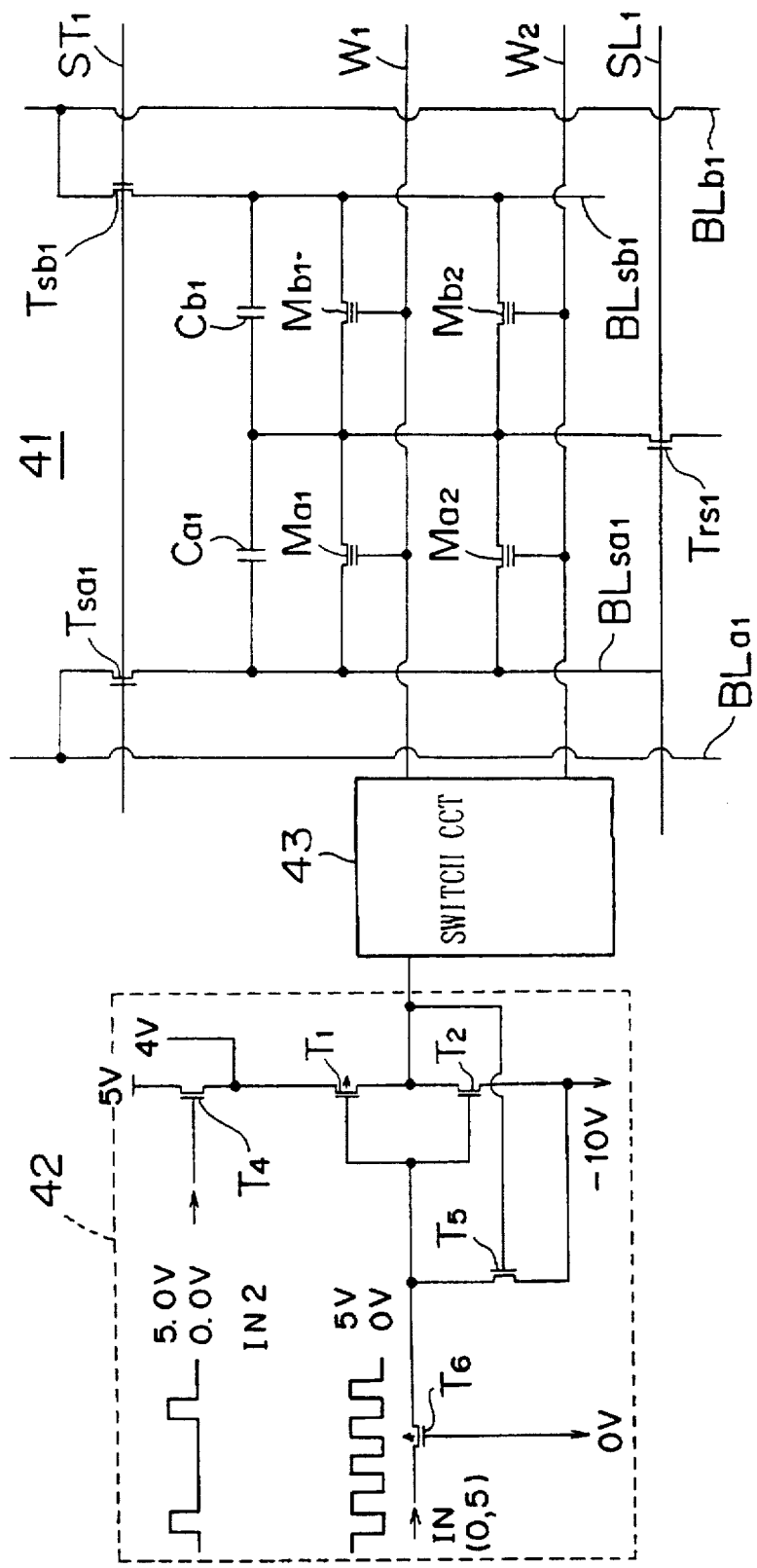
FIG. 18 is a circuit diagram of another embodiment of the non-volatile memory according to the third aspect of the present invention.

FIG. 18 shows another embodiment of the non-volatile semiconductor memory device according to the third aspect of the present invention.

In a pulse peak value setting circuit 2 shown in FIG. 18, unlike the embodiment of FIG. 17A, the source of the transistor T1 of the CMOS inverter is connected to a 4 V voltage source and also the source of the transistor T4 the drain of which is connected to the 5 V voltage source. The remaining circuit configuration is the same as that of FIG. 17. Thus, although the input signals IN1 and IN2 different from those in FIG. 17B are inputted, the resultant output pulse signal is the same as that in FIG. 17B.

Referring to FIGS. 19A to 19C, an explanation will be given of the operation of the circuit shown in FIG. 18. FIGS. 19A, 19B and 19C show the waveforms of a floating gate voltage $V_{FG}$, a drain voltage (bit line voltage $V_{BL}$) and a control gate voltage $V_{CG}$.

The pulse signal shown in FIG. 19C is composed of 3 V (peak value) positive pulses (A) at a predetermined period, 2.5 V (peak value) positive pulses (B) superposed between the pulses (A) and −10 V (peak value) negative pulses. Such a pulse signal is applied to the control gates. The peak value of the positive pulses (A) applied to the control gates should not be limited to 3 V, but may be 5 V.

The peak value of the 2.5 V pulses (B) may be −5 V. Further, the peak value of the pulses (B) can be set within a range between 3 V (or 5 V) and −10 V, and should not be limited to 2.5 V and −5 V.

In operation, after the select transistors Tsa1 and Trs1 are turned on to charge the subsidiary bit line BLsa1 and capacitor Ca1, etc., the select transistor Tsa1 is turned off to place the memory elements Ma1 and Ma2 in a floating state. Subsequently, when the pulse signal (control gate voltage $V_{CG}$) as shown in FIG. 19C is applied to the word line W1 through the switch circuit 43, the charges stored in the floating gate of the memory element Ma1 are extracted. As seen from (a), (b) and (c) of FIG. 19, different floating gate voltages $V_{FG}$ will be converged when about 300.0 μsec passes. The bit line voltages $V_{BL}$ have the waveforms as shown in (a), (b) and (c) of FIG. 19B. The difference in these waveforms is due to the initial values of the floating gate voltages and the leakage currents generated in the bit lines.

Figure 20:
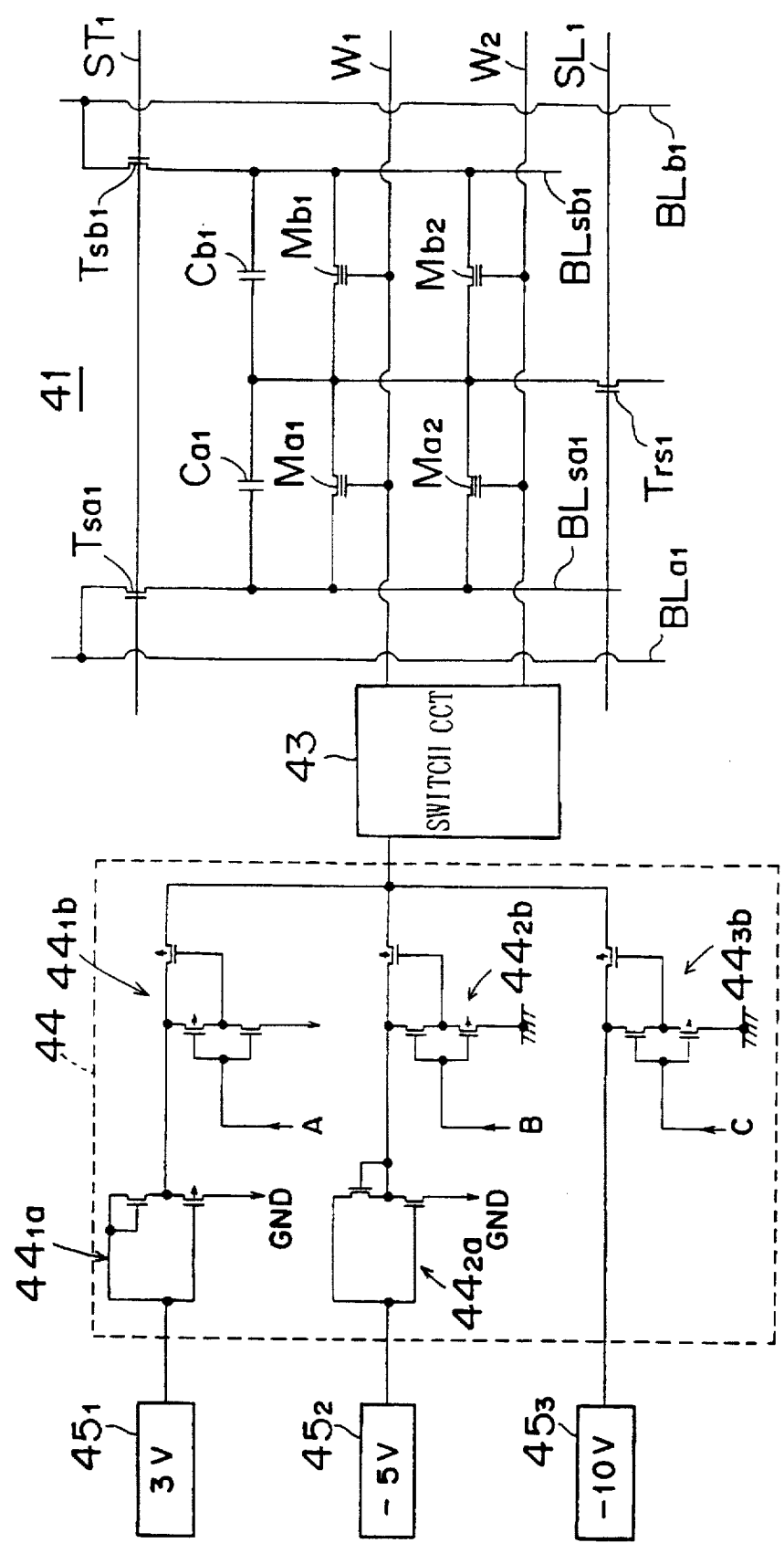
FIG. 20 is a circuit diagram of still another embodiment of the non-volatile memory device according to the third aspect of the present invention.

FIG. 20 shows still another embodiment of the non-volatile semiconductor memory device according to the third aspect of the present invention.

The pulse peak value setting circuit 44 is composed of a switch circuit 44 and voltage source circuits $45_1$, $45_2$, and $45_3$. The switch circuit 44 is composed of a buffer $44_{1a}$ and a switch $44_{1b}$; a buffer $44_{2a}$ and a switch $44_{2a}$ and a switch $44_{3b}$. The outputs from the switches $45_1$, $45_2$, and $45_3$, which are commonly connected, is connected to the switch circuit 43. Voltages 3 V and −5 V outputted from the voltage sources $45_1$ and $45_2$ are inputted to the switches $44_{1b}$ and $44_{2b}$ through the buffers $44_{1a}$ and $44_{2a}$. A voltage of −10 V from the voltage source $45_3$ is inputted to the switch $44_{3b}$.

Referring to FIG. 21, an explanation will be given of the operation of the embodiment of FIG. 20.

Figure 21A:
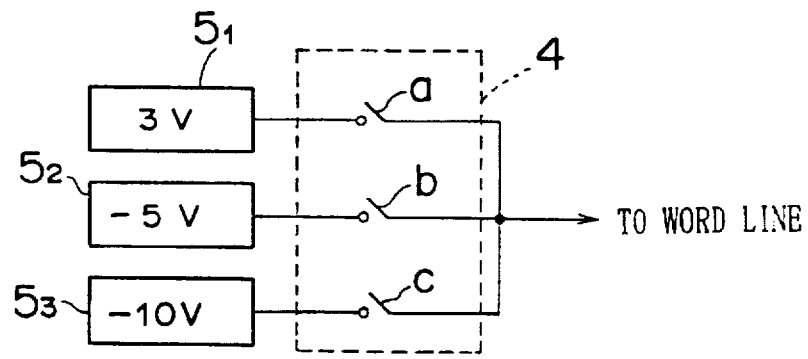
FIG. 21A is an equivalent circuit diagram of the embodiment of FIG. 20.
Figure 21B:
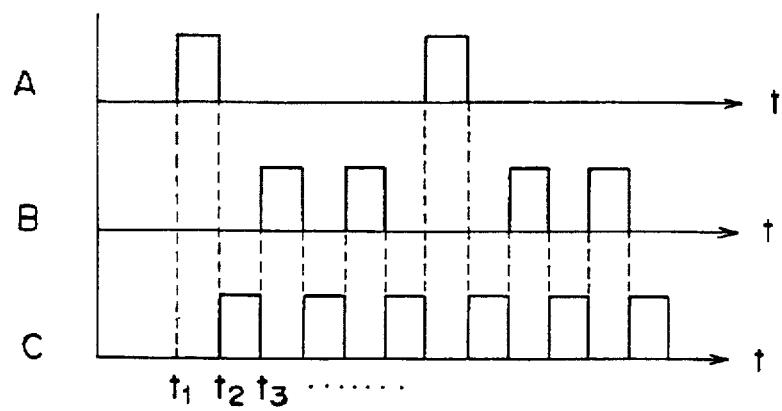
FIG. 21B is a waveform chart showing the operation timings of a switch.
Figure 21C:
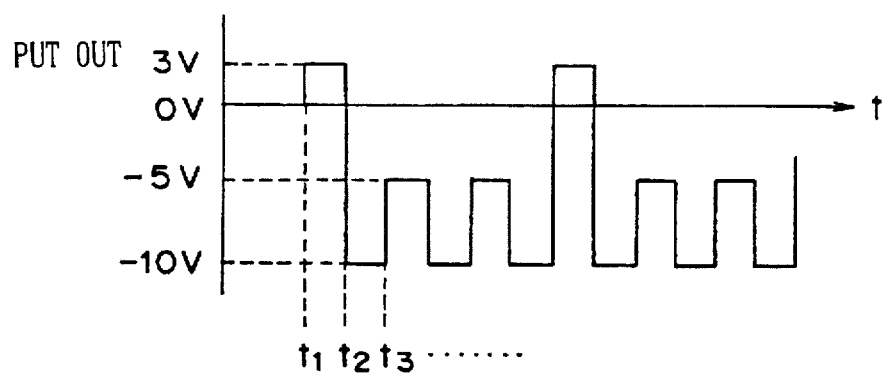
FIG. 21C is a waveform chart showing a composed pulse.

The equivalent circuit of the switch circuit 44 shown in FIG. 20 is shown in FIG. 21A. The switches $44_{1b}$ to $44_{3b}$ are labelled a to c. Timings of select signals for controlling these switches are shown in FIG. 21B. The output from the switch circuit 44 is shown in FIG. 21C.

At a timing t1, when the switch a is turned on and the switches b and c are turned off, a 3 V (peak value) positive pulse is outputted. At a timing t2, when the switch c is turned on and the other switches are turned off, a −10 V (peak value) negative pulse is outputted. At a timing t3, when the switch b is turned on and the other switches are turned off, a −5 V (peak value) negative pulse is outputted. In this way, by controlling the switches a, b and c, a composed pulse signal is applied to the control gates of the memory elements the switch circuit 3.

FIG. 21 shows a further embodiment of the non-volatile semiconductor memory device according to the third aspect of the present invention.

Figure 22A:
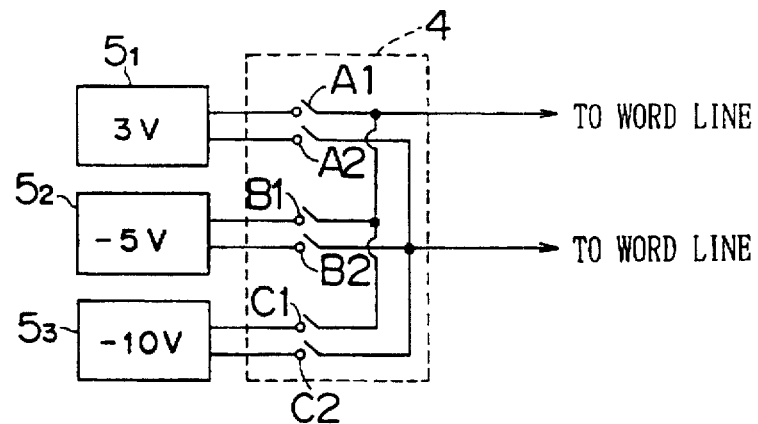
FIG. 22A is another equivalent circuit diagram of the embodiment of FIG. 20.

As seen from FIG. 22A, the switch circuit 44 is composed of switches A1, B1, C1, A2, B2 and C2. The one ends of the switches A1 and A2 are connected to a voltage source (3 V) $45_1$, those of the switches B1 and B2 are connected to a voltage source (−5 V) $5_2$, and those of the switches C1 and C2 are connected to a voltage source (−10 V). The other ends of the switches A1, B1 and C1 are commonly connected. The other ends of the switches A2, B2 and C2, which are also commonly connected, are connected to the word lines through the switch circuit (e.g. multiplexer) 43.

Figure 22B:
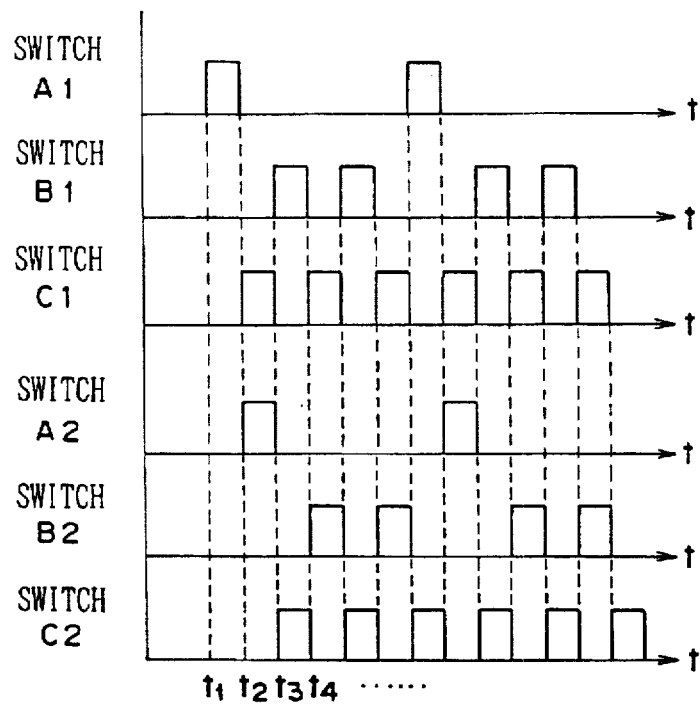
FIG. 22B is a waveform chart showing the operation timings of a switch.
Figure 22C:
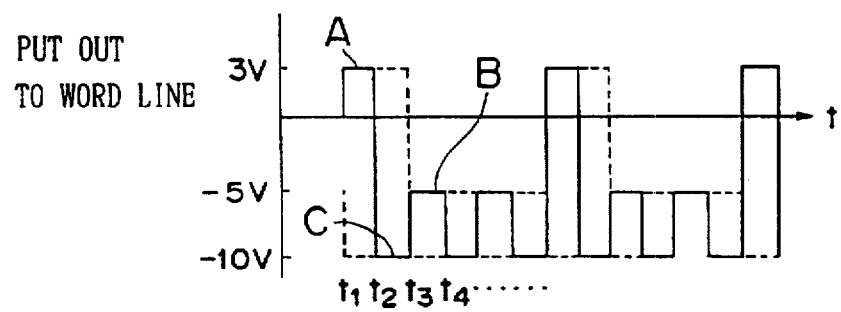
FIG. 22C is a waveform chart showing a composed pulse.

Referring to FIGS. 22B and 22C, a composed pulse will be explained. At a timing t1, when the switch A1 is turned on, a 3 V (peak value) positive pulse is outputted. At a timing t2, when the switch C1 is turned on, a −10 (peak value) negative pulse is outputted. At a timing t3, when the switch B1 is turned on, a −5 V (peak value) negative pulse is outputted. At the timing t2, when the switch A2 is turned on, a 3 V positive pulse indicated by a dotted line is outputted. Subsequently, at the timing t3, when the switch C2 is turned on, a −10 V (peak value) negative pulse is outputted.

Incidentally, as extraction of charges from the floating gate is completed, the pulsation in the drain voltage constitutes noise in detecting reduction in the drain voltage. It obstructs the detection of the threshold voltage of the memory element. The pulsation can be decreased by decreasing the pulse width in the word line, which increases power consumption. However, by setting three levels A, B and C of the pulse signal applied to the control gates for 3 V, −5 V (as negative as possible) and −10 V, the charges charged/discharged through the word line can be decreased to reduce power consumption.

It is needless to say that a large leakage current also obstructs the erase and write operation. This can be compensated for by the current supply means for supplying the current equal to the leakage current generated by the memory element.

Figures 23A, 23B:
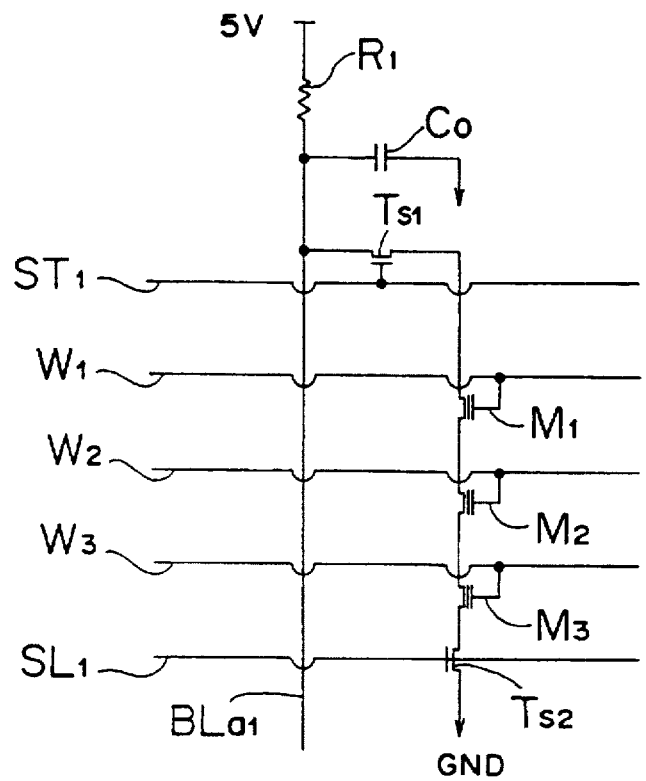
FIG. 23A is a circuit diagram showing a further embodiment of the non-volatile semiconductor memory device according to the third aspect of the present invention.
FIG. 23B is a table for explaining an erasing operation.

FIGS. 23A and 23B show a further embodiment of the non-volatile semiconductor memory device according to the third aspect of the present invention which is an NAND gate type EEPROM.

In FIG. 23A, memory elements (cells) M1 to M3 are connected in series between select transistors Ts1 and Ts2. The control gates of these memory elements M1, M2 and M3 are connected to word lines W1, W2 and W3, respectively. The drain of the select transistor Ts1 is connected to a bit line BLa1 and connected to a voltage source (5 V) through a resistor R1. ST1 and ST2 denote select lines.

The potentials on the respective word lines necessary to extract the charges from the floating gates of the cells M1 to M3 are shown in the table of FIG. 23B.

For example, when the cell 1 is to be erased, with the select lines ST1 and ST2 and the word lines W2 and W3 placed at "H" level, the pulse signal as described in the above embodiments is applied to the word line W1 so that the charges stored in the floating gate of the cell 1 can be surely extracted. The pulse signal may be also composed of pulses varying between negative and positive potentials.

The resistor R1 is a resistor for supplying a minute current which is the simplest current supplying means for compensating for the leakage current. If the bit line cannot gives sufficient capacitance, a capacitor CO is provided.

As described above, the non-volatile semiconductor memory device according to the third aspect of the present invention intends to apply a pulse signal varying between positive and negative potentials to the control gates of memory elements so that the charges stored in the gates are extracted so as to make an erase/write operation. When pulses having a peak value higher than a predetermined normal potential are applied at a predetermined period, the channel conductance of the memory element increases temporarily so that the drain potential decreases abruptly.

Thus, reduction in the threshold voltage can be easily detected.

The application of the pulses with the potential higher than a predetermined potential, which promotes high speed charging/discharging, for word lines, gives rise to an increase in power consumption. However, this defect can be obviated by superposing lower (negative) potential pulses between the higher potential pulses. That is, the pulses with the higher potential serve to set the threshold voltage and the superposed pulses with a negative potential serve to reduce power consumption.

In accordance with the third aspect of the present invention, by applying a pulse signal to word lines to perform the erase/write operation, the threshold voltages can be properly detected in a stabilized manner and also the operation time can be reduced.

Further, charges can be simultaneously extracted from the floating gates of a large number of memory elements, and the threshold voltages can be unified accurately.

Aspect IV

Now referring to the drawings, an explanation will be given of one embodiment of the non-volatile semiconductor memory device according to the fourth aspect of the present invention.

First, for comparison to the fourh aspect, a further improvement required in the present invention described above will be explained.

Figures 40A, 40B:
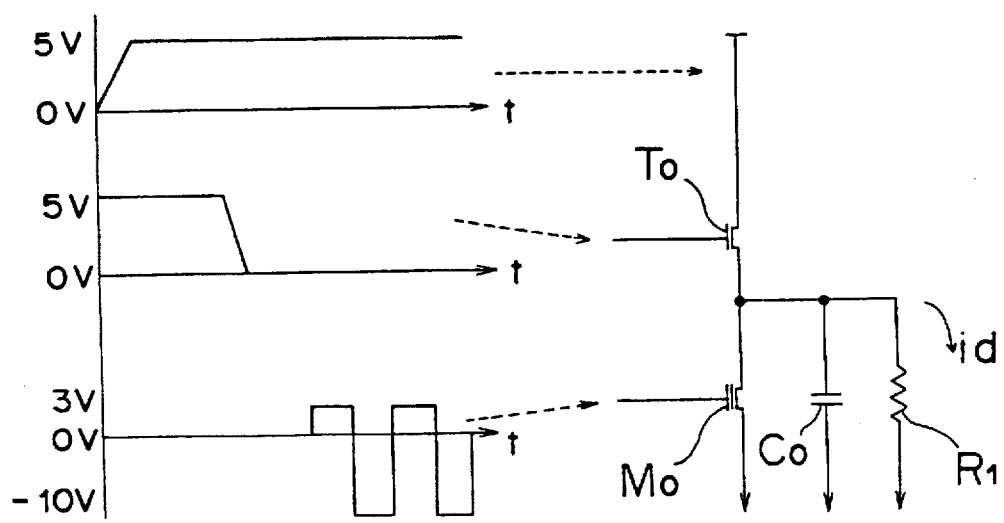
FIGS. 40A and 40B are an equivalent circuit diagram of the non-volatile semiconductor memory and a waveform chart for explaining its operation, respectively.

The means for making uniform the threshold voltages of floating gate type memory transistors was proposed by inventors of this application. This proposal is to apply pulses to the control gate of a memory transistor in a floating condition to extract the charges stored in the floating gate so that the threshold voltages are converged. FIGS. 40A and 40B are an equivalent circuit diagram showing the proposal and an operation waveform chart, respectively.

In FIG. 40A, symbol TO denotes a selection transistor and symbol MO denotes a non-volatile memory transistor. In operation, as seen from the waveform chart of FIG. 40B, a voltage of 5 V as a drain voltage is applied to the drain of the selection transistor TO and a voltage of 5 V is applied to the selection gate thereof. Thereafter, the drain of the memory transistor MO is placed in the floating state. Subsequently, pulses which oscillate positively and negatively at a predetermined period are applied to the control gate of the memory transistor MO to extract redundant charges so that the threshold voltage is lowered.

Figures 41A, 41B, 41C:
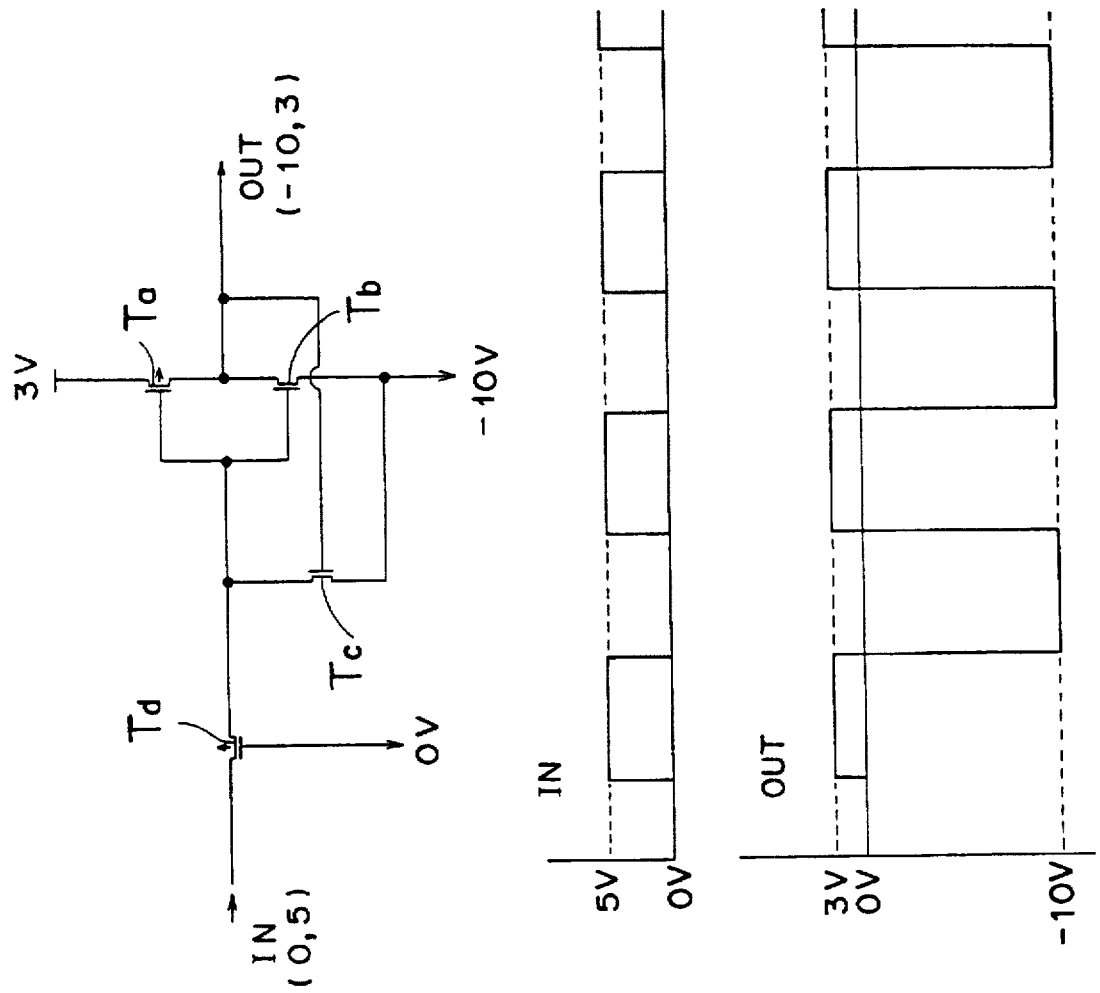
FIG. 41A is a circuit diagram of an example of a pulse generating circuit.
FIGS. 41B and 41C are waveform charts for explaining its operation.

An exemplary circuit for generating pulses is shown in FIG. 41A. In FIG. 41A, a CMOS inverter is composed of a PMOS transistor Ta and an NMOS transistor Tb. To its input stage a self-biased transistor Td is connected. To its input and output terminals the drain and control gate of a speed-up transistor Ta are connected, respectively. To the source of the PMOS transistor Ta a 3 V voltage source is connected. To the drain of the NMOS transistor a (−) 10 volt source is connected.

FIG. 41B shows an input signal IN with a peak value of 5 V. FIG. 41C shows an output signal OUT ranging from −10 V to 3 V.

FIGS. 42A to 42C show changes in the potentials on the floating gate and bit line when a pulse-like control voltage $V_{CG}$ is applied to the control gate of a memory transistor. Specifically, when the pulses as shown in FIG. 42C are applied to the control gate, different floating gate voltages $V_{FG}$ in an initial state are converged into a predetermined threshold voltage within about 100 μsec as shown in (a), (b) and (c) in FIG. 42A. Then, as shown in (a), (b) and (c) of FIG. 42B, the bit voltages change. However, if an equivalent resistance R1 is small, a large leakage current id flows. As a result, as shown in FIG. 43A, the waveforms (a), (b) and (c) of the floating gate voltage $V_{FG}$ are not converged after lapse of 200 μsec.

Figure 24:
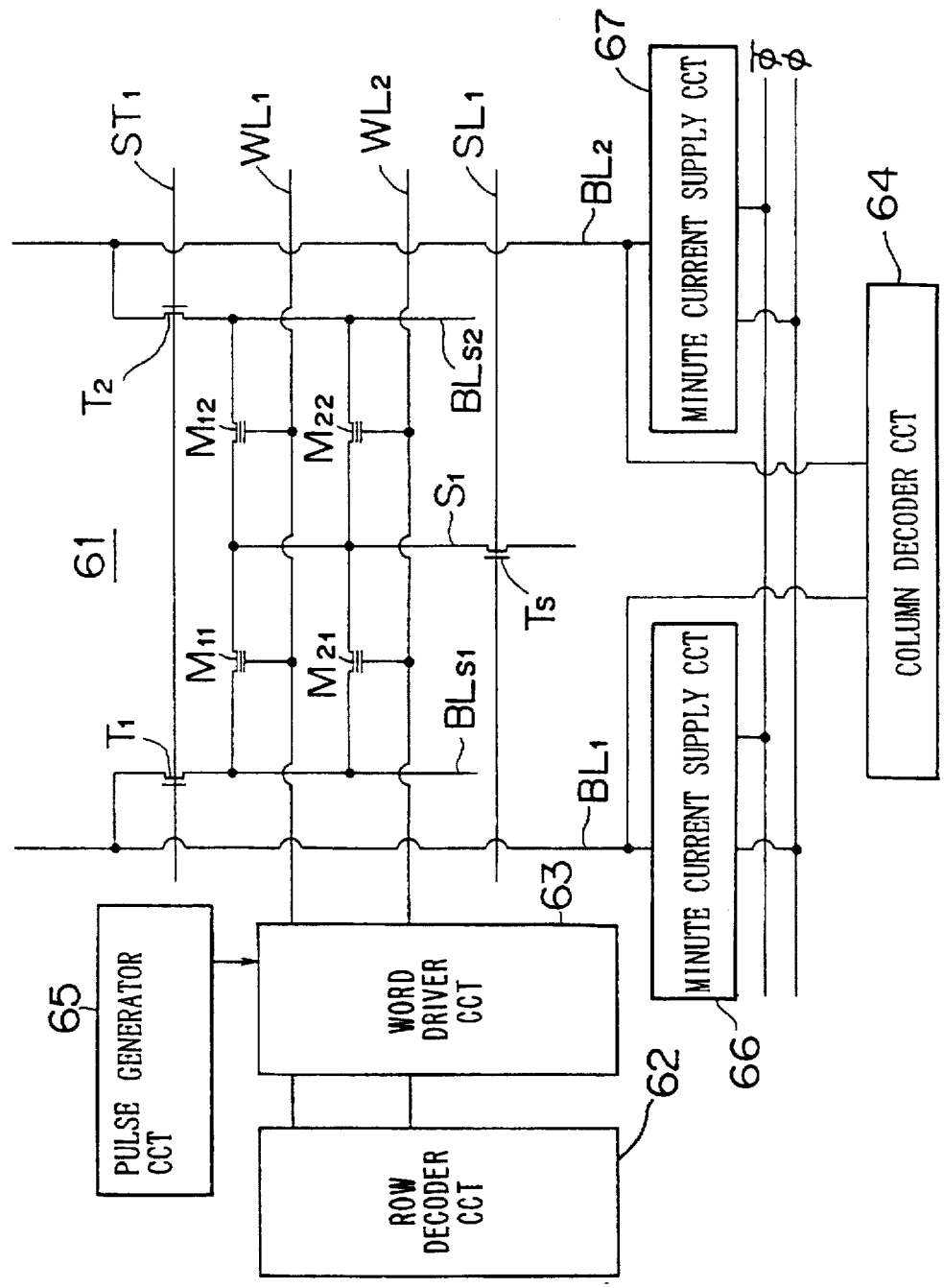
FIG. 24 is a circuit diagram of a non-volatile semiconductor memory device according to the fourth aspect of the present invention.

Now, in FIG. 24, a memory cell array 62 is composed of memory elements (MOSFETs) M11, M12, M21 and M22. Bit lines BL1 and BL2 are connected to the sources of select transistors T1 and T2, respectively. The drains of the memory elements M11 and M21 are connected to a subsidiary bit line BLs1 and those of the memory elements M12 and M22 are connected to a subsidiary bit line BLs2. The respective sources of the memory elements M11, M12, M21 and M22 are connected to a source line S1 which is connected to the drain of the select transistor Ts. ST1 and ST2 denote select lines and WL1 and WL2 denote word lines.

The bit lines BL1 and BL2 are connected to minute current supply circuits 66 and 67 and also connected to a column decoder circuit 64. The word lines WL1 and WL2 are connected to a row decoder circuit 2 through a word driver circuit 63. A pulse signal for erase/write operation is supplied from a pulse generating circuit 65 to the word lines WL1 and WL2 through the word driver circuit 63. To the minute current supply circuits 66 and 67, clock signals Φ and Φ bar are applied, respectively.

During the erase/write operation, a pulse signal varying between positive and negative potentials is applied to any one of the selected word lines WL1 and WL2 from the pulse generating circuit 65 as described above. During the erase operation, in accordance with the operation of the column decoder circuit 64, a current is supplied to the subsidiary bit line BLs1 or BLs2 (drains or sources of the memory elements) from any of the current supply circuits 66 and 67 through the select transistor T1 or T2. The current supplied from the minute current circuit 66 or 67 corresponds to the leakage current (3–5 nA) from the sources or drains of the memory elements. In this way, the difficulty in the erase/write operation as described in connection with FIGS. 40A and 40B can be overcome.

The minute current supply circuits 66 and 67 can apply a predetermined charging voltage to the subsidiary bit lines BLs1 and BLs2 through the select transistor T1 and T2 thereby to supply a minute current to the drains of the memory elements. The predetermined charging voltage can be supplied from e.g. a charging circuit composed of a transistor and a capacitor.

Figure 27:
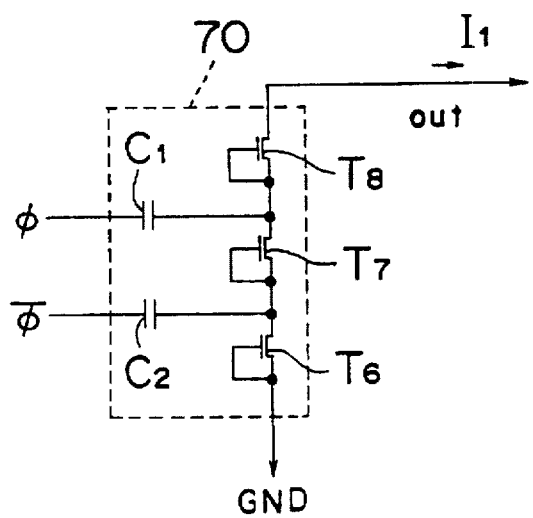
FIG. 27 is a circuit diagram showing an embodiment in which a minute current source circuit is a charging pump circuit.
Figure 28:
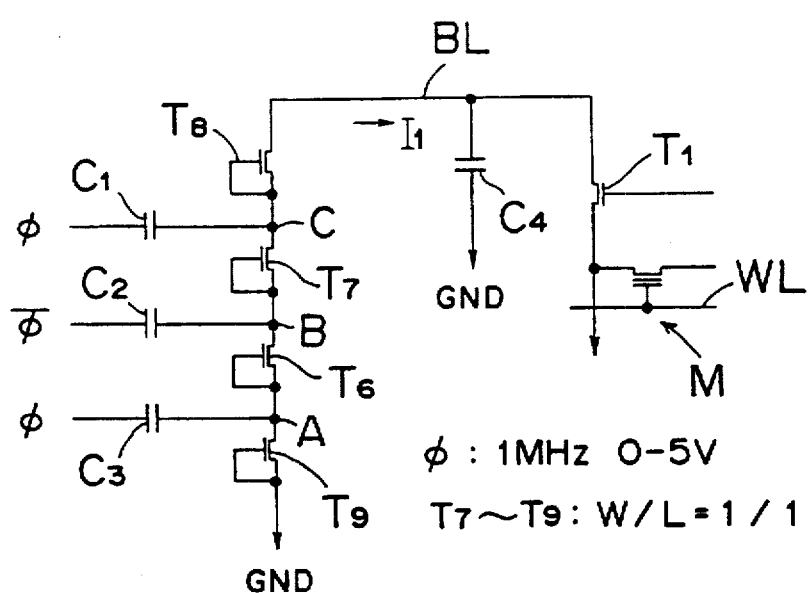
FIG. 28 is a circuit diagram of another example of the charging pump.

The minute current supply circuits 66 and 67 can be constructed by the charge pump circuits as shown in FIGS. 27 and 28 and the switched capacitor circuits as shown in FIGS. 30 to 33.

Figure 25:
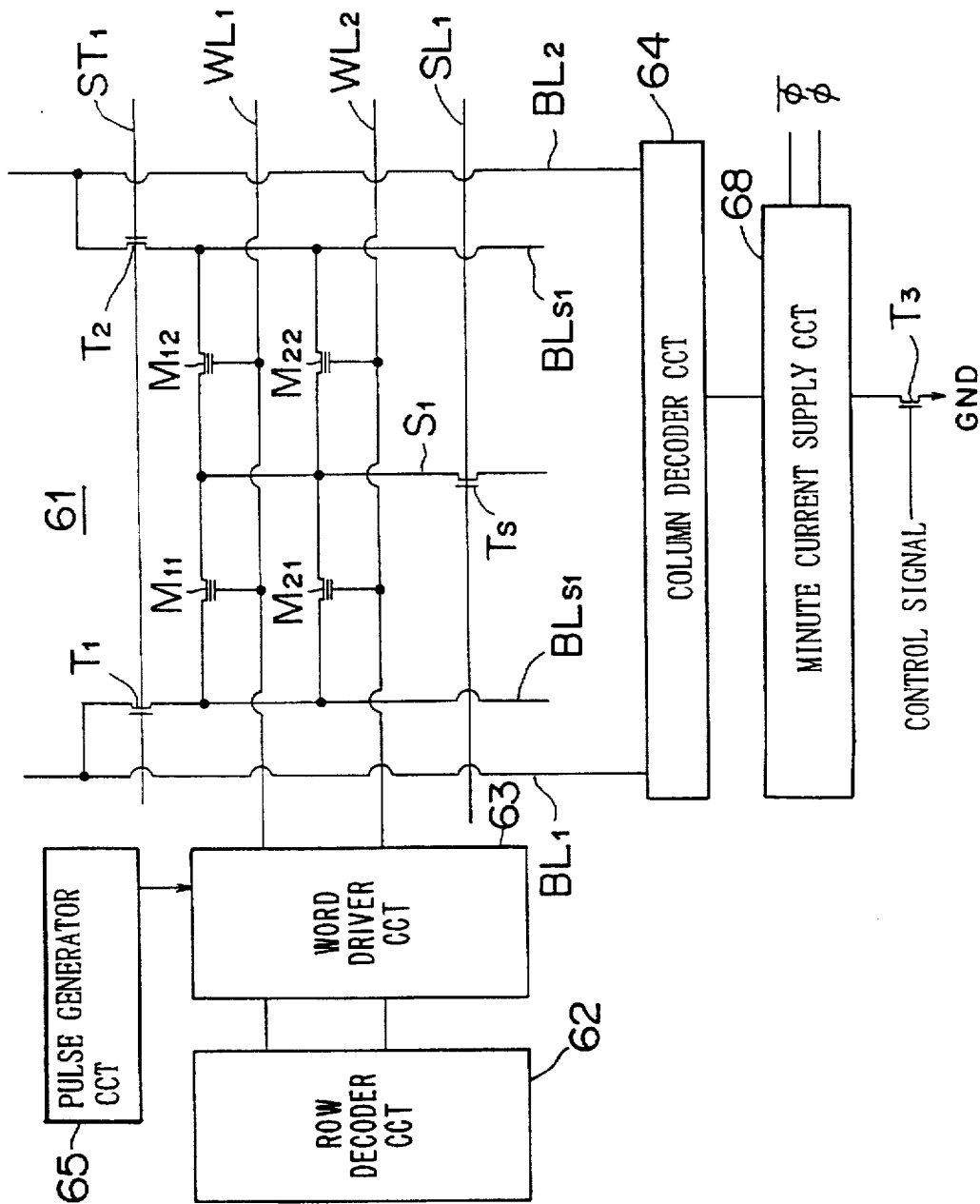
FIG. 25 is a circuit diagram of another non-volatile semiconductor memory device according to the fourth aspect of the present invention.

Referring to FIG. 25, an explanation will be given of another embodiment of the non-volatile semiconductor memory device according to the fourth aspect of the present invention.

The embodiment of FIG. 25 is different from that of FIG. 24 in the following points. The bit lines BL1 and BL2 are connected to the column decoder circuit 64 and a minute current supply circuit 68 is connected to the column decoder circuit 64. The minute current supply circuit 68 to which clock signals Φ and Φ bar are supplied is controlled by a transistor T3. The minute current from the minute current supply circuit 68 is supplied to the main bit lines BL1 and BL2 through the column decoder 64 and further connected to the sub-bit lines BLs1 and BLs2 through the select transistors T1 and T2. The transistor T3 with a control gate to which a control signal is supplied operates in accordance with the operation timings of the column decoder circuit 64. Then, the column decoder circuit 68 operates to supply the minute current through the column decoder circuit 64. The remaining circuit configuration is the same as that in FIG. 24.

Further, the minute current supply circuit 68 can be constructed by charge pump circuits and switched capacitor circuits as in the embodiment of FIG. 24 which can supply a minute current corresponding to the leakage current for each main bit line.

Figure 26:
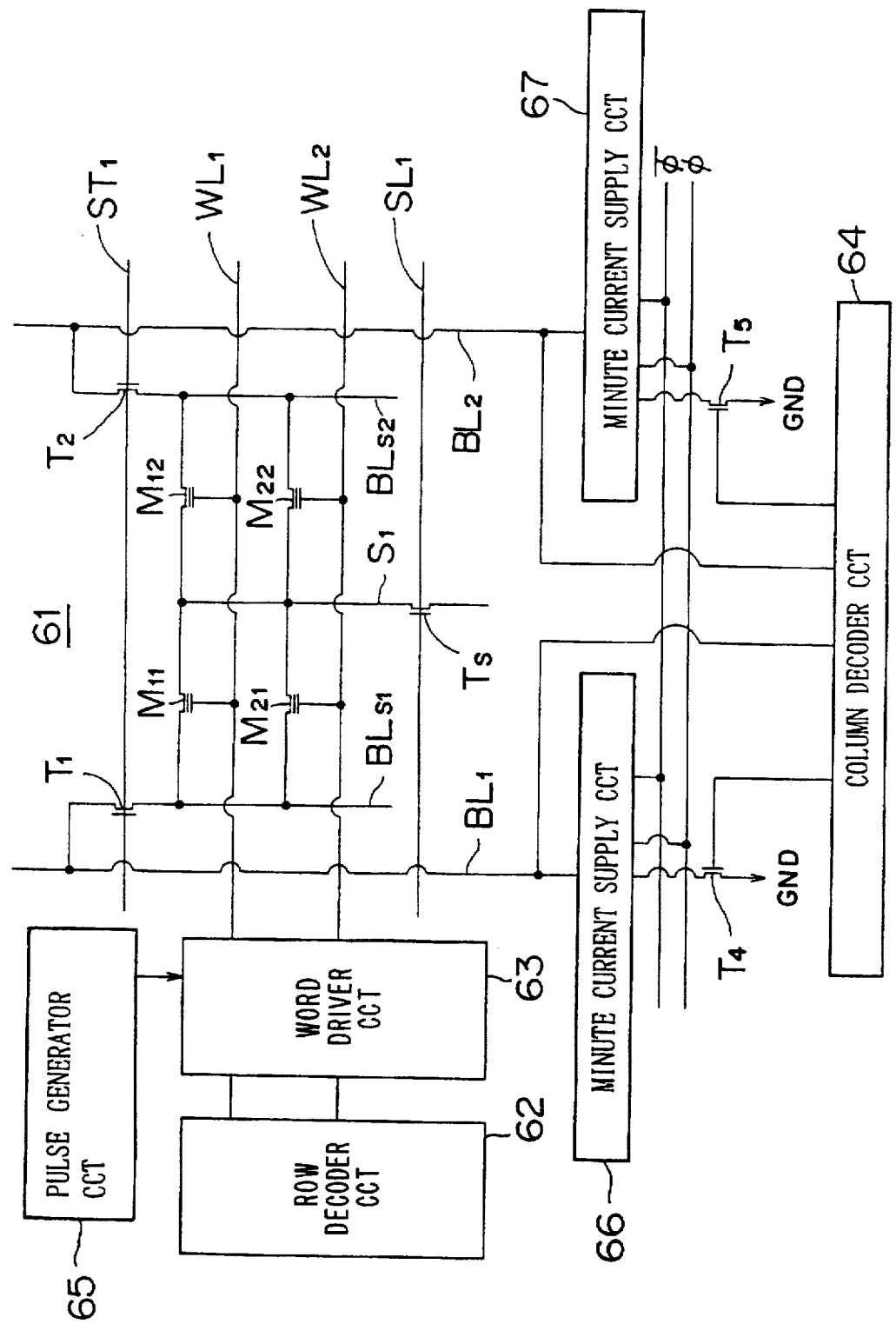
FIG. 26 is a circuit diagram of another non-volatile semiconductor memory device according to the fourth aspect of the present invention.

Referring to FIG. 26, an explanation will be given of still another embodiment of the non-volatile semiconductor memory device according to the fourth aspect of the present invention.

The embodiment of FIG. 26 is different from that of FIG. 24 in the following points. The minute current supply circuits 66 and 67 are connected to transistors T4 and T5 with their control gates which are controlled by the column decoder circuit 64. The minute current supply circuits 66 and 67 sets the potential for each bit line. The minute current supply circuits 66 and 67 can be constructed by the same arrangement as in the embodiment of FIG. 24 and the remaining circuit configuration is the same as in the embodiment of FIG. 24.

In this embodiment, as in the embodiment of FIG. 25, the minute current supply circuits 66 and 67, which are controlled by the transistors T4 and T5, respectively, supply the minute current for each bit line.

Referring to FIGS. 27 to 33, an explanation will be given of embodiments of the minute current supply circuits 66 to 68.

FIG. 27 shows the minute current supply circuit constructed by a charge pump circuit. As seen from FIG. 27, self-biased transistors T6, T7 and T8 are connected in series. To the junction point of the transistors T7 and T8 a coupling capacitor C1 is connected. To the junction point of the transistors T6 and T7 a coupling capacitor C2 is connected. A clock signal Φ is applied through the coupling capacitor C1 and a clock signal Φ bar is applied through the coupling capacitor C2. The output OUT from the charge pump circuit is applied to the bit lines BL1 and BL2.

The clock signals Φ and Φ bar have a peak value of 5 V and a frequency of 1 MHz. When the clock signals Φ and Φ inverted from each other are applied to the respective junction points, a predetermined voltage is applied through the transistor T8 to the bit lines. When the predetermined voltage is applied to the bit lines through the charge pump circuit, a minute current $I_1$ (3–5 nA) is supplied to the sub-bit lines through the on-state select transistors. The coupling capacitors C1 and C2 have a capacitance of 1–1000 fF. The value of the minute current $I_1$ is determined by a clock frequency and an oscillation frequency. The supplied current $I_1$ to the bit lines is charged as a line capacitance. The clock signals adopted in this embodiment have a clock frequency of 1 Mhz and a peak value of 5 V. The parasitic capacitance in the bit lines is 1 pF. The value of the minute current $I_1$ can be optionally set in accordance with the value of the leakage current $I_L$ (3–5 nA).

FIG. 28 shows an charge pump circuit capable of providing a higher potential. On the ground side of the charge pump circuit in FIG. 27, a self-biased transistor T9 is connected in series. To the junction point of the transistors T6 and T9, a coupling capacitor C3 is connected. A clock signal Φ is applied through the coupling capacitor C3. To the coupling capacitors C1 and C2, the same clock signals as in FIG. 27 are applied. The output OUT is applied to the bit line. C4 denotes the parasitic capacitance (about 1 pF) on the bit line. T1 denotes a select transistor and M denotes a memory transistor. Transistors T6 to T9 denotes MOSFETs.

FIGS. 29A to 29E show the waveforms representative of the operation state of the circuit of FIG. 28. Referring to FIG. 28, an explanation will be given of the operation of the non-volatile semiconductor memory device provided with the charge pump circuit of FIG. 28.

A source voltage (5 V) is applied to the drain of the select transistor T1 in an on-state to charge the drain or source of the memory element T1. A minute current $I_1$ (3–5 nA) is supplied to the drain of the memory element M through the on-state select transistor T1. Thus, the drain of the memory element M is substantially set for its floating state. Thereafter, the pulse signal as shown in FIG. 29E is applied to the control gate of the memory element M through the word line WL for an erase/write operation. In the state of the memory element where redundant electrons are extracted so that the threshold voltage is unified or converged, the channel conductance of the memory element is about 1 MΩ.

On the other hand, in the charge pump circuit, clock signals Φ, Φ bar and Φ each having a frequency of 1 MHz and a peak value of 5 V are applied to the junction points A, B and C through the coupling capacitors C1, C2 and C3, respectively. The waveforms at these junction points are shown in FIGS. 29A to 29D.

As seen from the waveforms shown in FIGS. 29A to 29E, when the clock signal Φ is applied through the coupling capacitor C3, the transistor T9 is charged so that the potential at point A is boosted. Simultaneously, when the clock signal Φ bar with an inverted phase is applied, the transistor T6 is charged. The resultant potential is superposed on the potential at point A. As a result of successive superposition, the voltage as shown in FIG. 29A is applied to the bit line BL. Thereafter, the minute current is supplied to the drain or source of the memory element M through the on-state select transistor T1 and the pulse signal as shown in FIG. 29E is applied so that the redundant charges in the floating gate are extracted to unify the threshold voltage of the memory element.

Figure 30:
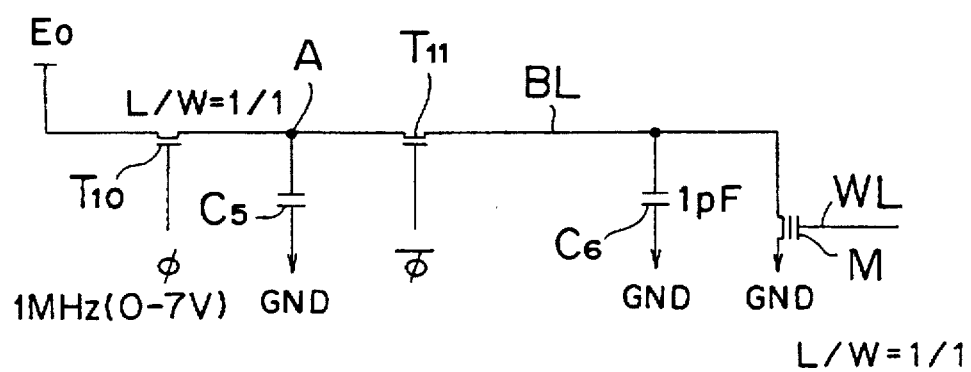
FIG. 30 is a circuit diagram showing an embodiment in which a minute current source circuit is a switched capacitor circuit.

FIG. 30 shows a switched capacitor circuit used as the minute current supply circuits 66 to 68.

As seen from FIG. 30, a voltage source E0 is connected to the drain of a transistor T10. The source of the transistor T10 is connected to the one end of a capacitor C5 and the drain of the transistor T11. The source of the transistor T11 is connected to a bit line BL. The bit line BL has a parasitic capacitance of about 1 pF and the capacitor C5 has a capacitance of about 15 fF.

In operation, the clock signals Φ and Φ bar are applied to the control gates of transistors T10 and T11 so that the transistors T10 and T11 are alternately turned on. A "H" level pulse is applied to the control gate of the transistor T10 while a "L" level pulse is applied to the control gate of the transistor T11. Thus, a voltage E0 is applied to the capacitor C5 so that the capacitor C5 is charged. Subsequently, when the "L" level signal is applied to the control gate of the transistor T10, the transistor T10 turns off. When the "H" level signal is applied to the transistor T11, the transistor T11 turns on. The charging voltage charged in the capacitor C5 is outputted through the transistor T11 and charged into the parasitic capacitor C6 of the bit line. In this way, when the transistors T10 and T11 operate alternately, a predetermined voltage is applied to the bit line BL. The capacitance of the capacitor C5 is set for a small capacitance of 1–100 fF, and the frequency and amplitude of each of the clock signals Φ and Φ bar are set for optimum values so that a minute current is supplied to the bit line BL.

Figure 31A:
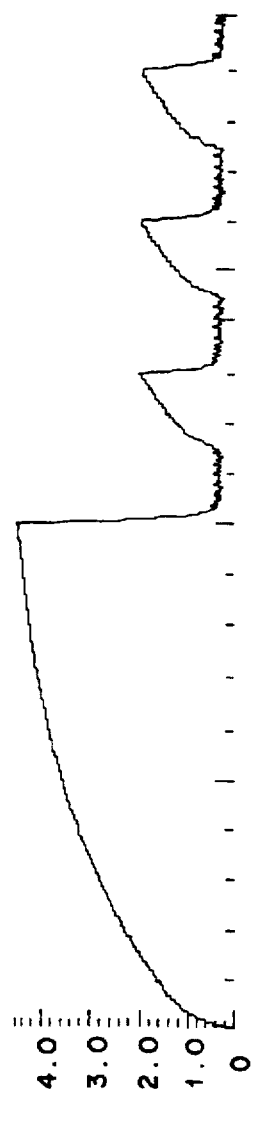
FIGS. 31A to 31C is a circuit diagram of operation waveforms based on the switched capacitor circuit shown in FIG. 30.
Figure 31B:
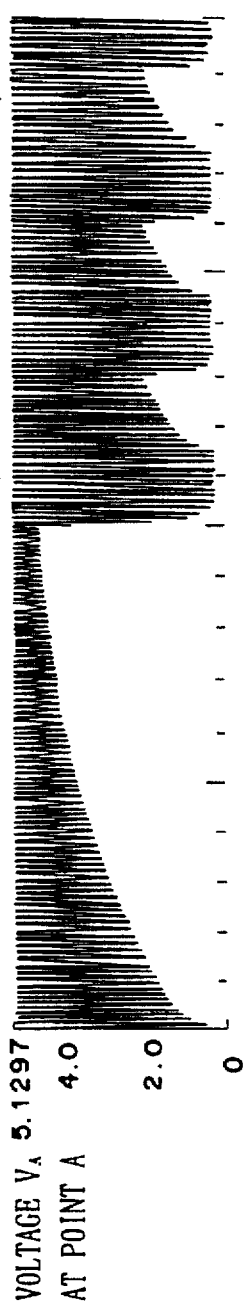

FIG. 31 shows the operation waveforms when the switched capacitor circuit is used as the minute current supply circuit.

Figure 31C:
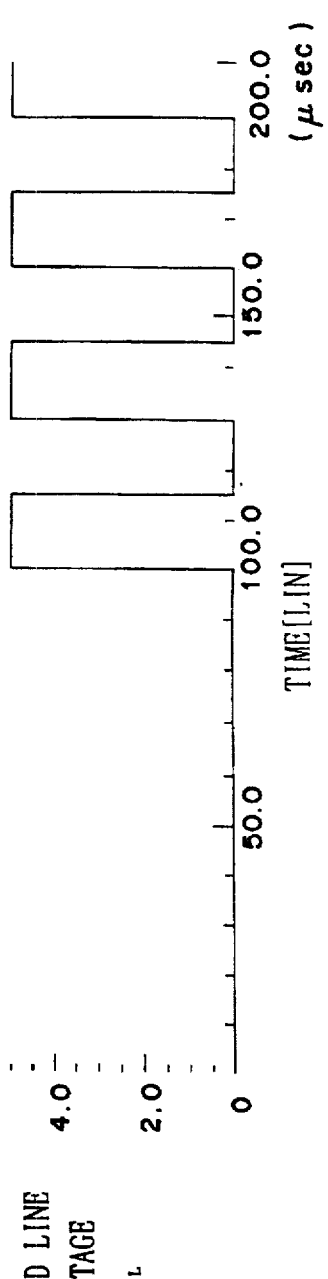

In operation, when clock signals Φ and Φ bar are applied to the control gates of the transistors T10 and T11, the capacitor is gradually charged so that the potential at the junction point of the transistors T10 and T11 increases. As a result, the output voltage having the waveform as shown in FIG. 31A is applied to the bit line BL. Then, the pulse signal as shown in FIG. 31C is applied to the control gate of the memory element M. Accordingly, different floating gate voltages $V_{FG}$ are unified into a predetermined threshold value. The bit line voltage $V_{BL}$ has the waveform as shown in FIG. 31A.

Figure 32:
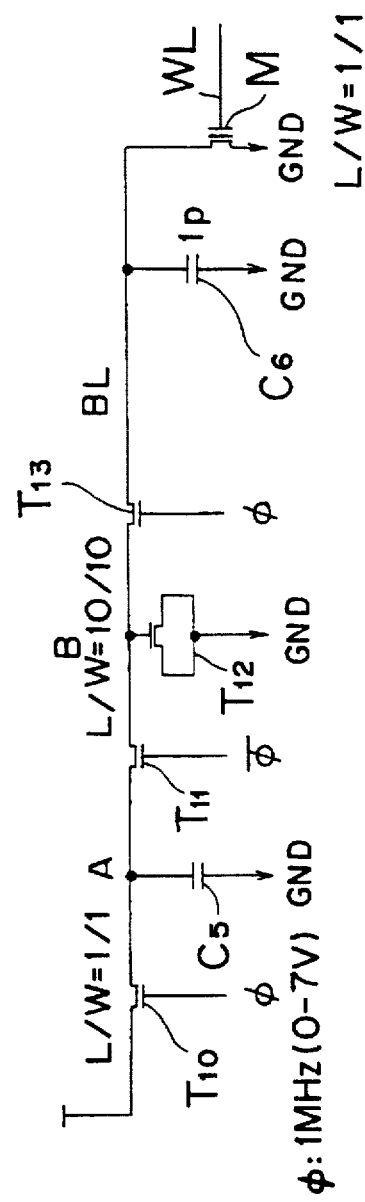
FIG. 32 is a circuit diagram of another example of the switched capacitor.

FIG. 32 shows another embodiment of the switched capacitor circuit. To the circuit of FIG. 30, transistors T11 and T13 is further connected and a MOS transistor T12 in diode connection is connected to the junction point of the transistor T11 and T13. This structure permits noise to be removed so that the stabilized output can be applied to the bit line. The transistors T10 to T13 are MOS transistors. The waveforms at the respective points of the switched capacitor circuit of FIG. 32 are shown in FIGS. 33A to 33D.

Figure 34:
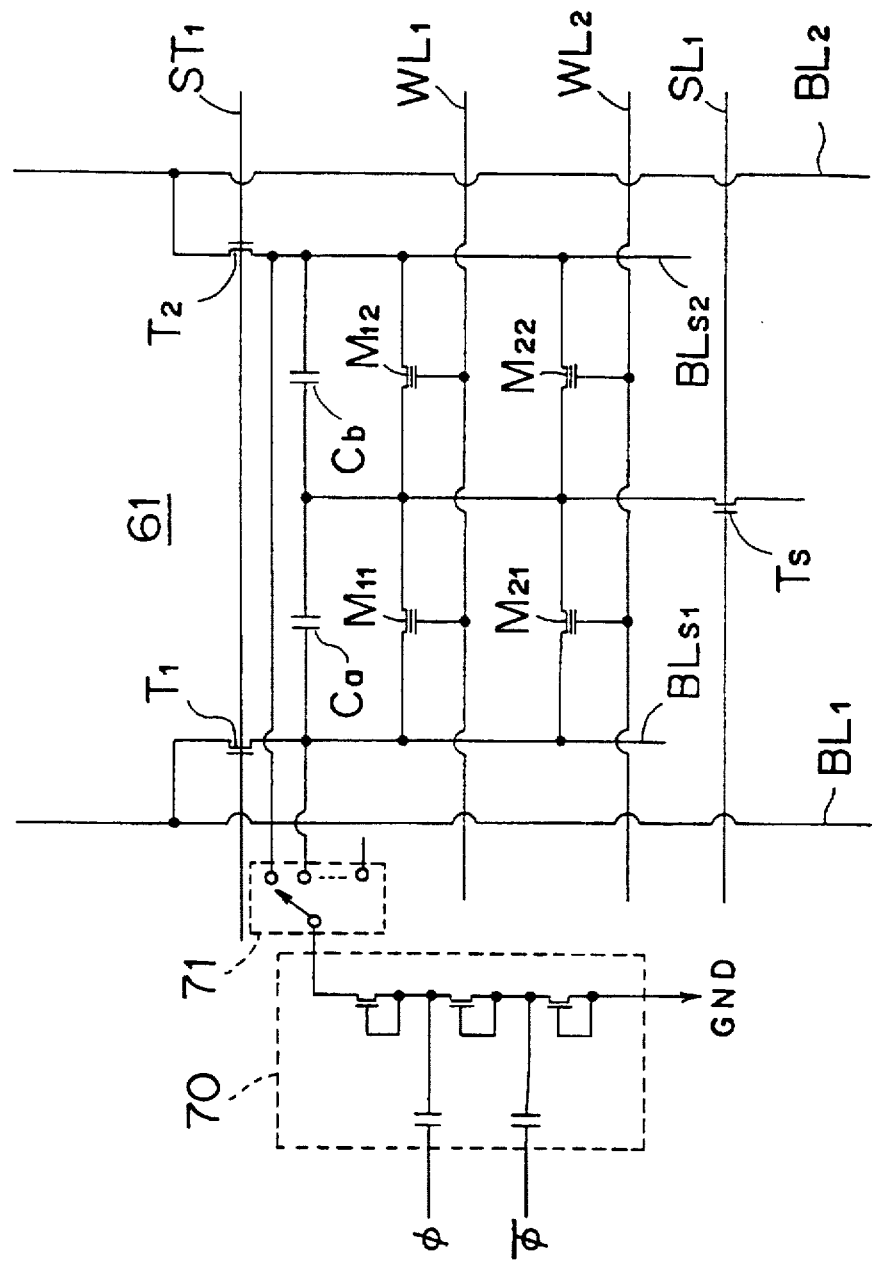
FIGS. 34 to 37 are circuit diagrams of further embodiments of the non-volatile semiconductor memory device according to the fourth aspect of the present invention.

FIG. 34 shows a further embodiment of the non-volatile semiconductor memory device according to the fourth aspect of the present invention.

In the embodiment of FIG. 34, a memory cell array 61 has the same structure as that shown in FIG. 24. A minute current supply circuit 70 is connected to subsidiary bit lines BLs1 and Bls2 through a switch circuit 71 (e.g. multiplexer). The minute current supply circuit 71 can be connected to the subsidiary bit lines of an adjacent memory cell array through the switch circuit 71. Each of the supplementary capacitors Ca and Cb is 100 to 300 fF.

The erase/write operation in this embodiment is carried out as follows. After the drains (or sources) of the memory elements are charged to a positive potential, the select transistor is turned off. A minute current (3–5 nA) is supplied to the drains (bit line) to place the bit line in a floating state. A pulse signal is applied to the control gate of the memory element to reduce the charges stored in the floating gate, thus performing the write/erase operation. During the erase/write operation, the minute current is supplied to the sub-bit line through the switch circuit 71.

Figure 35:
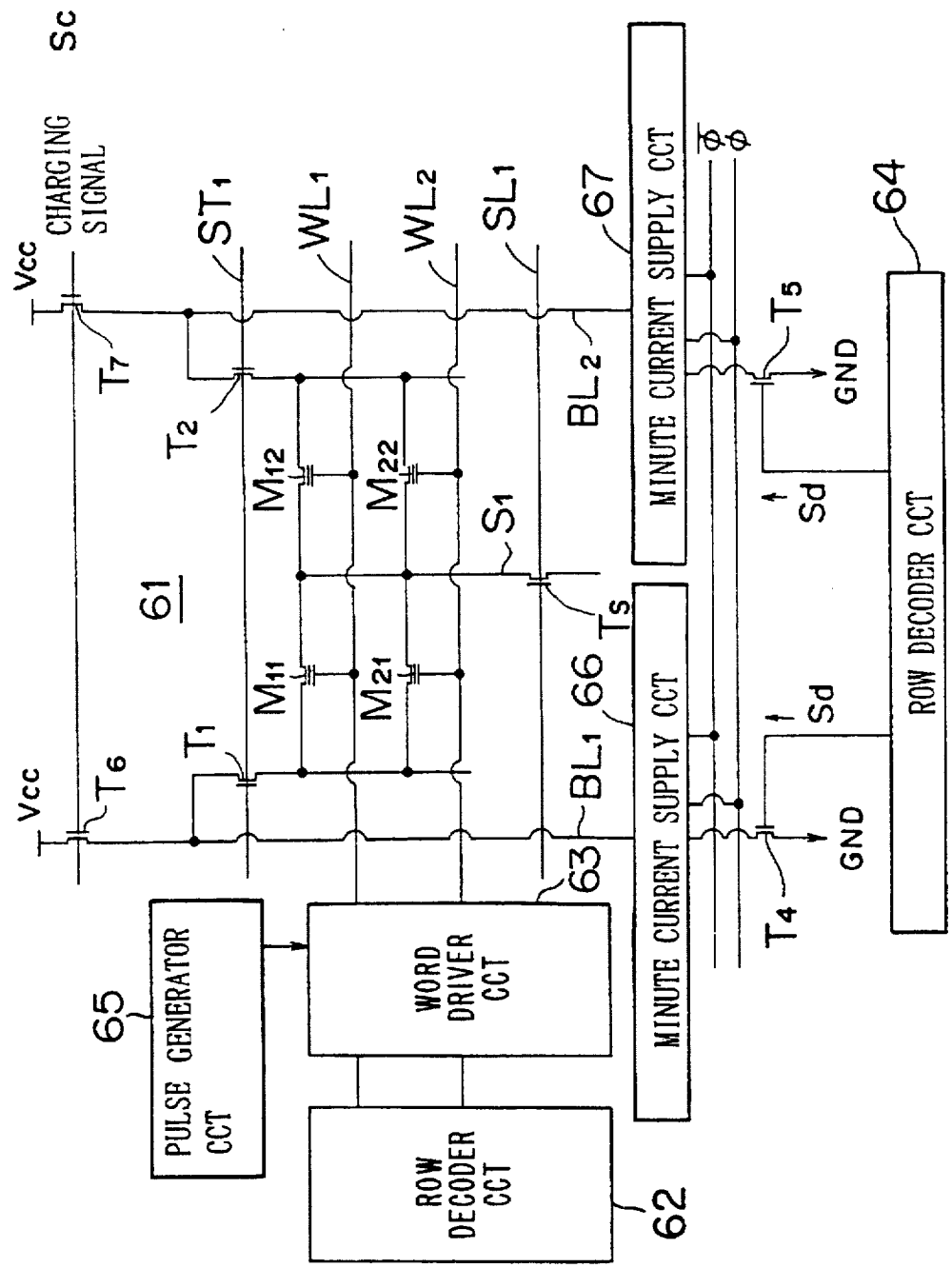
Figure 36:
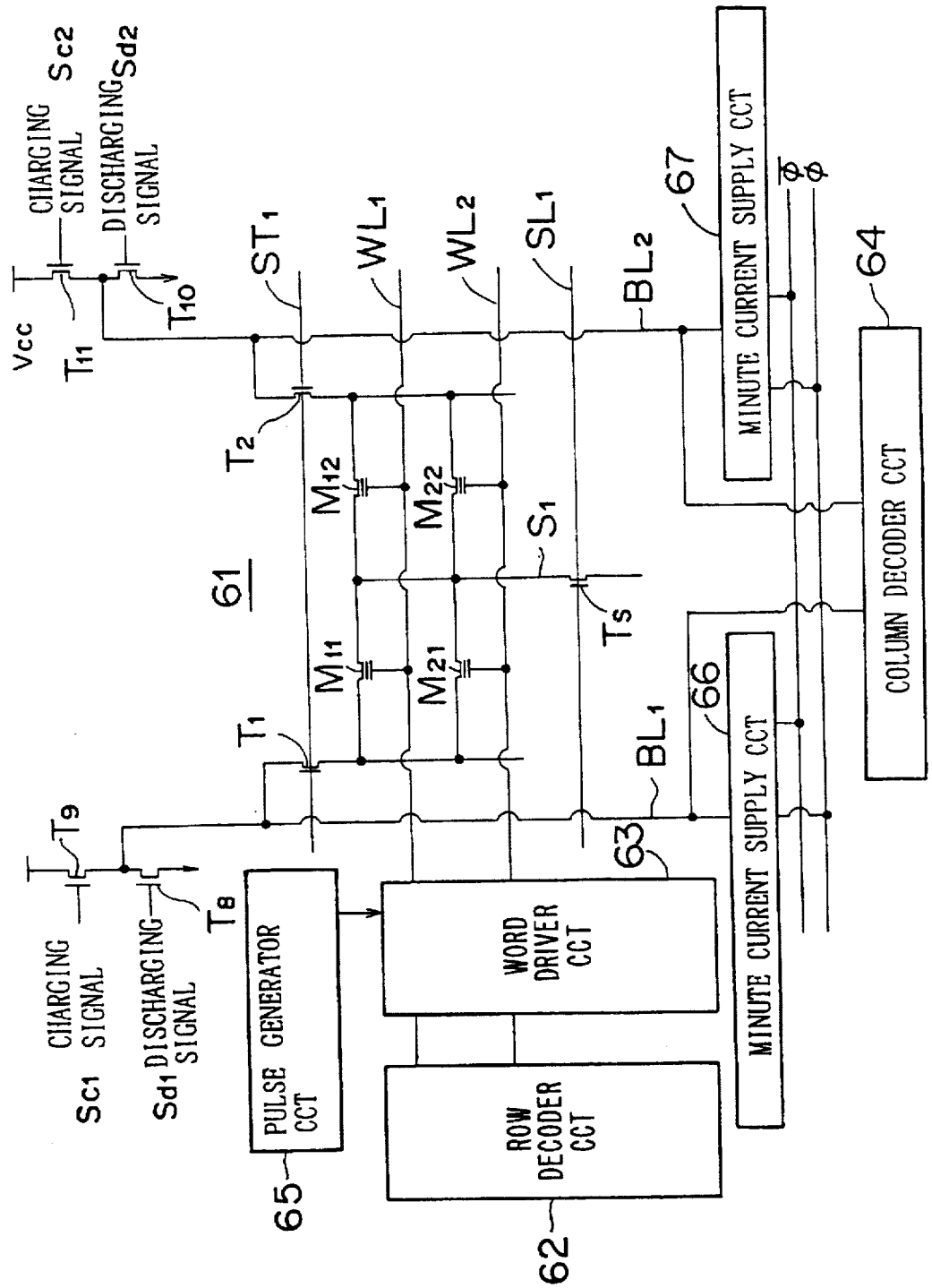
Figure 37:
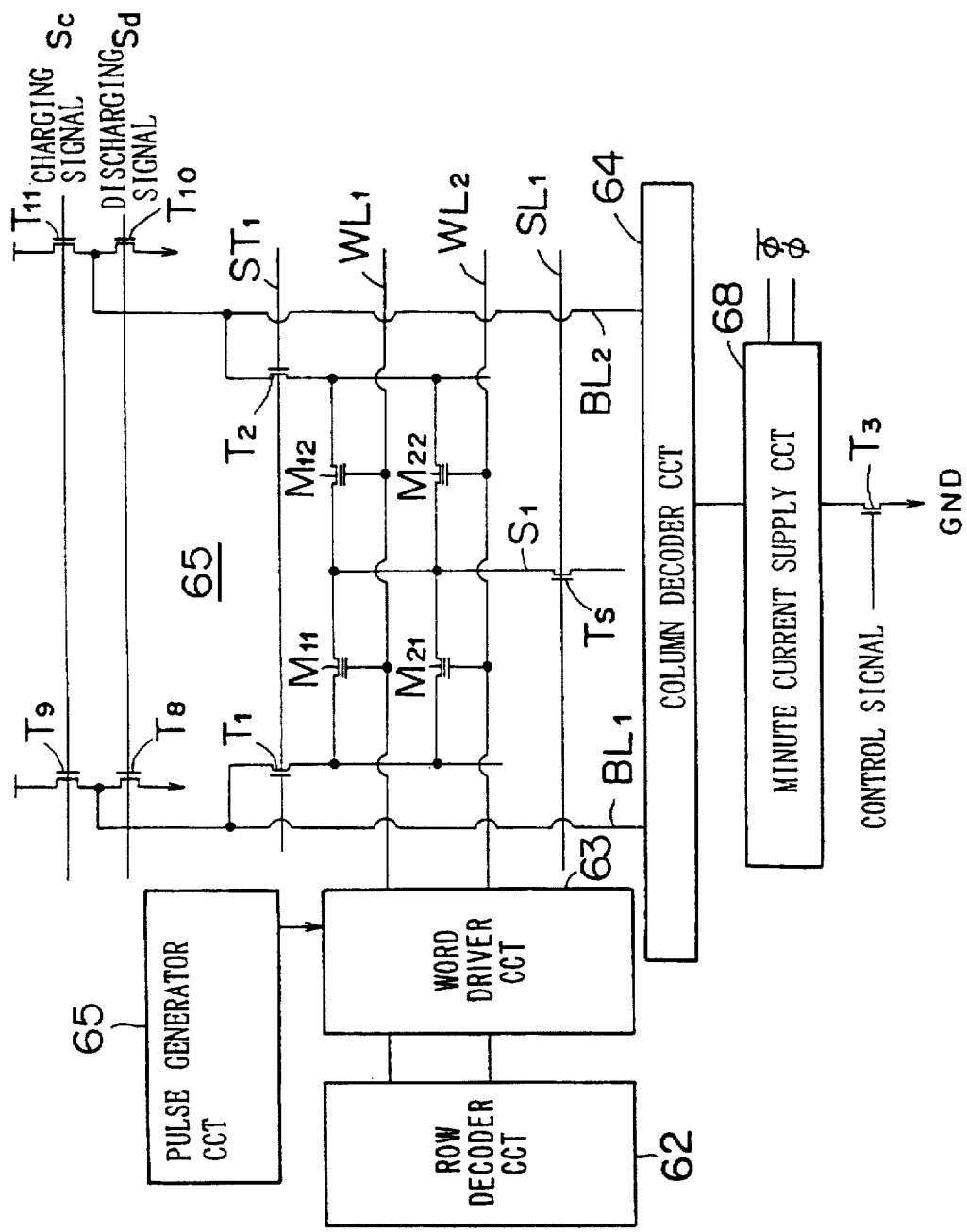
Figures 38A, 38B, 38C, 38D:
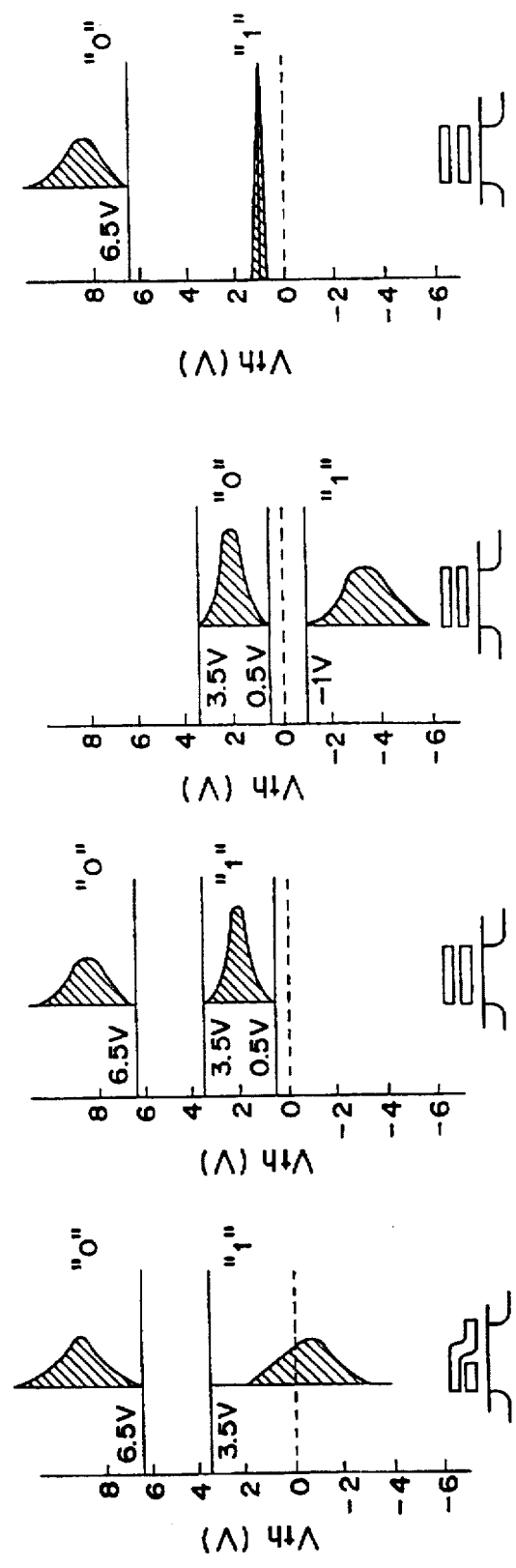
FIGS. 38A and 38B are graphs each showing the distribution of the threshold voltages of an ordinary flash EEPROM.
FIG. 38C is a graph showing the distribution of the threshold voltages of an ordinary NAND type EEPROM.
FIG. 38D is a graph showing the distribution of the threshold voltages of an UVEPROM.
Figure 39A:
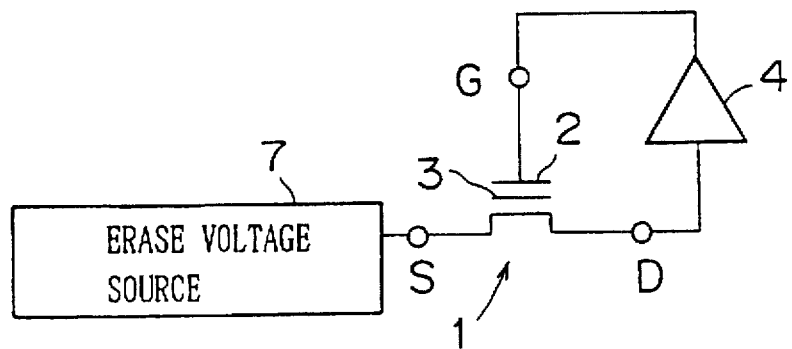
FIGS. 39A and 39B are circuit diagrams showing the erasing method in the conventional non-volatile semiconductor memory.
Figure 39B:
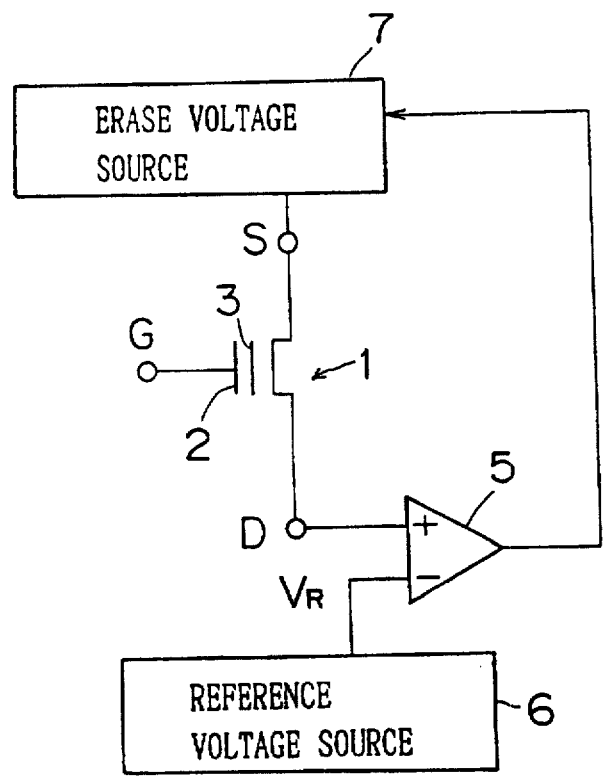

FIGS. 35 to 37 show further embodiments of the non-volatile semiconductor memory device according to the fourth aspect of the present invention.

In the previous embodiments, the charge pump circuit or switched capacitor circuit is used as the minute current supply circuit to charge the bit lines. On the other hand, the embodiments of FIGS. 35 to 37 intend to improve the response characteristic of charging/discharging to realize high speed erase/write.

The embodiments of FIGS. 35 to 37 are characterized in that a charging/discharging system for bit lines are added to the embodiments of FIGS. 24 to 26.

In FIG. 35, the bit lines BL1 and BL2 are connected to the sources of transistors T6 and T7, respectively. The drains of the transistors are connected to voltage sources Vcc. The other circuit configuration is the same as that in FIG. 24. In operation, a charging signal Sc is applied to the sources of the transistors T6 and T7, and a discharging signal Sd is applied to the gates of the transistors T4 and T5. At the start of the erase/write operation, the charging signal is applied. At the end thereof, the discharging signal Sd is applied to discharge the charges stored in the bit lines BL1 and BL2.

In FIG. 36, the bit line BL1 is connected to the junction point of transistors T8 and T9, and the bit line BL2 is connected to the junction point of transistors T10 and T11. The transistors T9 and T11 constitute a charging system. Charging signals Sc1 and Sc2 are applied to the gates of the transistors T9 and T11, respectively so that the bit lines BL1 and BL2 are charged to perform the erase/write operation. On the other hand, the transistors T8 and T10 constitute a discharge system. At the end of the erase/write operation, discharging signals Sd1 and Sd2 are applied to the transistors T8 and T10 to discharge the charges stored in the bit lines BL1 and BL2. In the embodiment, the charging/discharging operation can be carried out for each bit line.

In FIG. 37, the bit line BL1 is connected to the junction point of the transistors T8 and T9, and the bit line BL2 is connected to the junction point of the transistors T10 and T11. The transistors T9 and T11 constitute a charging system. A charging signal Sc is applied to the gates of the transistors T9 and T11, respectively so that the bit lines BL1 and BL2 are charged to perform the erase/write operation. On the other hand, the transistors T8 and T10 constitute a discharge system. At the end of the erase/write operation, a discharging signal Sd is applied to the transistors T8 and T10 their gates of which are commonly connected, thereby discharging the charges stored in the bit lines BL1 and BL2.

In the embodiments of FIGS. 35 to 37, the charging signal is applied to the bit lines by the charging/discharging system before a predetermined potential to the bit lines by the charge pump circuit or switched capacitor circuit, thereby charging the bit lines at the higher potential than source potential. Thereafter, the pulse sinal is applied to the word lines to unify the threshold values of predetermined memory elements. Thus, the erase/write operation can be carried out at a high speed. On the other hand, after the completion of the erase/write operation, the bit lines are placed at the potential lower than the drain potential. This permits the operation to be succeeded by a next operation within a short time.

As described above, in the non-volatile semiconductor memory device according to the fourth aspect of the present invention, a very minute current is supplied to bit lines through on-state select transistors. Otherwise, after the bit lines are charged, the select transistors are turned off and the minute current equivalent to a leakage current is supplied to the bit lines. Thereafter, the a pulse signal is applied to the control gates of the memory elements to unify the threshold voltages thereof. Since the minute current is supplied to the bit lines while the channel conductance of the memory elements is large, in order to prevent excess erasure in the memory elements or restoration of the potential on the drain side, a pulse signal having shorter pulse widths than the restoration time should be applied to the control gates.

Although the charge pump circuit or switched capacitor in which the current value can be set in terms of the frequency and the peak value can be used, several known circuits capable of supplying the minute current may be used.

In the non-volatile semiconductor memory device according to the fourth aspect of the present invention, in the erase/write process of extracting charges from the floating gate, the manner of injecting electrons into the floating gate is the same as the conventional manner. Therefore, the memory device can be applied to a non-volatile semiconductor memory device in which the floating gate is charged at a negative potential by hot electrons from a channel and charges are caused to escape from the floating gate toward a source/drain or a substrate by the tunnelling current.

In the non-volatile semiconductor memory device according to the fourth aspect of the present invention, the erase/write operation is carried out in such a manner that with the bit lines substantially placed in a floating state by a minute current, a pulse signal varying between positive and negative potentials is applied to the control gates of the memory elements to extract the redundant charges stored in the floating gate. Since the minute current is supplied to the bit lines by the minute current supply circuit even when there are leakage currents from the bit lines (drains or sources), it is possible to extract the charges from the floating gates of a large number of memory elements simultaneously and precisely.

By carrying out the erase/write operation after the bit lines are charged, the rising time of the charging potential can be shortened so that the erase/write operation time can be shortened.

We claim:

1. A non-volatile semiconductor memory device comprising:
   a memory cell comprising a source, a drain, a floating gate and a control gate;
   means for setting either one of the source and drain of the memory cell in a floating state at a potential higher than the potential of the other; and
   means for applying a signal varying between a first potential and a second potential to the control gate of said memory cell to reduce charges stored in said floating gate,
   wherein the second potential of said signal applied to said control gate is applied after the first potential is applied.

2. A non-volatile semiconductor memory device comprising:
   a memory cell comprising a source, a drain, a floating gate and a control gate;
   means for setting either one of the source and drain of the memory cell in a floating state at a potential higher than the potential of the other; and
   means for applying a signal varying between a first potential and a second potential to the control gate of said memory cell to reduce charges stored in said floating gate,
   wherein the application of said signal to said control gate stops corresponding to a change of the potential applied to said drain or source of said memory cell.

3. A non-volatile semiconductor memory device comprising:
   a memory cell comprising a source, a drain, a floating gate and a control gate;
   means for setting either one of the source and drain of the memory cell in a floating state at a potential higher than the potential of the other; and
   means for applying a signal varying between a first potential and a second potential to the control gate of said memory cell to reduce charges stored in said floating gate,
   wherein the negative potential of said signal applied to said control gate is changed before a change in the potential in a bit line resulting from the current flowing between said source and drain of said memory cell.

4. A non-volatile semiconductor memory device comprising:
   a memory cell comprising a source, a drain, a floating gate and a control gate;
   means for charging either one of the source and drain of the memory cell and thereafter placing it in a floating state ; and
   means for applying a signal varying between a positive potential and a negative potential to the control of said memory cell whereby its threshold voltage is converged.

5. A non-volatile semiconductor memory device according to claim 4, wherein the absolute value of the positive potential of the said signal applied to said control gate is larger than that of the negative potential thereof.

6. A non-volatile semiconductor memory device according to claim 4, wherein the peak values of said signal are so set that a tunnelling current flows between said control gate and said source or drain owing to the negative potential of said signal and that a current flows between the source and drain owing to the positive potential of said signal.

7. A non-volatile semiconductor memory device according to claim 4, wherein the converged threshold voltage is set by the positive potential of said signal applied to said control gate.

8. A non-volatile semiconductor memory device according to claim 4, wherein the negative potential of said pulse signal applied to said control gate is applied after the positive potential is applied.

9. A non-volatile semiconductor memory device according to claim 4, wherein the application of said signal to said control gate stops corresponding to a change of the potential applied to said drain or source of said memory cell.

10. A non-volatile semiconductor memory device according to claim 4, wherein the negative potential of said signal applied to said control gate is charged before a change in the potential in a bit line which results from the current flowing between said source and drain of said memory cell so as to converge the threshold voltage of said memory cell coupled to the bit line.

11. A non-volatile semiconductor memory device according to claim 4, wherein the duration of the positive potential of said pulse signal applied to said control gate is longer than that of the negative potential thereof.

12. A non-volatile semiconductor memory device according to claim 4, wherein the order of applying the positive and negative potentials to said control gate is exchanged.

13. A non-volatile semiconductor memory device comprising:
   a plurality of memory cells, each comprising a source, a drain, a floating gate and a control gate;
   means for charging either one of the source and drain of a selected memory cell and thereafter placing it in a floating state ; and
   means for applying a signal varying between a positive potential and a negative potential to the control gate of said selected memory cell whereby its threshold voltage is converged.

14. A non-volatile semiconductor memory device according to claim 13, wherein the absolute value of the positive potential of the said signal applied to said control gate is larger than that of the negative potential thereof.

15. A non-volatile semiconductor memory device according to claim 13, wherein the peak values of said signal are so set that a tunnelling current flows between said control gate and said source or drain owing to the negative potential of said signal and that a current flows between the source and drain owing to the positive potential of said signal.

16. A non-volatile semiconductor memory device according to claim 13, wherein the converged threshold voltage is set by the positive potential of said signal applied to said control gate.

17. A non-volatile semiconductor memory device according to claim 13, wherein the negative potential of said signal applied to said control gate is applied after the positive potential is applied.

18. A non-volatile semiconductor memory device according to claim 13, wherein charges stored in said floating gates of said memory cells with said control gates commonly connected are simultaneously reduced.

19. A non-volatile semiconductor memory device according to claim 13, wherein the application of said signal to said control gate stops corresponding to a change of the potential applied to said drain or source of said memory cell.

20. A non-volatile semiconductor memory device according to claim 13, wherein the negative potential of said signal applied to said control gate is changed before a change in the potential in a bit line resulting from the current flowing between said source and drain of said memory cell.

21. A non-volatile semiconductor memory device according to claim 13, wherein the duration of the positive potential of said signal applied to said control gate is longer than that of the negative potential thereof.

22. A non-volatile semiconductor memory device comprising:
    a plurality of word lines;
    a plurality of bit lines intersecting word lines and plurality of source lines;
    a plurality of memory cells, each comprising a source, a drain, a floating gate and a control gate, provided at the intersections between said word lines and said bit lines, each of the control gates, drains and sources of said memory cells being electrically connected to each of said word lines, each of said bit lines and each of said source lines, respectively;
    means of placing either one of the source and drain of a selected memory cell in a floating state at a potential higher than the potential of the other; and
    means for applying a pulse signal varying between a positive potential and a negative potential to the control gate of said selected memory cell whereby its threshold voltage is converged.

23. A non-volatile semiconductor memory device according to claim 22, wherein the absolute value of the positive potential of the said signal applied to said control gate is larger than that of the negative potential thereof.

24. A non-volatile semiconductor memory device according to claim 22, wherein the peak values of said signal are so set that a tunnelling current flows between said control gate and said source or drain owing to the negative potential of said signal and that a current flows between the source and drain owing to the positive potential of said signal.

25. A non-volatile semiconductor memory device according to claim 22, wherein the converged threshold voltage is set by the positive potential of said signal applied to said control gate.

26. A non-volatile semiconductor memory device according to claim 22, wherein the negative potential of said signal applied to said control gate is applied after the positive potential is applied.

27. A non-volatile semiconductor memory device according to claim 22, wherein charges stored in said floating gates of said memory cells with said control gates commonly connected are simultaneously reduced.

28. A non-volatile semiconductor memory device according to claim 22, wherein the application of said signal to said control gate stops corresponding to a change of the potential applied to said drain or source of said memory cell.

29. A non-volatile semiconductor memory device according to claim 22, wherein the negative potential of said signal applied to said control gate is changed before a change in the potential in a bit line resulting from the current flowing between said source and drain of said memory cell.

30. A non-volatile semiconductor memory device according to claim 22, wherein the duration of the positive potential of said signal applied to said control gate is longer than that of the negative potential thereof.

31. A non-volatile semiconductor memory device comprising:
    a plurality of word lines;
    a plurality of bit lines intersecting said word lines, each of word lines being connected to each of said bit lines through a select transistor;
    a plurality of memory cells, each comprising a source, a drain, a floating gate and a control gate, provided at the intersections between said word lines and said bit lines, each of the control gates, drains and sources of said memory cells being connected to each of said source lines, respectively;
    means for charging either one of said source and drain of each of said memory cells and thereafter putting it in a floating state;
    means for applying a pulse signal of pulses each having a positive peak potential and a negative peak potential through said word lines to the control gate of said selected memory cell whereby its threshold voltage is converged.

32. A non-volatile semiconductor memory device according to claim 31, further comprising:
    means for supplying a current for compensating for a leakage current in said bit lines.

33. A non-volatile semiconductor memory device according to claim 31, wherein the memory device further includes a plurality of main bit lines, each of the main bit lines being electrically connected to each of said bit lines through a selector transistor.

34. A non-volatile semiconductor memory device according to claim 31 further comprising:
    first switch means for applying a potential which is not lower than a source potential to the source or drain of each memory cell; and
    second switch means for applying a potential which is not higher than a drain potential to the source or drain of each memory cell.

35. A non-volatile semiconductor memory device according to claim 34, wherein before the signal is applied to the control gate, the bit line is set for a higher potential than the source potential by said first switch means.

36. A non-volatile semiconductor memory device according to claim 34, wherein before the signal is applied to the control gate, said bit line is set at a higher potential than the source potential by said first switch means, and after said signal is applied to said control gate, said bit line is set at a lower voltage than a drain potential by said second switch means.

37. A non-volatile semiconductor memory device according to claim 31, wherein the floating gate of each memory cell is charged to a negative potential by hot electrons from the channel of each memory cell, and the charges stored in said floating gate is caused to flow from the floating gate to the source, drain or substrate as a tunneling current.

38. A non-volatile semiconductor memory device according to claim 31, wherein the floating gate is charged to a negative potential by a tunnelling current flowing from the source, drain or substrate, and the charges stored in said floating gate are caused to flow from the floating gate to the source, drain or substrate as another tunneling current.

39. A non-volatile semiconductor memory device according to claim 31, wherein a minute current supply means is electrically connected to at least one bit line directly or through a switch.

40. A non-volatile semiconductor memory device according to claim 39, wherein said switched capacitor circuit includes at least one MOS diode.

41. A non-volatile semiconductor memory device comprising:

a plurality of word lines;

a plurality of bit lines intersecting said word lines;

a plurality of memory cells, each comprising a source, a drain, a floating gate and a control gate, provided at the intersections between said word lines and said bit lines, each of the control gates, drains and sources of said memory cells being connected to each of source lines, respectively;

means for precharging one of the bit lines and thereafter placing it in a floating state ; and means for applying a signal including pulses each having a positive peak potential and a negative peak potential through said word lines to the control gate of said selected memory cell whereby its threshold voltage is converged into a predetermined voltage.

42. A non-volatile semiconductor memory device according to claim 41, further comprising:

means for supplying a current for compensating for a leakage current in said bit lines.

43. A non-volatile semiconductor memory device according to claim 41, further comprising:

means for supplying a minute current to the source or drain of each of said memory cells.

44. A non-volatile semiconductor memory device according to claim 41, wherein the memory device further includes a plurality of main bit lines, each of main bit lines being electrically connected to each of said bit lines through a selector transistor.

45. A non-volatile semiconductor memory device according to claim 41, wherein the first time constant based on the capacitance component of said bit line and the equivalent resistance due to the current from said current supply means is smaller than the second time constant based on the capacitance component of said bit line and the equivalent resistance due to said leak current, and the first time constant is longer than the half of the period of said signal.

46. A non-volatile semiconductor memory device according to claim 41, wherein said current supply means includes a resistor connected to a voltage source or a resistor connected in series to a switch.

47. A non-volatile semiconductor memory device according to claim 41, wherein said current supply means includes a diode reverse-bias connected to a voltage source or a diode reverse-bias connected in series to a switch.

48. A non-volatile semiconductor memory device according to claim 41, wherein said current supply means includes a gate-equipped diode connected to a voltage source or a gate-equipped diode connected in series to a switch.

49. A non-volatile semiconductor memory device according claim 41, wherein said current supply means is connected between a main bit line and a bit line.

50. A non-volatile semiconductor memory device according to claim 41, wherein said signal includes a plurality of positive peak potentials.

51. A non-volatile semiconductor memory device according to claim 41, wherein said signal includes a plurality of negative peak potentials.

52. A NAND type non-volatile semiconductor memory device comprising:

a bit line, select lines and word lines intersecting said bit line;

memory cells connected in series between a first and a second select transistor, each of memory cells having a source, a drain, a control gate and a floating gate, the control gate thereof being connected to each of said word lines;

means for precharging said bit line and putting it in a floating state; and means for applying a signal varying between a positive peak potential and a negative peak potential to any of said memory cells so that the threshold voltage thereof is converged.

53. A non-volatile memory cell including a transistor having a floating gate and a control gate comprising:

a capacitor element electrically connected to one of a drain and a source electrode of said transistor;

floating-state setting means for charging said capacitor element to set one of said source electrode and drain electrode and thereafter putting it in a floating state at a potential higher than the potential of the other; and voltage generating means for applying an AC voltage to said control gate.

54. A non-volatile memory cell according to claim 53, wherein said voltage generating means alternately generates a positive voltage and a negative voltage so that the said positive voltage is applied precedingly to said negative voltage to said control gate.

55. A non-volatile memory cell according to claim 53, wherein said capacitor element includes a parasitic element contained in a wiring electrically connected to said one of the drain electrode and source electrode of said transistor.

56. A method of adjusting the threshold values of a plurality of transistors each having a floating gate and a control gate, comprising the steps of:

a first step of setting one of a drain electrode and a source electrode of each of said transistors in a floating state at a potential higher than the potential of the other;

a second step of applying a first voltage at said control gate to cause the transistors each having a threshold value no larger than the value determined in relation to said first voltage; and a third step of applying a second voltage to the control gate of each of the transistors each having a threshold larger than the value determined in relation to said second voltage so as to reduce the threshold value of each of the transistors.

said second step and said third step being alternately repeated until all the threshold values of said plurality of transistors are converged into a desired value or desire range determined in relation to said first voltage.

57. A non-volatile semiconductor memory device according to claim 4, wherein said positive potential is a potential causing no substantial tunneling current between either one of the source or drain and the floating gate of said memory cell after the threshold voltage of said memory cell is converged.

58. A non-volatile semiconductor memory device according to claim 4, wherein said negative potential is a potential causing no substantial tunneling current between either one of the source or drain and the floating gate of said memory cell after the threshold voltage of said memory cell is converged.

59. A non-volatile semiconductor memory device according to claim 4, wherein said negative potential is a potential not causing the over-erasure of said memory cell.

60. A method of adjusting the threshold values of a plurality of transistor each having a floating gate and a control gate, according to claim 56, wherein the second voltage applied in the third step is a negative voltage of −10 V or less.

61. A method of adjusting the threshold values of a plurality of transistor each having a floating gate and a control gate, according to claim 56, wherein when the first voltage of a positive voltage of 4 V or more is applied to said control gate in the second step, said desired value determined in relation to said first voltage is within a range of 70–80% of the first voltage.

* * * * *